US012170306B2

(12) United States Patent
Kumagai et al.

(10) Patent No.: US 12,170,306 B2
(45) Date of Patent: Dec. 17, 2024

(54) IMAGING DEVICE AND ELECTRONIC DEVICE

(71) Applicant: SONY SEMICONDUCTOR SOLUTIONS CORPORATION, Kanagawa (JP)

(72) Inventors: Yoshimichi Kumagai, Kanagawa (JP); Takashi Abe, Kanagawa (JP); Ryoto Yoshita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/139,778

(22) Filed: Apr. 26, 2023

(65) Prior Publication Data

US 2023/0261030 A1    Aug. 17, 2023

Related U.S. Application Data

(63) Continuation of application No. 17/202,929, filed on Mar. 16, 2021, now Pat. No. 11,646,342, which is a
(Continued)

(30) Foreign Application Priority Data

Mar. 22, 2017  (JP) ................................. 2017-055309

(51) Int. Cl.
*H01L 27/148* (2006.01)
*H04N 25/76* (2023.01)

(52) U.S. Cl.
CPC ....... *H01L 27/14818* (2013.01); *H04N 25/76* (2023.01)

(58) Field of Classification Search
CPC ......... H01L 27/14818; H01L 27/14623; H01L 27/14643; H01L 27/14612; H01L 27/1464; H04N 25/76
(Continued)

(56) References Cited

U.S. PATENT DOCUMENTS

| 10,991,753 B2 | 4/2021 | Kumagi et al. |
| 2012/0012965 A1 | 1/2012 | Maeda |

(Continued)

FOREIGN PATENT DOCUMENTS

| CN | 102208425 A | 10/2011 |
| CN | 110419107 B | 5/2023 |

(Continued)

OTHER PUBLICATIONS

International Search Report and Written Opinion for International (PCT) Patent Application No. PCT/JP2018/009144, dated Jun. 5, 2018, 9 pages.

(Continued)

*Primary Examiner* — Tong-Ho Kim
(74) *Attorney, Agent, or Firm* — Sheridan Ross PC

(57) ABSTRACT

The present disclosure relates to an imaging device and an electronic device that make it possible to obtain a better pixel signal. A photoelectric conversion part that converts received light into a charge; a holding part that holds a charge transferred from the photoelectric conversion part; and a light shielding part that shields light between the photoelectric conversion part and the holding part are provided. The photoelectric conversion part, the holding part, and the light shielding part are formed in a semiconductor substrate. The light shielding part of a transfer region that transfers the charge from the photoelectric conversion part to the holding part is formed as a non-penetrating light shielding part that does not penetrate the semiconductor substrate. The light shielding part other than the transfer region is formed as a penetrating light shielding part that penetrates the semiconductor substrate. The present technology is applicable to an imaging device.

20 Claims, 41 Drawing Sheets

Related U.S. Application Data continuation of application No. 16/491,017, filed as application No. PCT/JP2018/009144 on Mar. 9, 2018, now Pat. No. 10,991,753.

(58) Field of Classification Search
USPC .......................................................... 257/228
See application file for complete search history.

(56) References Cited

U.S. PATENT DOCUMENTS

| | | | |
|---|---|---|---|
| 2013/0070131 A1* | 3/2013 | Ohkubo | ............ H01L 27/14629 |
| | | | 348/294 |
| 2014/0131779 A1 | 5/2014 | Takeda | |
| 2014/0327051 A1 | 11/2014 | Ahn et al. | |
| 2014/0346628 A1 | 11/2014 | Okazaki | |
| 2015/0181187 A1 | 6/2015 | Wu et al. | |
| 2016/0056199 A1 | 2/2016 | Kim et al. | |
| 2016/0099268 A1* | 4/2016 | Minowa | ............ H01L 27/14641 |
| | | | 257/432 |
| 2016/0225815 A1 | 8/2016 | Um et al. | |
| 2021/0202565 A1 | 7/2021 | Kumagi et al. | |

FOREIGN PATENT DOCUMENTS

| | | |
|---|---|---|
| JP | 2007-227643 | 9/2007 |
| JP | 2008-060198 | 3/2008 |
| JP | 2008-091771 | 4/2008 |
| JP | 2008-103647 | 5/2008 |
| JP | 2013-065688 | 4/2013 |
| JP | 2014-096490 | 5/2014 |
| JP | 2014-229810 | 12/2014 |
| JP | 2015-023259 | 2/2015 |
| JP | 2015-061192 | 3/2015 |
| JP | 2016181532 A | 10/2016 |
| KR | 20160085623 A | 7/2016 |
| KR | 20160088471 A | 7/2016 |
| WO | WO 2016/152512 | 9/2016 |

OTHER PUBLICATIONS

Official Action for U.S. Appl. No. 16/491,017, dated Sep. 2, 2020, 14 pages.
Notice of Allowance for U.S. Appl. No. 16/491,017, dated Sep. 2, 2020, 14 pages.
Notice of Allowance for U.S. Appl. No. 17/202,929, dated Jan. 5, 2023, 9 pages.
Corrected Notice of Allowance for U.S. Appl. No. 17/202,929, dated Mar. 15, 2023, 2 pages.

* cited by examiner

IMAGING DEVICE AND ELECTRONIC DEVICE

CROSS-REFERENCE TO RELATED APPLICATIONS

This application is a continuation of U.S. patent application Ser. No. 17/202,929, filed Mar. 16, 2021, which is a continuation of U.S. patent application Ser. No. 16/491,017, filed Sep. 4, 2019, now U.S. Pat. No. 10,991,753, which is a national stage application under 35 U.S.C. 371 and claims the benefit of PCT Application No. PCT/JP2018/009144 having an international filing date of Mar. 9, 2018, which designated the United States, which PCT application claimed the benefit of Japanese Patent Application No. 2017-055309 filed 22 Mar. 2017, the entire disclosures of each of which are incorporated herein by reference.

TECHNICAL FIELD

The present disclosure relates to an imaging device and an electronic device, for example, to an imaging device and an electronic device that can obtain better pixel signals.

BACKGROUND ART

Imaging devices such as complementary metal oxide semiconductor (CMOS) image sensors and charge coupled devices (CCDs) are widely used in digital still cameras, digital video cameras, and the like.

For example, light incident on a CMOS image sensor is subjected to photoelectric conversion in a photodiode (PD) included in a pixel. Then, a charge generated in the PD is transferred to floating diffusion (FD) through a transfer transistor, and converted into a pixel signal having a level according to an amount of received light.

Meanwhile, in a conventional CMOS image sensor, since a scheme of sequentially reading pixel signals from respective pixels row by row, a so-called rolling shutter scheme is generally employed, distortion has sometimes occurred in an image due to a difference in exposure timing.

Therefore, for example, Patent Document 1 discloses a CMOS image sensor that employs a scheme of reading pixel signals from all pixels simultaneously by providing a charge holding part in each pixel, a so-called global shutter scheme, the CMOS image sensor having an all pixel simultaneous electronic shutter function. By employing the global shutter scheme, exposure timing becomes the same for all the pixels, making it possible to avoid the occurrence of distortion in an image.

CITATION LIST

Patent Document

Patent Document 1: Japanese Patent Application Laid-Open No. 2008-103647

SUMMARY OF THE INVENTION

Problems to be Solved by the Invention

Since pixel layout is limited in a case where a configuration in which the charge holding part is provided in the pixel is employed, an aperture ratio decreases, and there is a concern that sensitivity of the PD may decrease or capacity of the PD and the charge holding part may decrease. Moreover, there is a concern that optical noise may be generated by light incident into the charge holding part while holding a charge.

The present technology has been made in view of such a situation, and makes it possible to obtain better pixel signals.

Solutions to Problems

An imaging device according to one aspect of the present technology includes: a photoelectric conversion part configured to convert received light into a charge; a holding part configured to hold a charge transferred from the photoelectric conversion part; and a light shielding part configured to shield light between the photoelectric conversion part and the holding part, in which the photoelectric conversion part, the holding part, and the light shielding part are formed in a semiconductor substrate having a predetermined thickness, and the light shielding part of a transfer region that transfers the charge from the photoelectric conversion part to the holding part is formed as a non-penetrating light shielding part that does not penetrate the semiconductor substrate, and the light shielding part other than the transfer region is formed as a penetrating light shielding part that penetrates the semiconductor substrate.

An electronic device according to one aspect of the present technology includes: an imaging device including: a photoelectric conversion part configured to convert received light into a charge; a holding part configured to hold a charge transferred from the photoelectric conversion part; and a light shielding part configured to shield light between the photoelectric conversion part and the holding part, the photoelectric conversion part, the holding part, and the light shielding part being formed in a semiconductor substrate having a predetermined thickness, the light shielding part of a transfer region that transfers the charge from the photoelectric conversion part to the holding part being formed as a non-penetrating light shielding part that does not penetrate the semiconductor substrate, and the light shielding part other than the transfer region being formed as a penetrating light shielding part that penetrates the semiconductor substrate; and a processing unit configured to process a signal from the imaging device.

The imaging device according to one aspect of the present technology includes the photoelectric conversion part that converts received light into a charge, the holding part that holds a charge transferred from the photoelectric conversion part, and the light shielding part that shields light between the photoelectric conversion part and the holding part. The photoelectric conversion part, the holding part, and the light shielding part are formed in a semiconductor substrate having a predetermined thickness, and the light shielding part of a transfer region that transfers the charge from the photoelectric conversion part to the holding part is formed as a non-penetrating light shielding part that does not penetrate the semiconductor substrate, and the light shielding part other than the transfer region is formed as a penetrating light shielding part that penetrates the semiconductor substrate.

The electronic device according to one aspect of the present technology includes the imaging device.

Effects of the Invention

According to one aspect of the present technology, better pixel signals can be obtained.

Note that advantageous effects described here are not necessarily restrictive, and any of the effects described in the present disclosure may be applied.

MODE FOR CARRYING OUT THE INVENTION

Figure 1:
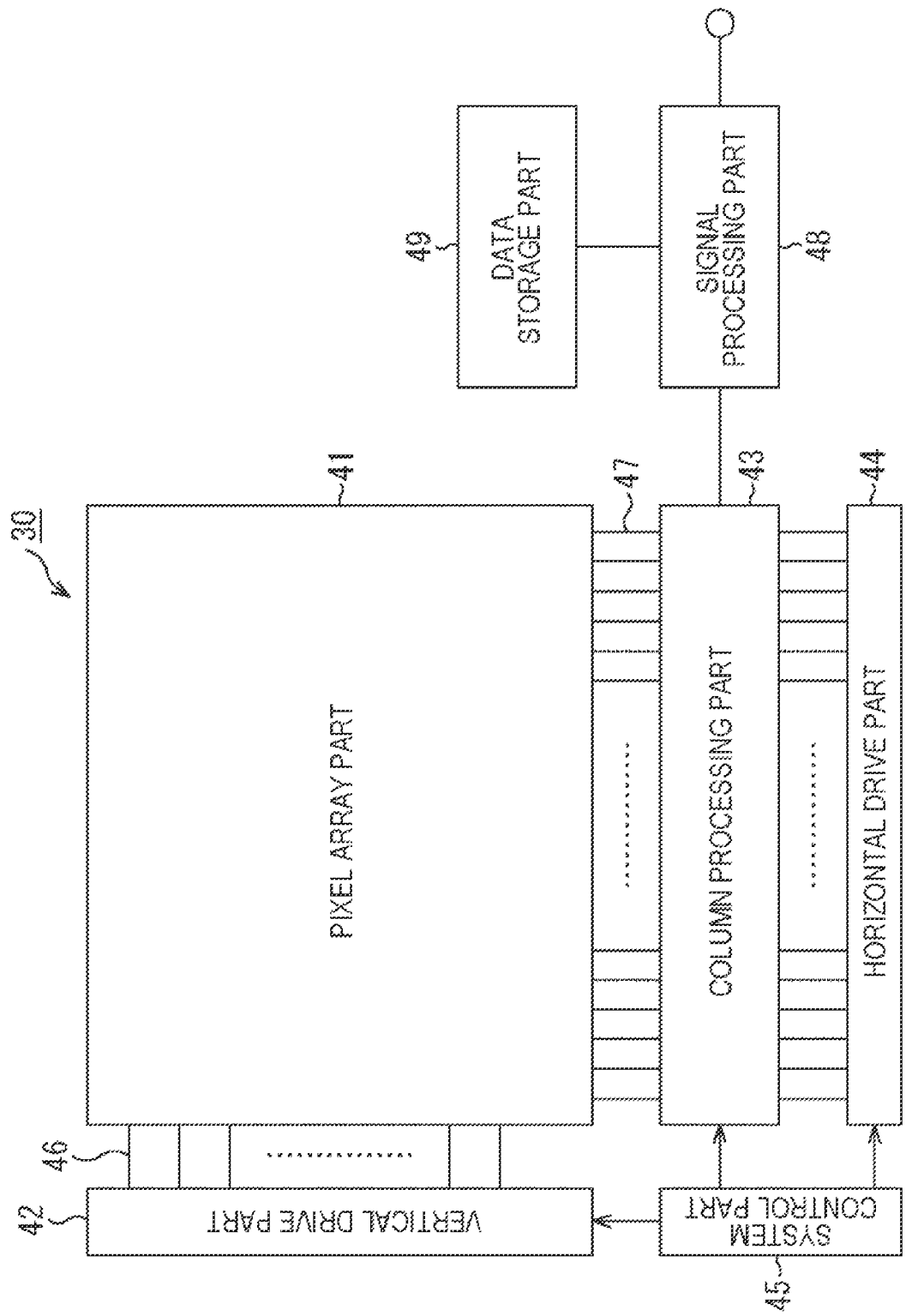
FIG. 1 is a diagram showing a configuration of an image sensor.

A mode for carrying out the present technology (hereinafter referred to as an embodiment) will be described below.
Configuration of Imaging Device FIG. 1 is a block diagram showing an exemplary configuration of a complementary metal oxide semiconductor (CMOS) image sensor as an imaging device to which the present invention is applied.

The CMOS image sensor 30 includes a pixel array part 41, a vertical drive part 42, a column processing part 43, a horizontal drive part 44, and a system control part 45. The pixel array part 41, the vertical drive part 42, the column processing part 43, the horizontal drive part 44, and the system control part 45 are formed on a semiconductor substrate (chip) which is not shown.

In the pixel array part 41, unit pixels (pixel 50 in FIG. 2) each including a photoelectric conversion element that generates and internally accumulates a light charge of a charge amount according to an incident light amount are arranged two-dimensionally in a matrix. Note that in the following, the light charge of a charge amount according to an incident light amount may be simply described as "charge", and the unit pixel may be simply described as "pixel."

In the pixel array part 41, furthermore, pixel drive lines 46 are formed along a horizontal direction in the drawing (arrangement direction of pixels in a pixel row) for each row of the matrix pixel array, and vertical signal lines 47 are formed along a vertical direction in the drawing (arrangement direction of pixels in a pixel column) for each column. One end of each pixel drive line 46 is connected to an output end corresponding to each row of the vertical drive part 42.

The CMOS image sensor 30 further includes a signal processing part 48 and a data storage part 49. The signal processing part 48 and the data storage part 49 may be an external signal processing part provided on a substrate different from the CMOS image sensor 30, for example, processing by a digital signal processor (DSP) or software, or may be mounted on the same substrate as the CMOS image sensor 30.

The vertical drive part 42 is a pixel drive part that includes a shift register, an address decoder, or the like, and drives respective pixels of the pixel array part 41 in a manner of driving all pixels at the same time, pixels of respective rows, or the like. This vertical drive part 42 includes a reading scanning system, a sweeping scanning system, or batch sweep, and batch transfer, although illustration of the specific configuration thereof is omitted.

The reading scanning system sequentially selects and scans the unit pixels of respective rows of the pixel array part 41 in order to read signals from the unit pixels. In a case of row drive (rolling shutter operation), regarding sweeping, sweeping scan is performed on a read row on which reading scan is performed by the reading scanning system in advance of the reading scan by a time of a shutter speed. Furthermore, in a case of global exposure (global shutter operation), batch sweeping is performed in advance of batch transfer by a time of the shutter speed.

By this sweeping, unnecessary charges are swept (reset) from the photoelectric conversion elements of the unit pixels of the read row. Then, a so-called electronic shutter operation is performed by sweeping (resetting) unnecessary charges. Here, the electronic shutter operation is an operation of discarding the light charges of the photoelectric conversion elements and newly starting exposure (starting accumulation of light charges).

The signal read by the reading operation by the reading scanning system corresponds to the light amount incident after the immediately preceding reading operation or the electronic shutter operation. In a case of row drive, a period from a reading timing by the immediately preceding reading operation or a sweeping timing by the electronic shutter operation to a reading timing by the current reading operation is a light charge accumulation period (exposure period) in the unit pixel. In a case of global exposure, a period from the batch sweeping to the batch transfer is the accumulation period (exposure period).

A pixel signal output from each unit pixel of the pixel row selected and scanned by the vertical drive part 42 is supplied to the column processing part 43 through each of the vertical signal lines 47. The column processing part 43 performs predetermined signal processing on the pixel signal output from each unit pixel of the selected row through the vertical signal line 47 for each pixel column of the pixel array part 41, and temporarily holds the pixel signal subjected to signal processing.

Specifically, the column processing part 43 performs at least noise removal processing, for example, correlated double sampling (CDS) processing as the signal processing. Pixel-specific fixed pattern noise such as reset noise and threshold variation of amplification transistors is removed by the correlated double sampling performed by the column processing part 43. Note that it is possible to cause the column processing part 43 to have, for example, an analog-digital (AD) conversion function in addition to the noise removal processing, and to output a signal level as a digital signal.

The horizontal drive part 44 includes a shift register, an address decoder, and the like, and selects the unit circuits corresponding to the pixel column of the column processing part 43 sequentially. The pixel signals subjected to signal processing by the column processing part 43 are sequentially output to the signal processing part 48 by the selection and scanning performed by the horizontal drive part 44.

The system control part 45 includes a timing generator that generates various timing signals and the like, and controls driving of the vertical drive part 42, the column processing part 43, the horizontal drive part 44, and the like on the basis of the various timing signals generated by the timing generator.

The signal processing part 48 has at least an addition processing function, and performs various types of signal processing such as addition processing on the pixel signal output from the column processing part 43. When the signal processing part 48 performs signal processing, the data storage part 49 temporarily stores data necessary for the processing.

Structure of Unit Pixel

Figure 2:
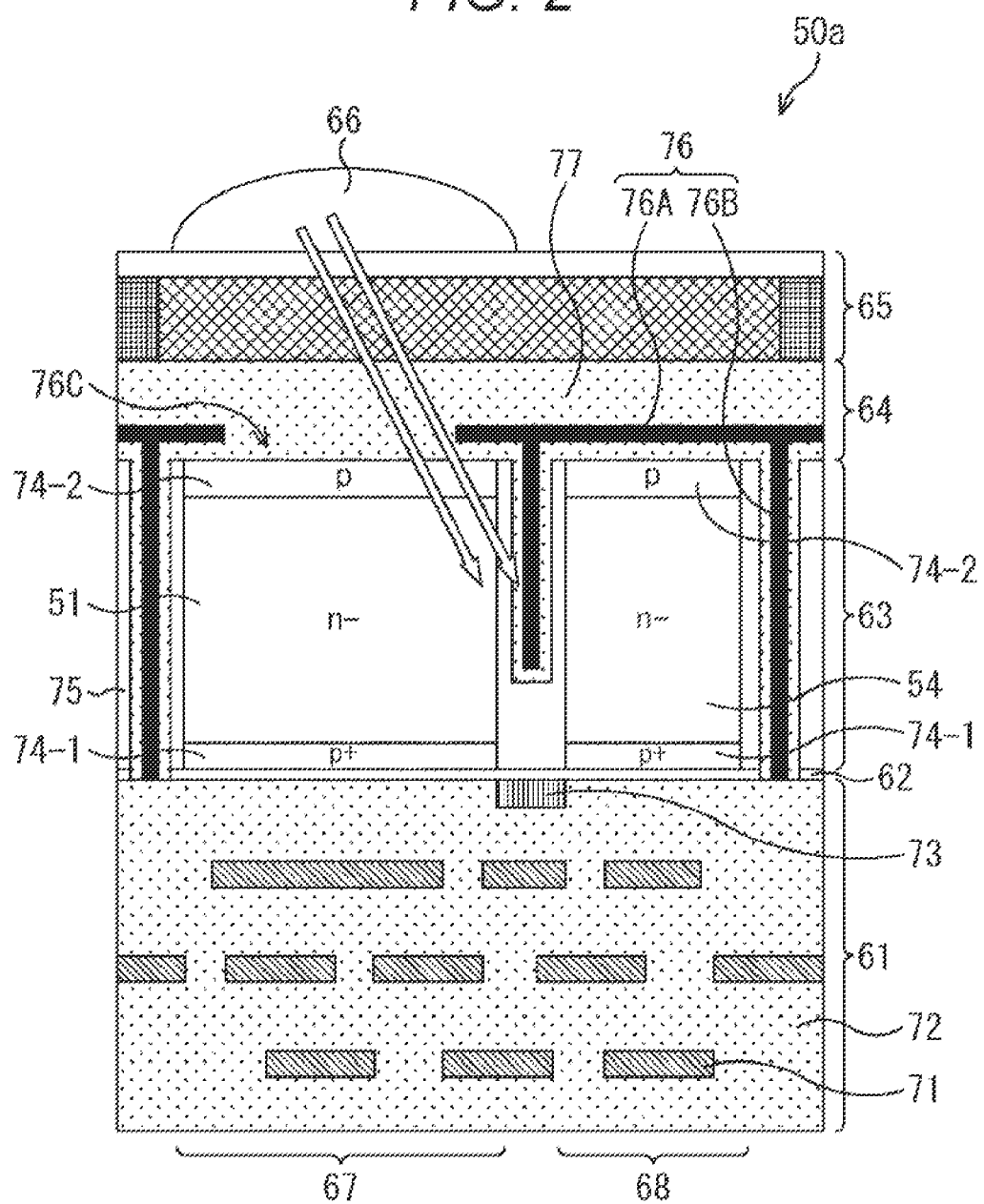
FIG. 2 is a diagram showing a configuration of a pixel.

Next, specific structure of the unit pixel 50 arranged in a matrix in the pixel array part 41 of FIG. 1 will be described. FIG. 2 is a diagram showing an exemplary cross-sectional configuration of the pixel 50.

With a pixel 50a that shows FIG. 2, light leaking into a charge holding region 68 can be prevented, and generation of optical noise can be prevented. Moreover, with a pixel 50b shown in FIG. 4, light incidence (parasitic light sensitivity (PLS): phenomenon similar to a smear) on the charge holding region 68 can be further suppressed (influence by light incidence is reduced).

First, with reference to FIG. 2, a description is added to a structure of the pixel 50a having a structure that prevents light from leaking into the charge holding region 68.

As shown in FIG. 2, the pixel 50a has a configuration in which a wiring layer 61, an oxide film 62, a semiconductor substrate 63, a light shielding layer 64, a color filter layer 65, and an on-chip lens 66 are sequentially stacked from a lower side of FIG. 2. Furthermore, in the pixel 50a, a region in which a PD 51 is formed in the semiconductor substrate 63 is a PD region 67, and a region in which a charge holding part 54 is formed in the semiconductor substrate 63 is the charge holding region 68.

Note that the image sensor 30 is a so-called back-illuminated CMOS image sensor in which a back surface opposite to a front surface of the semiconductor substrate 63 where the wiring layer 61 is provided on the semiconductor substrate 63 (surface facing upward in FIG. 2) is irradiated with incident light.

The wiring layer 61 is, for example, supported by a substrate support (not shown) disposed thereunder, and has a configuration in which a plurality of wires 71 that performs processing such as reading a charge of the PD 51 formed in the semiconductor substrate 63 is embedded in an interlayer insulating film 72.

Furthermore, in the wiring layer 61, a TRX gate 73 constituting a transfer transistor is disposed below the semiconductor substrate 63 via the oxide film 62 in a region between the PD 51 and the charge holding part 54. In response to application of a predetermined voltage to the TRX gate 73, a charge accumulated in the PD 51 is transferred to the charge holding part 54.

The oxide film 62 has insulating properties and insulates a surface side of the semiconductor substrate 63. In the semiconductor substrate 63, an N-type region constituting the PD 51 and an N-type region constituting the charge holding part 54 are formed.

Furthermore, a surface pinning layer 74-1 is formed on a back side of the PD 51 and the charge holding part 54, and a surface pinning layer 74-2 is formed on a front side of the PD 51 and the charge holding part 54. Moreover, in the semiconductor substrate 63, an interpixel separation region 75 for separating the pixel 50a and another adjacent pixel 50a is formed so as to surround an outer periphery of the pixel 50a.

The light shielding layer 64 is formed by embedding a light shielding part 76 including a material having light shielding properties in a high dielectric constant material film 77. For example, the light shielding part 76 includes a material such as tungsten (W), aluminum (Al), or copper (Cu), and is connected to GND which is not shown. The high dielectric constant material film 77 includes a material such as silicon dioxide (SiO2), hafnium oxide (HfO2), tantalum pentoxide (Ta2O5), or zirconium dioxide (ZrO2).

Furthermore, the light shielding part 76 includes a lid part 76A disposed to cover the semiconductor substrate 63, and an embedded part 76B embedded in a vertical groove formed in the semiconductor substrate 63 to surround the PD 51 and the charge holding part 54. In other words, the lid part 76A is formed substantially in parallel to each layer constituting the pixel 50*a*, and the embedded part 76B is formed to a predetermined depth to extend in a direction substantially orthogonal to the lid part 76A.

Here, besides a configuration in which the embedded part 76B of the light shielding part 76 is formed in the interpixel separation region 75 to surround the PD 51 and the charge holding part 54, the embedded part 76B may have a configuration in which, for example, the embedded part 76B forms a periphery of the charge holding part 54 or a configuration in which the embedded part 76B is formed between the PD 51 and the charge holding part 54. In other words, it is required at least that the embedded part 76B is formed between the PD 51 and the charge holding part 54, and that the PD 51 and the charge holding part 54 are separated by the embedded part 76B.

Furthermore, in the light shielding part 76, an aperture 76C for allowing light to enter the PD 51 is formed. In other words, the aperture 76C is formed in a region corresponding to the PD 51, and other regions, for example, regions where the charge holding part 54, an FD 55, or the like are formed are shielded by the light shielding part 76.

Furthermore, in an example shown in FIG. 2, the light shielding part 76 is formed such that part of the embedded part 76B penetrates the semiconductor substrate 63. In other words, the light shielding part 76 is formed such that the embedded part 76B penetrates the semiconductor substrate 63 in a region except for the region between the PD 51 and the charge holding part 54, in other words, except for a region that serves as a transfer path for transferring a charge from the PD 51 to the charge holding part 54.

In other words, the light shielding part cannot be formed in the region between the PD 51 and the charge holding part 54, which is used for charge transfer, but by forming the embedded part 76B outside the region, it is possible to effectively suppress light leaking into the charge holding part 54 from a region other than the PD 51 of the same pixel 50*a*.

In the following description, the light shielding part 76 is described as the penetrating light shielding part 76 so as to penetrate the semiconductor substrate 63, and the light shielding part 76 that does not penetrate the semiconductor substrate 63 is described as the non-penetrating light shielding part 76. In FIG. 2, the light shielding part 76 surrounding the pixel 50*a* is the penetrating light shielding part 76, and the light shielding part 76 formed between the PD 51 and the charge holding part 54 is the non-penetrating light shielding part 76. Furthermore, the penetrating light shielding part 76 is also non-penetrating in a place where a transistor is disposed or other places.

In the color filter layer 65, filters that transmit light of color corresponding to each pixel 50*a* are disposed, and for example, filters that transmit green, blue, and red light are disposed in the so-called Bayer array in each pixel 50*a*.

The on-chip lens 66 is a small lens for concentrating, on the PD 51, incident light incident on the pixel 50*a*.

As described above, the pixel 50*a* includes the light shielding part 76 in which the embedded part 76B is formed at least between the PD 51 and the charge holding part 54. With this configuration, as shown by hollow arrows in FIG. 2, even if light is incident from an oblique direction and passes through the PD 51, the light can be shielded by the embedded part 76B, and thus light leaking into the charge holding region 68 can be prevented. Therefore, generation of optical noise that is expected to be generated in a case where light leaks into the charge holding region 68 can be prevented.

<About Light Incident into Charge Holding Region>

With the pixel 50*a* shown in FIG. 2, since light that is incident in an oblique direction, passes through the PD 51, and enters the charge holding part 54 is shielded by the light shielding part 76, as described above, generation of optical noise that is expected to be generated in a case where light leaks into the charge holding region 68 can be prevented. Moreover, reducing an influence by the light reflected by the wiring layer 61 will be described.

Figure 3:
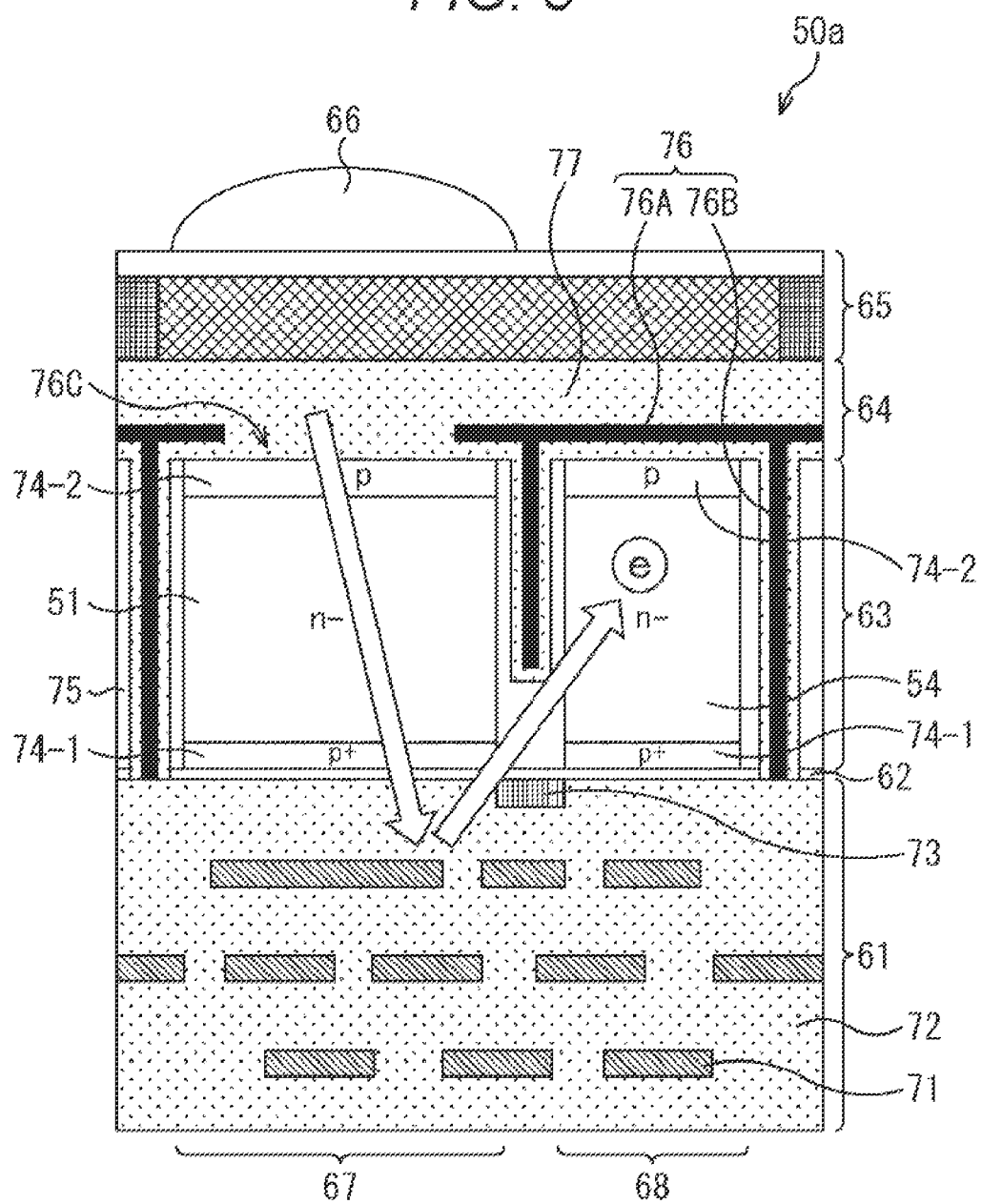
FIG. 3 is a diagram for describing an influence of reflected light.

FIG. 3 shows again the pixel 50*a* shown in FIG. 2. As shown by hollow arrows in FIG. 3, of the light incident into the PD 51, some light penetrates the PD 51 and reaches the wiring layer 61. Part of the light reaching the wiring layer 61 is reflected by the wires 71 and incident into the charge holding part 54. Thus, there is a possibility that light is incident into the charge holding part 54 not only from a PD 51 side but also from a wiring layer 61 side.

The configuration of the pixel 50 for reducing an influence of a light component from the wiring layer 61 side in order to further suppress generation of optical noise that is expected to be generated in a case where light leaks into the charge holding region 68 will be described.

<Other Configurations of Pixel>

Figure 4:
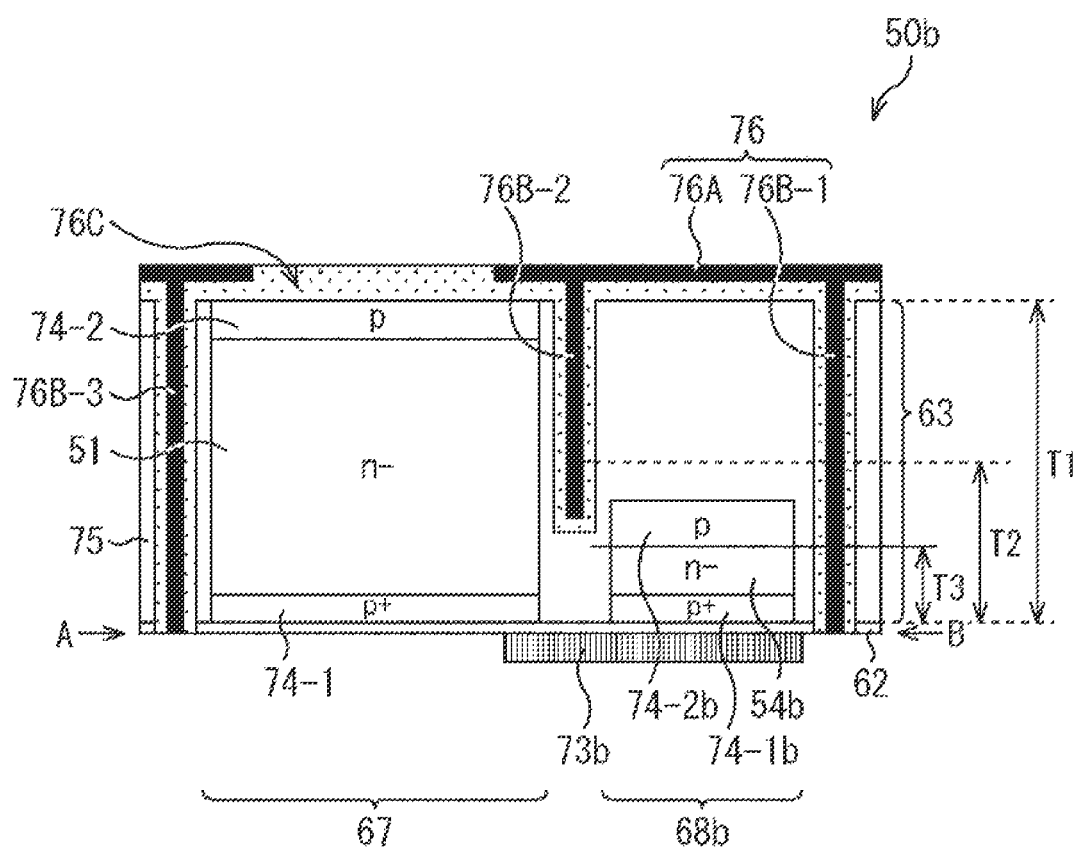
FIG. 4 is a diagram showing a configuration of one embodiment of a pixel to which the present technology is applied.

FIG. 4 is a diagram showing another configuration of the pixel 50. Regarding the diagrams of the pixel 50 in FIG. 4 and thereafter, illustration of the wiring layer 61, the light shielding layer 64, the color filter layer 65, and the on-chip lens 66 will be omitted.

When the pixel 50*b* shown in FIG. 4 is compared with the pixel 50*a* shown in FIG. 2, the configuration of the charge holding region 68 is different. The charge holding region 68*b* of the pixel 50*b* includes a surface pinning layer 74-1*b*, a charge holding part 54*b*, and a surface pinning layer 74-2*b* in a similar manner to the pixel 50*a* shown in FIG. 2, but a thickness of each layer, in particular, the charge holding part 54*b* is thin.

The thickness of the charge holding part 54*b* of the pixel 50*b* shown in FIG. 4 is a thickness satisfying conditions to be described below. It is assumed that the thickness of the semiconductor substrate 63 is a thickness T1, and a thickness half of T1 is a thickness T2. It is assumed that the thickness of the charge holding part 54*b* and the pinning layer 74-1*b* is a thickness T3. The charge holding part 54*b* and the pinning layer 74-1*b* function as a holding region for holding a charge (memory), and the thickness T3 of this memory is formed to be equal to or less than the thickness T2 that is half the thickness of the semiconductor substrate 63.

Thus, PLS can be suppressed by only forming the thickness T3 of the charge holding part 54*b* and the pinning layer 74-1*b* to be equal to or less than the thickness T2 that is half the thickness of the semiconductor substrate 63.

With reference to FIG. 3 again, there is a strong possibility that the light reflected by the wiring layer 61 reaches an upper portion of the charge holding region 68 (upper side in the diagram), in other words, an upper portion of the charge holding part 54 (side not on the wiring layer 61 side), and is subjected to photoelectric conversion. Therefore, as shown in FIG. 4, the structure in which the charge holding part 54 is not provided in the upper portion of the charge holding region 68 can prevent the light reflected by the wiring layer 61 from being incident into the charge holding part 54.

Accordingly, such a structure makes it possible to reduce the influence of the light reflected by the wiring layer 61, and to prevent generation of optical noise that is expected to be generated in a case where light leaks into the charge holding region 68.

Configuration of Light Shielding Part

As described above, providing the light shielding part 76, particularly the embedded part 76B between the PD 51 and the charge holding part 54b makes it possible to prevent the generation of optical noise that is expected to be generated in a case where light penetrates the PD 51 and leaks into the charge holding region 68.

Furthermore, forming the charge holding part 54b with the thickness equal to or less than half the thickness of the semiconductor substrate 63 makes it possible to prevent the generation of optical noise that is expected to be generated in a case where light is reflected by the wiring layer 61 and leaks into the charge holding region 68.

Meanwhile, the embedded part 76B provided between the PD 51 and the charge holding part 54b is provided, for example, as the light shielding part 76 that does not penetrate the semiconductor substrate 63 as shown in FIG. 4. If the embedded part 76B provided between the PD 51 and the charge holding part 54b is formed to penetrate the semiconductor substrate 63, transfer of a charge from the PD 51 to the charge holding part 54b cannot be performed. Accordingly, the embedded part 76B provided between the PD 51 and the charge holding part 54b needs to have a configuration in which the transfer from the PD 51 to the charge holding part 54b is not hindered.

Meanwhile, with reference to FIG. 3 again, if the embedded part 76B provided between the PD 51 and the charge holding part 54b penetrates the semiconductor substrate 63, it is considered that the light reflected by the wiring layer 61 is shielded by the embedded part 76B, and that it is possible to prevent the light from leaking into the charge holding part 54b.

Therefore, a configuration of the embedded part 76B to prevent the light reflected by the wiring layer 61 from leaking into the charge holding part 54b without hindering the transfer of a charge from the PD 51 to the charge holding part 54b will be described.

Figure 5:
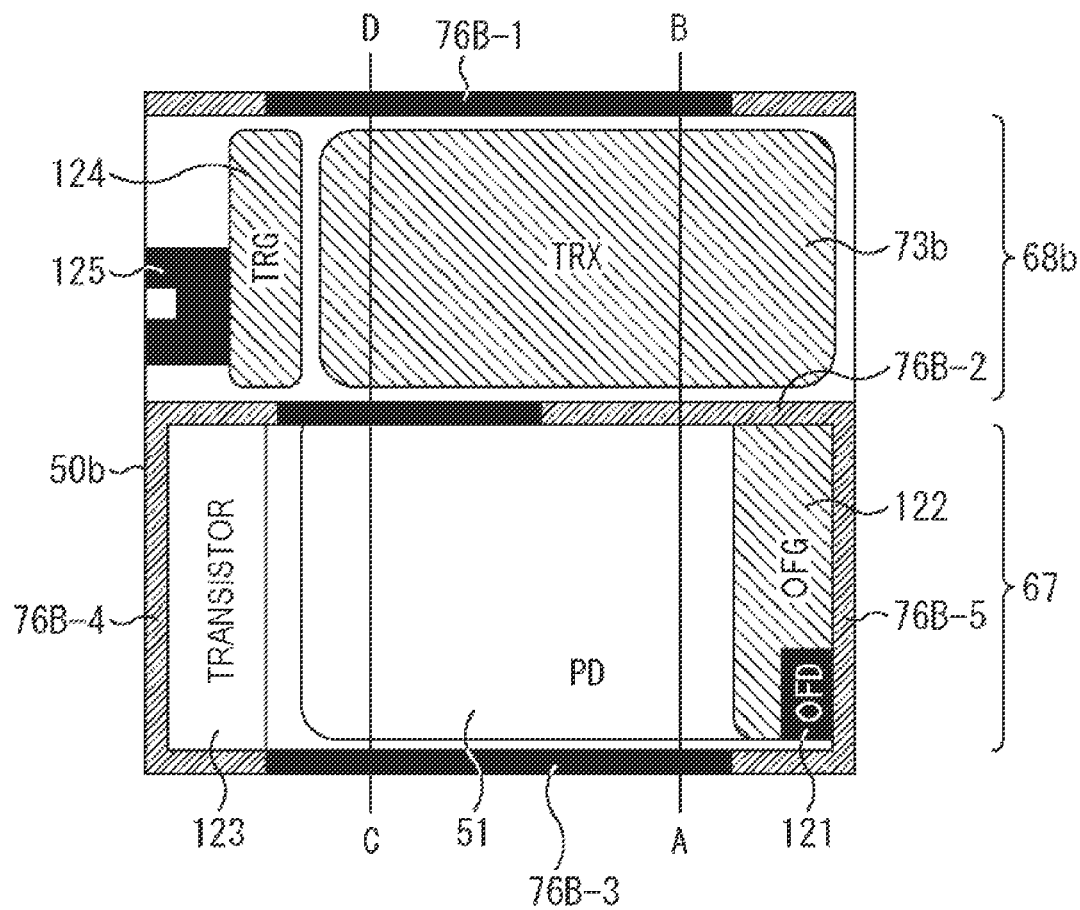
FIG. 5 is a plan view showing the configuration of the pixel.

FIG. 5 is a plan view of the pixel 50b shown in FIG. 4 when viewed from below (lower side in FIG. 4). The pixel 50b shown in FIG. 4 is an exemplary cross-sectional configuration of the pixel 50b in the cross section of arrow A-B shown in FIG. 5.

An OFD 121 is positioned at the lower right in the diagram. The OFD 121 represents a drain connected to a reset gate of the PD 51. The OFD 121 is connected to the PD 51 via an OFG gate 122.

The charge holding region 68b is disposed on an upper side of the PD 51. When the pixel 50b is viewed from below, a TRX gate 73b is disposed in a region where the charge holding region 68b (charge holding part 54b) is disposed. The TRX gate 73b is provided to control the transfer of a charge from the PD 51 to the charge holding part 54b.

A floating diffusion region 125 (FD 125) is disposed on a left side of the charge holding region 68b in the diagram via the TRX gate 73b. A TRG gate 124 is provided to transfer a charge from the charge holding part 54b to the floating diffusion region 125.

A light shielding part 76B-1 is formed in an upper portion of the charge holding region 68b (upper side in the diagram). Although both ends of this light shielding part 76B-1 are partially formed in a non-penetrating manner because a transistor or the like is disposed, basically, to prevent light leakage between pixels, the light shielding part 76B-1 is formed as a penetrating light shielding part penetrating the semiconductor substrate 63.

Similarly, a light shielding part 76B-3 is formed in a lower portion of the PD region 67 (lower side in the diagram), and a region where the transistor 123 and the like are disposed is formed in a non-penetrating manner, but basically, to prevent light leakage between pixels, the light shielding part 76B-3 is formed as a penetrating light shielding part penetrating the semiconductor substrate 63.

The penetrating light shielding part 76B-3 is a light shielding part provided between the pixels 50b and is the same as the penetrating light shielding part 76B-1 although denoted with a different reference symbol for convenience of description.

A light shielding part 76B-2 is formed in a boundary part between the charge holding region 68b and the PD 51. The light shielding part 76B-2 will be described later with reference to FIG. 7. Part of the light shielding part 76B-2 is a penetrating light shielding part, and the other part is a non-penetrating light shielding part.

Furthermore, a light shielding part 76B-4 disposed in a region where the transistor 123 on the left side in FIG. 5 is disposed and a light shielding part 76B-5 disposed in a region where the OFG gate 122 on the right side in FIG. 5 is disposed are non-penetrating.

Between the pixels 50b, light leaking between pixels is shielded by the penetrating light shielding part 76B except for a part where transistors are disposed and the like. Furthermore, light leaking from the PD 51 side to the charge holding part 54b is shielded and light reflected by the wiring layer 61 is also shielded by the light shielding part 76B that is penetrating except for some part between the PD region 67 (PD 51) and the charge holding region 68b (charge holding part 54b).

In other words, in the pixel 50b shown in FIG. 5, the light shielding part 76 formed in a region other than a region for disposing a transistor and a region required for charge transfer is the penetrating light shielding part 76B penetrating the semiconductor substrate 63.

Figure 6:
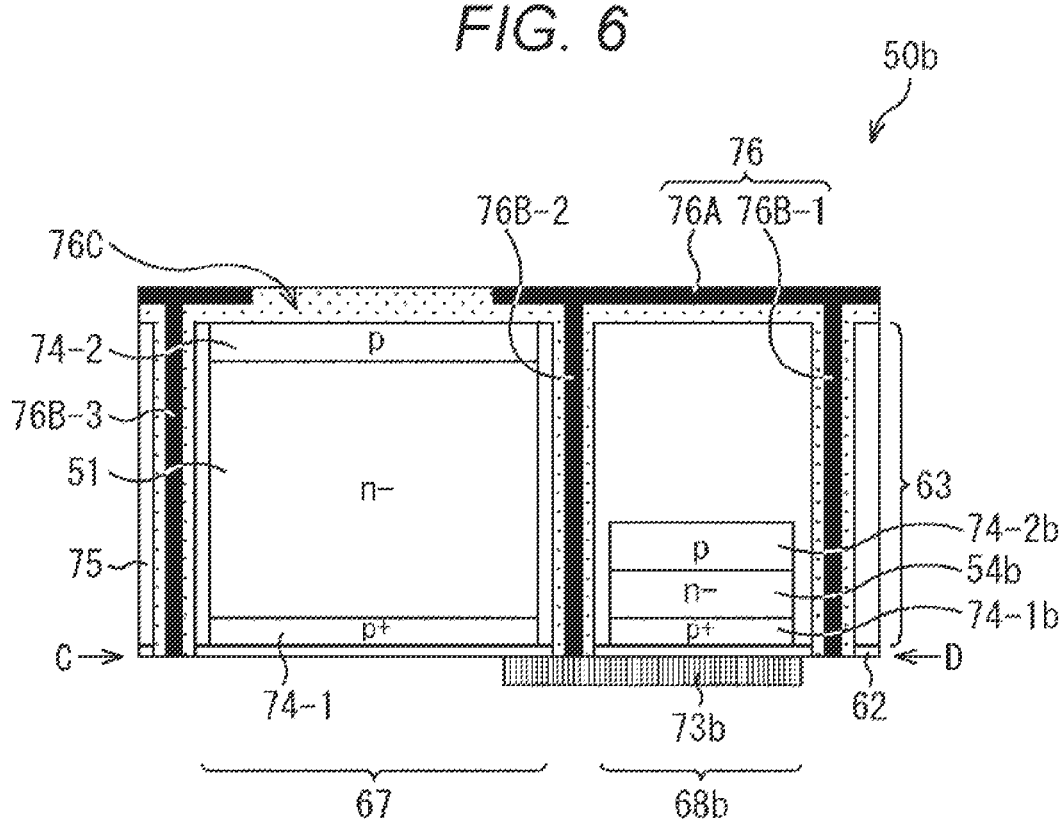
FIG. 6 is a cross-sectional view showing the configuration of the pixel.

An exemplary cross-sectional configuration of the pixel 50b in the cross section of arrow A-B shown in FIG. 5 is the pixel 50b shown in FIG. 4. An exemplary cross-sectional configuration of the pixel 50b in the cross section of arrow C-D shown in FIG. 5 is the pixel 50b shown in FIG. 6. The pixel 50b shown in FIG. 4 and the pixel 50b shown in FIG. 6 basically have similar cross-sectional configurations, but differ in that the light shielding part 76B-2 formed between the PD 51 and the charge holding part 54b is formed in a non-penetrating manner (FIG. 4) or penetrating manner (FIG. 6).

Moreover, the light shielding part 76B-2 disposed between the PD region 67 and the charge holding region 68b will be described with reference to FIG. 7. The transistor 123 is disposed in a region from a position P0 to a position P1 on a left side of the diagram, and the light shielding part 76B-2 disposed in the region is non-penetrating.

Out of a region from a position P3 to a position P5 where the PD 51 is disposed, the light shielding part 76B-2 disposed in a region from the position P3 to a position P4 is penetrating, and the light shielding part 76B-2 disposed in a region from the position P4 to the position P5 is non-penetrating.

Figure 7:
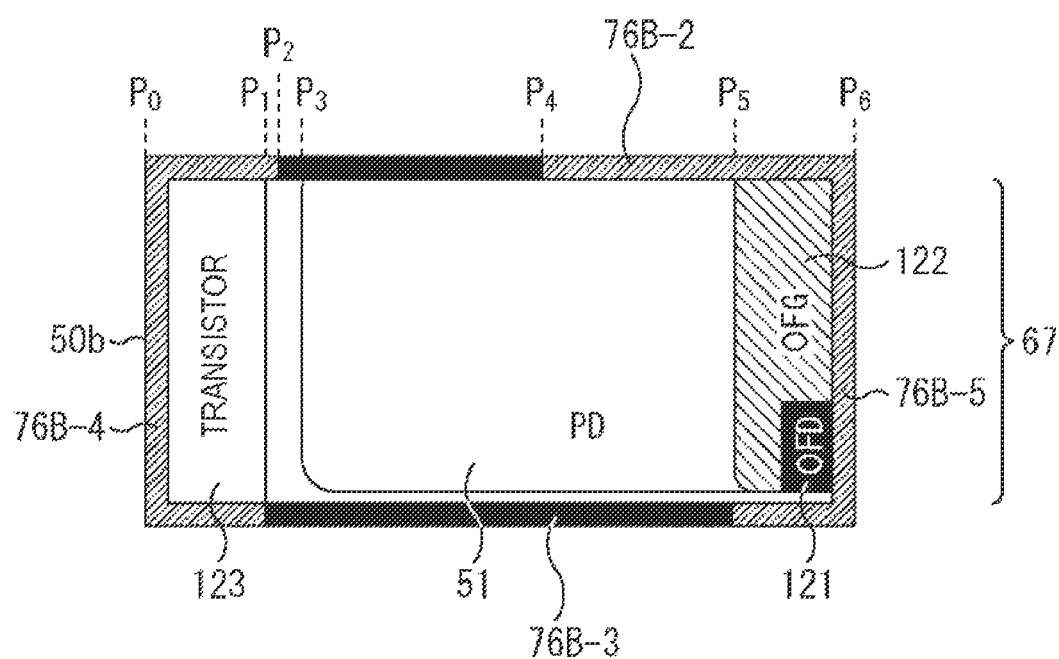
FIG. 7 is a diagram for describing a light shielding part.

In an example shown in FIG. 7, the penetrating light shielding part 76B-2 is disposed from a position P2 between the position P1 and the position P3, but the position P2 may be the same position as the position P3. In other words, the penetrating light shielding part may be started from the same position as an end of the PD 51, or may be started from a position different from the end of the PD 51.

In FIG. 7, the light shielding part 76B-2 disposed in a region from the position P5, which is a position of an end of the OFG gate 122, to a position P6 of a boundary position of the pixel 50*b* is non-penetrating.

Thus, part of the light shielding part 76B-2 disposed between the PD region 67 and the charge holding region 68*b* is formed as a penetrating light shielding part penetrating the semiconductor substrate 63, and the light shielding part 76B-2 disposed in a region where a transistor or the like is disposed and a region for transferring a charge from the PD 51 to the charge holding part 54*b* is formed as a non-penetrating light shielding part that does not penetrate the semiconductor substrate 63.

It is possible to prevent the light reflected by the wiring layer 61 from leaking into the charge holding part 54*b* by making part of the light shielding part 76B-2 disposed between the PD region 67 and the charge holding region 68*b* a penetrating light shielding part.

Furthermore, since a part for transferring a charge from the PD 51 to the charge holding part 54*b* is a non-penetrating light shielding part, the transfer is not hindered. In other words, a region from the position P4 to the position P5 is a non-penetrating light shielding part, and the transfer can be performed from this aperture. For example, when a size from the position P3 of the end of the PD 51 to the position P5 of the end of the OFG gate 122 is 1, this aperture is required at least to be formed to have a size of 1/5 or more.

Figure 8:
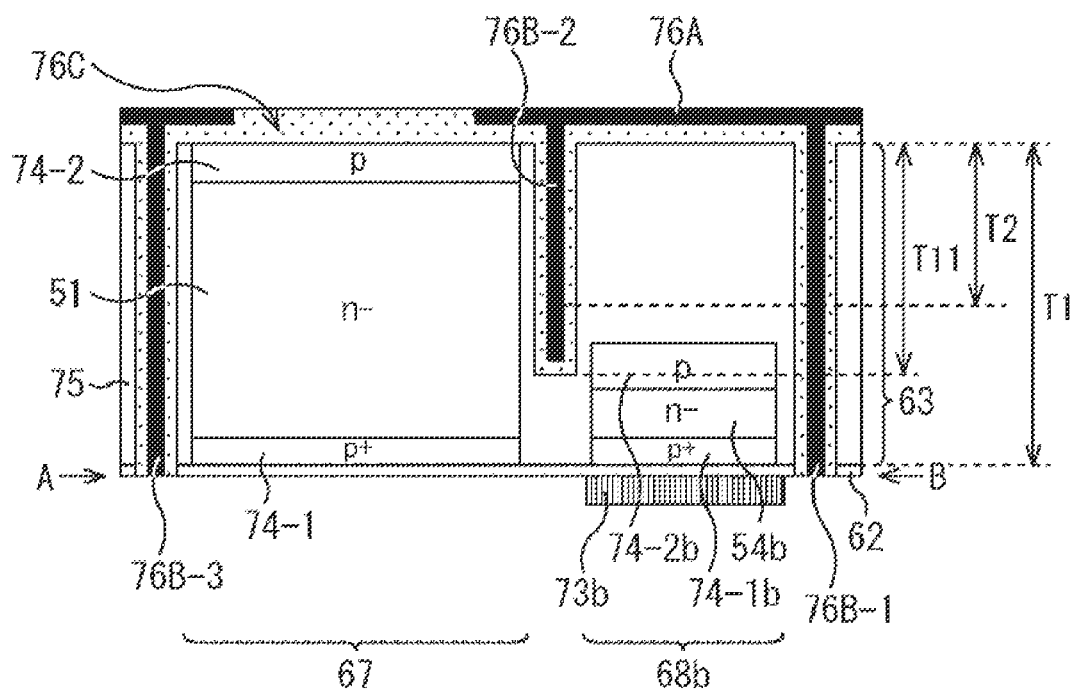
FIG. 8 is a diagram for describing a depth of the light shielding part.
Figure 9:
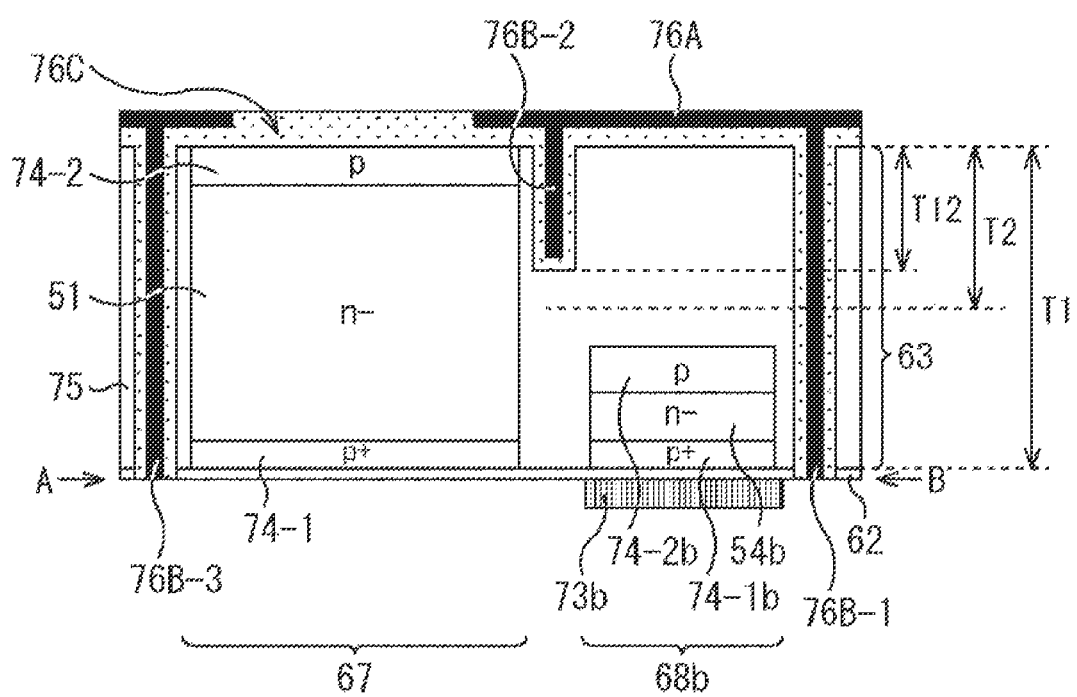
FIG. 9 is a diagram for describing the depth of the light shielding part.

Furthermore, the light shielding part 76B-2 (non-penetrating light shielding part 76-2) formed in the part of the aperture is required at least to be formed, for example, at a depth as shown in FIG. 8 and FIG. 9. In FIG. 8 and FIG. 9, as in FIG. 4, the thickness of the semiconductor substrate 63 is the thickness T1, and the thickness half of the semiconductor substrate 63 is the thickness T2.

As shown in FIG. 8, a depth T11 of the non-penetrating light shielding part 76B-2 can be deeper than the thickness T2 that is half the thickness of the semiconductor substrate 63. In other words, in an example shown in FIG. 8, a digging amount of the non-penetrating light shielding part 76B-2 is larger than the thickness T2 that is half the thickness of the semiconductor substrate 63.

Alternatively, as shown in FIG. 9, a depth T12 of the non-penetrating light shielding part 76B-2 can be shallower than the thickness T2 that is half the thickness of the semiconductor substrate 63. In other words, in an example shown in FIG. 9, the digging amount of the non-penetrating light shielding part 76B-2 is an amount smaller than the thickness T2 that is half the thickness of the semiconductor substrate 63.

In a case where the non-penetrating light shielding part 76B-2 is provided to suppress PLS, P-type ion implantation that ensures holes in the non-penetrating light shielding part 76B-2 is required. For this reason, as shown in FIG. 8, in a case where the digging amount of the non-penetrating light shielding part 76B-2 is set to dig half or more of a film thickness of the semiconductor substrate 63, an effect of suppressing PLS can be enhanced, but there is a possibility that charge transfer characteristics from the PD 51 to the charge holding part 54*b* is degraded.

Meanwhile, as shown in FIG. 9, in a case where the digging amount of the non-penetrating light shielding part 76B-2 is set to dig only half or less of the film thickness of the semiconductor substrate 63, there is a possibility that the effect of suppressing PLS is reduced, but a charge can be performed without degrading charge transfer characteristics from the PD 51 to the charge holding part 54*b*.

Since the transfer characteristic is a trade-off with the number of saturated electrons, balance between suppression of PLS and the number of saturated electrons is considered, and the digging amount of the non-penetrating light shielding part 76B-2 is designed to obtain performance required for the pixel 50*b*.

Other Configurations of Pixel

Other configurations of the pixel 50 will be described.

Figure 10:
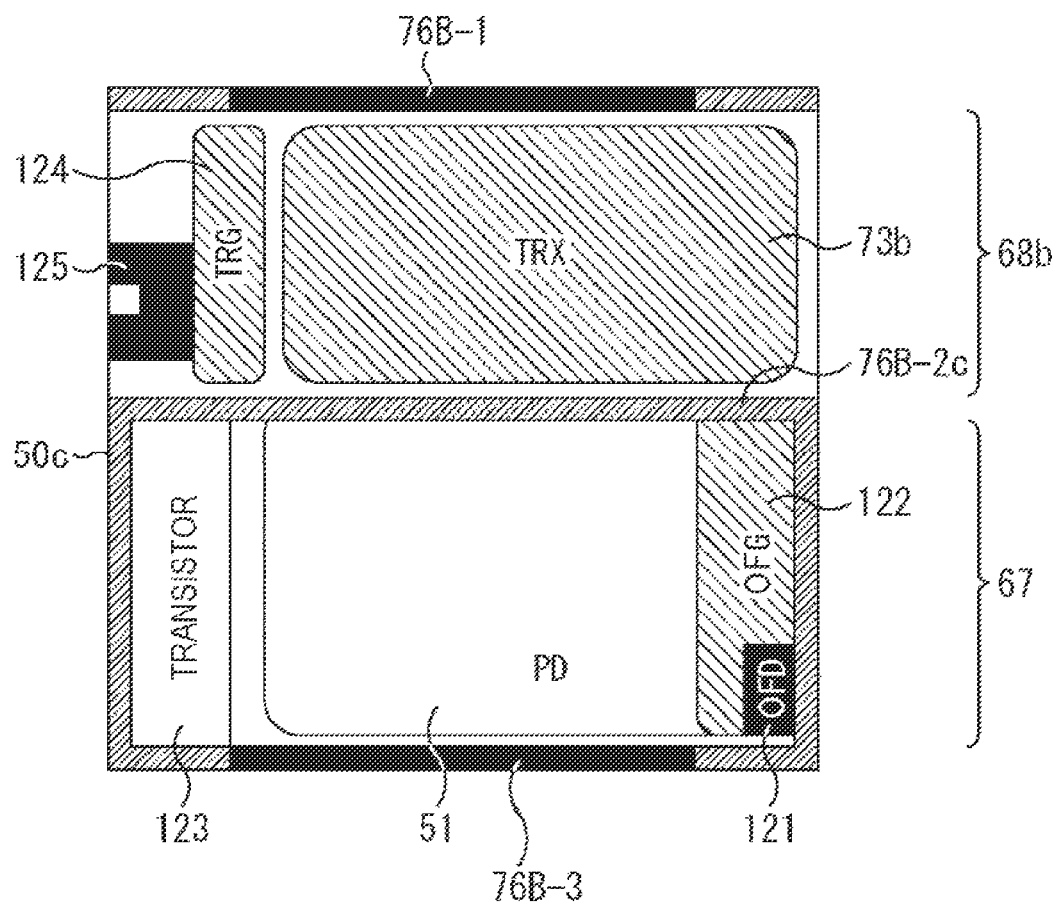
FIG. 10 is a plan view showing another configuration of the pixel.

FIG. 10 is a plan view showing another configuration of the pixel 50. On comparison, a pixel 50*c* shown in FIG. 10 differs from the pixel 50*b* shown in FIG. 5 in that a light shielding part 76B-2*c* formed between the PD region 67 (PD 51) and the charge holding region 68*b* (charge holding part 54*b*) is all formed as a non-penetrating light shielding part, and other parts are the same.

Parts similar to parts of the pixel 50*b* shown in FIG. 5 are denoted with similar reference symbols, and description thereof will be omitted. Furthermore, similarly in the following description, parts similar to parts of the pixel 50*b* shown in FIG. 5 will be described with similar reference symbols.

As described with reference to FIG. 4, by forming the charge holding part 54*b* thinly, the influence of the light reflected by the wiring layer 61 can be suppressed (PLS can be suppressed), and therefore PLS can be suppressed even if all the light shielding part 76*c*-2 formed between the PD 51 and the charge holding part 54*b* is formed as a non-penetrating light shielding part.

However, there is a possibility that the pixel 50*c* shown in FIG. 10 has performance of suppressing PLS lower than performance of the pixel 50*b* described with reference to FIG. 5 and the like. Meanwhile, with this configuration, the transfer from the PD 51 to the charge holding part 54*b* is more advantageous than the pixel 50*b* described with reference to FIG. 5 and the like in that a W length is increased.

Figure 11:
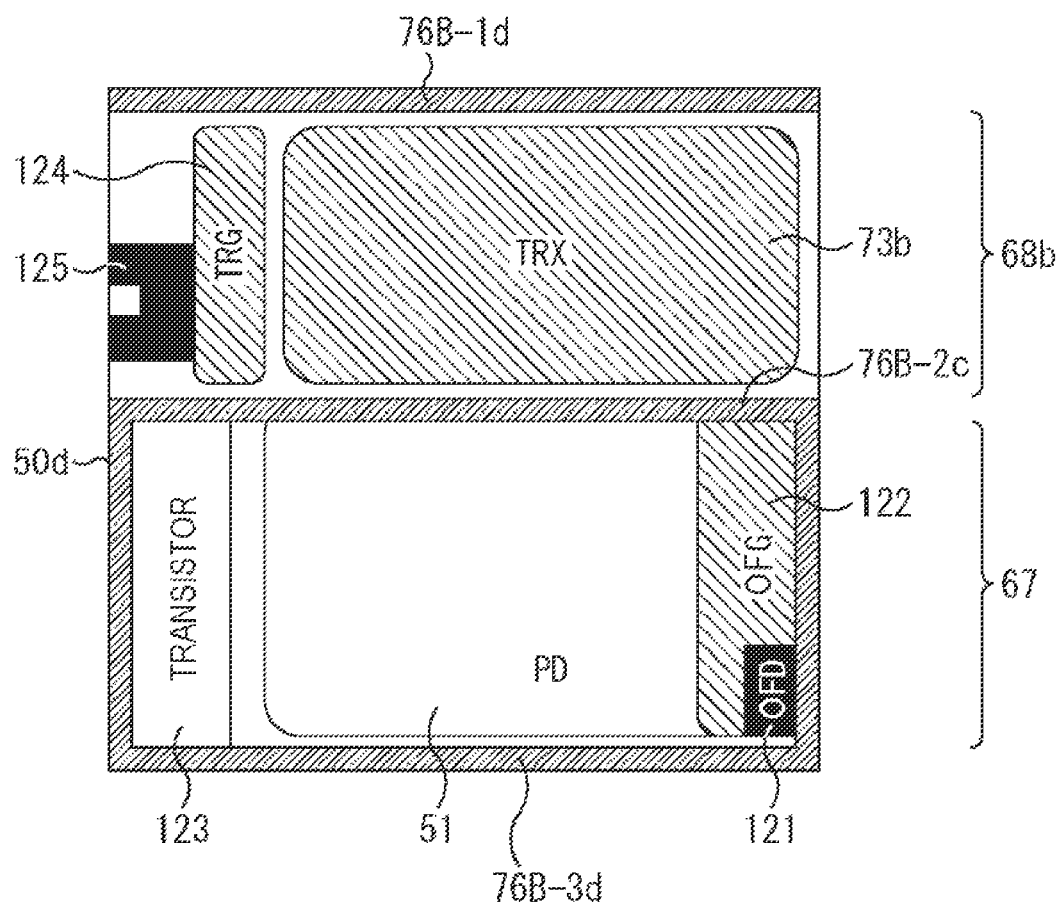
FIG. 11 is a plan view showing another configuration of the pixel.

Moreover, as in a pixel 50*d* shown in FIG. 11, all of a light shielding part 76*d*-1*d* and a light shielding part 76*d*-3*d* formed between the pixels 50 may be formed as non-penetrating light shielding parts. In a pixel 50*db* shown in FIG. 11, all of the light shielding parts 76 formed are non-penetrating light shielding parts.

There is a possibility that the performance of suppressing PLS is lower in the configuration of the pixel 50*d* shown in FIG. 11 than in the pixel 50*c* shown in FIG. 10, but since the non-penetrating light shielding part and the penetrating light shielding part are not mixed, it is unnecessary to produce the non-penetrating light shielding part and the penetrating light shielding part separately at the time of manufacture, making it possible to reduce the manufacturing process.

Figure 12:
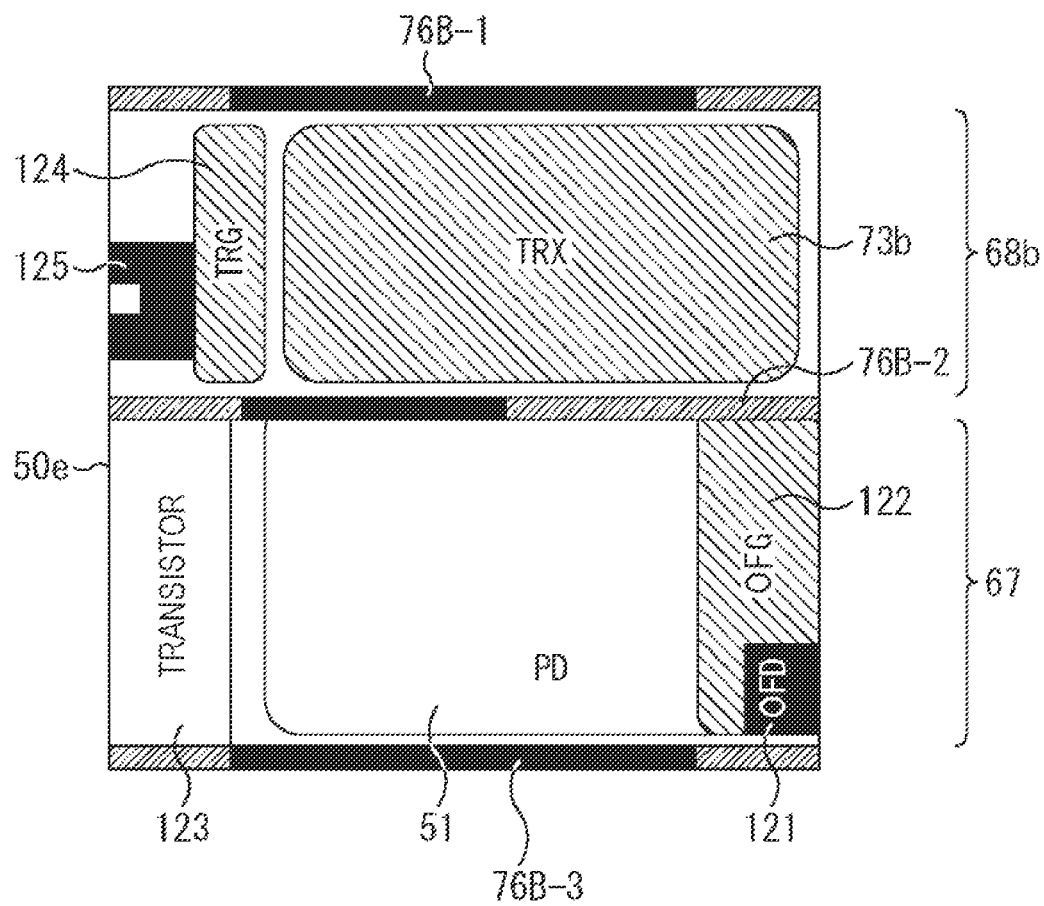
FIG. 12 is a plan view showing another configuration of the pixel.

FIG. 12 is a plan view showing another configuration of the pixel 50. On comparison, a pixel 50*e* shown in FIG. 12 differs from the pixel 50*b* shown in FIG. 5 in that the light shielding part 76B-4 and the light shielding part 76B-5 formed between the PD regions 67 have been deleted, and other parts are the same.

The light shielding part 76B-4 and the light shielding part 76B-5 that have been formed between the PD regions 67 are effective in suppressing color mixture that is generated if light leaks from one PD 51 into the other PD 51, but in terms of preventing light leakage from the PD 51 to the charge holding part 54*b* and light leakage from the wiring layer 61, the light shielding part 76B-4 and the light shielding part 76B-5 may be deleted. The light shielding part 76B-4 and the light shielding part 76B-5 that have been formed between the PD regions 67 can be formed as needed.

Figure 13:
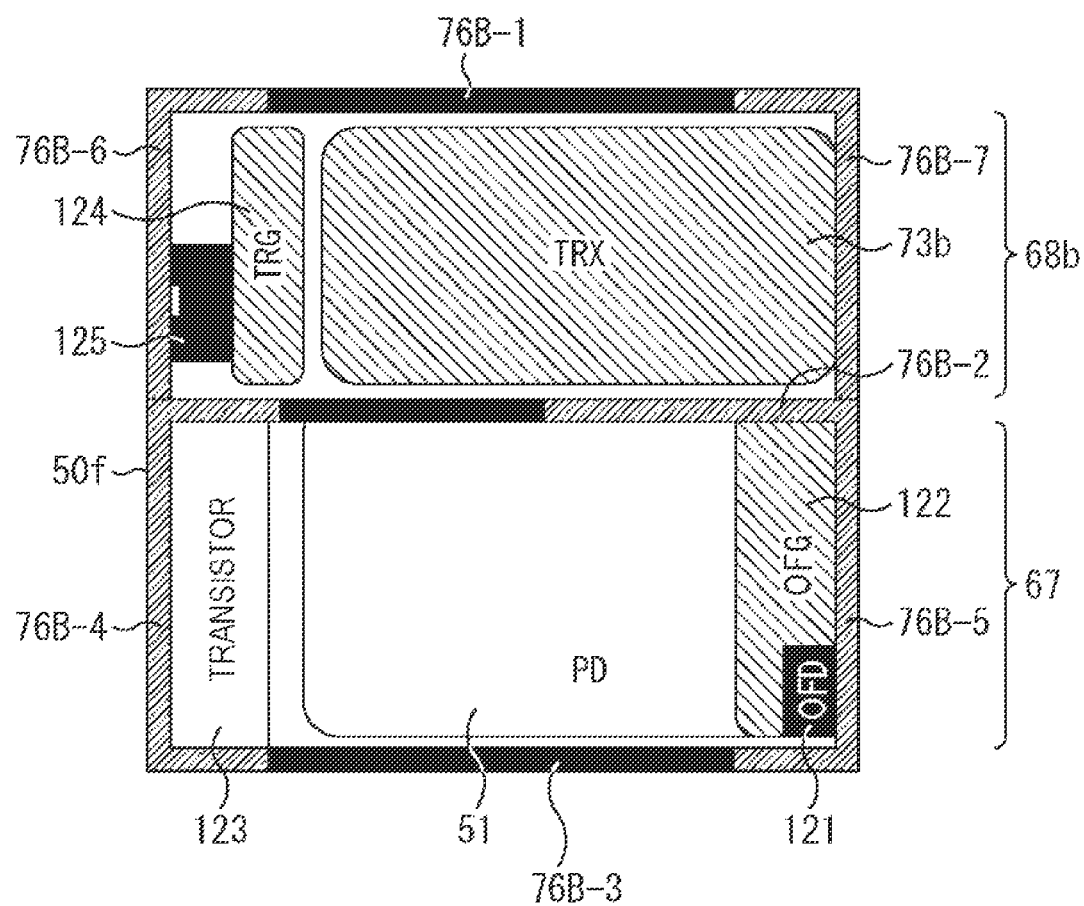
FIG. 13 is a plan view showing another configuration of the pixel.

FIG. 13 is a plan view showing another configuration of the pixel 50. On comparison, a pixel 50f shown in FIG. 13 differs from the pixel 50b shown in FIG. 5 in that a light shielding part 76B-6 and a light shielding part 76B-7 are also formed between the charge holding regions 68b, and other parts are the same.

The light shielding part 76B-6 and the light shielding part 76B-7 formed between the charge holding regions 68b are non-penetrating light shielding parts because the TRX gate 73b is disposed and the TRG gate 124 is disposed.

Providing the light shielding part 76 also between the charge holding regions 68b makes it possible to prevent light leaking from the one charge holding region 68b to the other charge holding region 68b, and to suppress PLS more.

Figure 14:
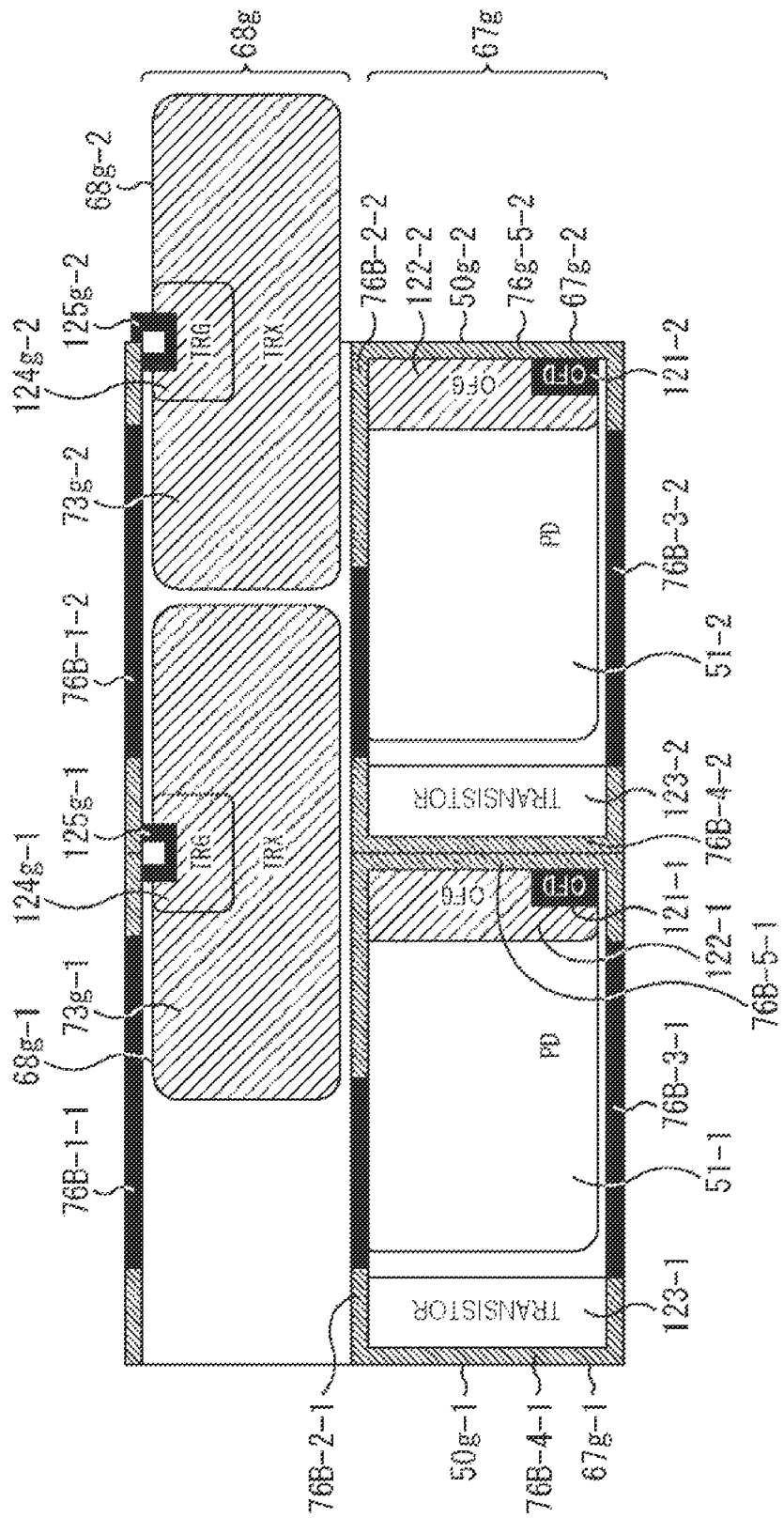
FIG. 14 is a plan view showing another configuration of the pixel.

FIG. 14 is a plan view showing another configuration of the pixel 50. On comparison, a pixel 50g shown in FIG. 14 differs from the pixel 50b shown in FIG. 5 in that a charge holding region 68g is disposed at a position shifted by a half pitch with respect to a PD region 67g.

FIG. 14 shows a PD region 67g-1 and a PD region 67g-2 adjacent to each other. A charge accumulated in this PD region 67g-1 is transferred to a charge holding region 68g-1 formed under a TRX gate 73g-1. The PD region 67g-1 and the charge holding region 68g-1 are disposed at positions shifted by a half pitch.

By disposing the charge holding region 68g-1 at a position shifted by a half pitch with respect to the PD region 67g-1, a TRG gate 124g-1 can be disposed in a central portion of the charge holding region 68g-1 (TRX gate 73g-1). The TRG gate 124g-1 disposed in a central portion of the charge holding region 68b-1 makes it possible to shorten a transfer length in the charge holding region 68b-1 and to improve transfer efficiency.

Figure 15:
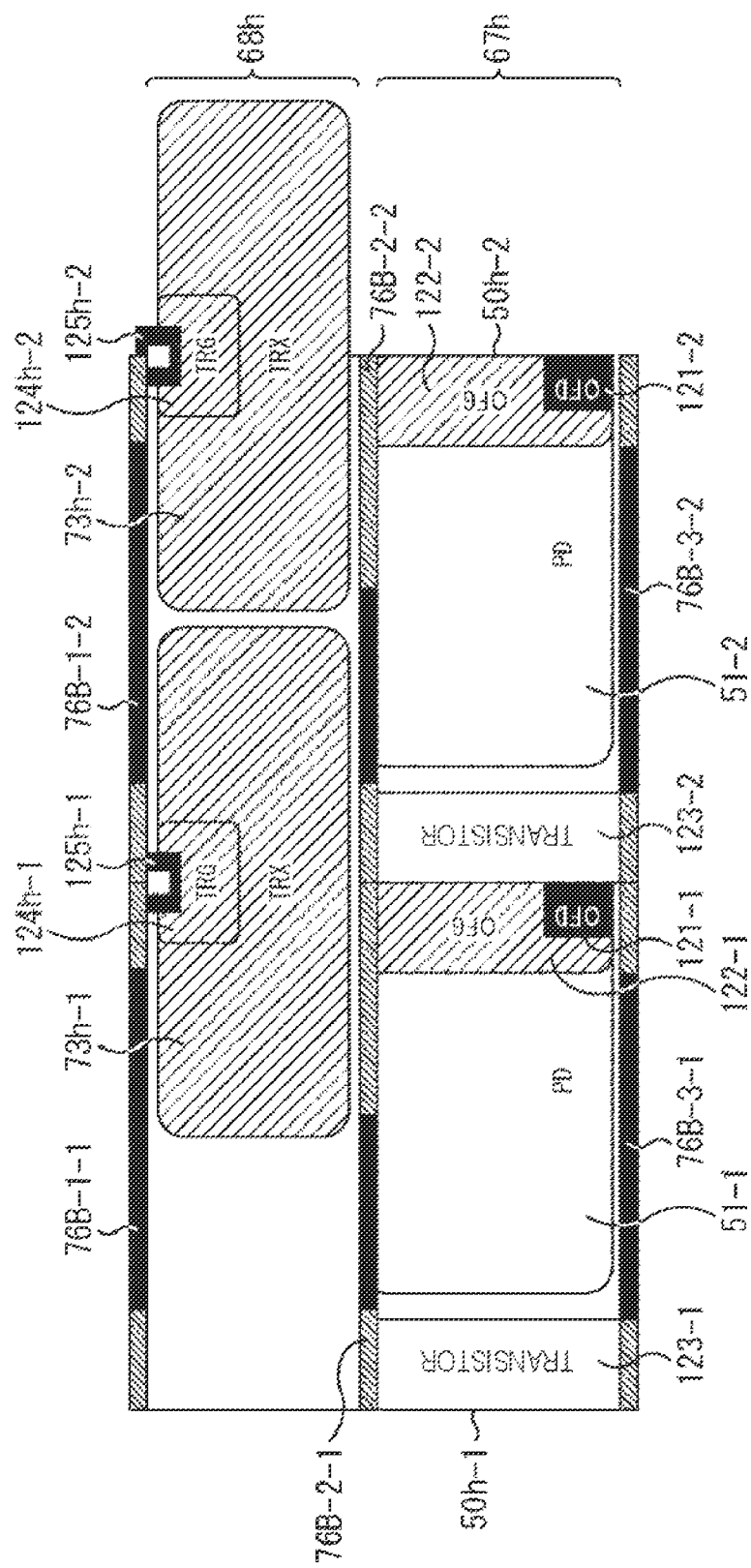
FIG. 15 is a plan view showing another configuration of the pixel.

FIG. 15 is a plan view showing another configuration of the pixel 50. On comparison, a pixel 50h shown in FIG. 15 differs from the pixel 50g shown in FIG. 14 in that a light shielding part 76B-4-1 (light shielding part 76B-4-2) and a light shielding part 76B-5-1 (light shielding part 76B-5-2) formed between the PDs 51 have been deleted, and other parts are the same.

The configuration in which the light shielding parts 76B-4 and 76B-5 formed between the PDs 51 have been deleted is similar to the pixel 50e shown in FIG. 12, and the PD region 67g and the charge holding region 68g of the pixel 50e are disposed at positions shifted by a half pitch, resulting in the pixel 50h of the configuration shown in FIG. 15.

As in the pixel 50e shown in FIG. 12, in the pixel 50h shown in FIG. 15 as well, the light shielding part 76B-4 and the light shielding part 76B-5 formed between the PDs 51 (FIG. 14) are effective in suppressing color mixture between the PDs 51, but in terms of preventing light leakage from the PD 51 to a charge holding part 54h and light leakage from the wiring layer 61, the light shielding part 76B-4 and the light shielding part 76B-5 may be deleted. The light shielding part 76B-4 and the light shielding part 76B-5 formed between the PDs 51 can be formed as needed.

Figure 16:
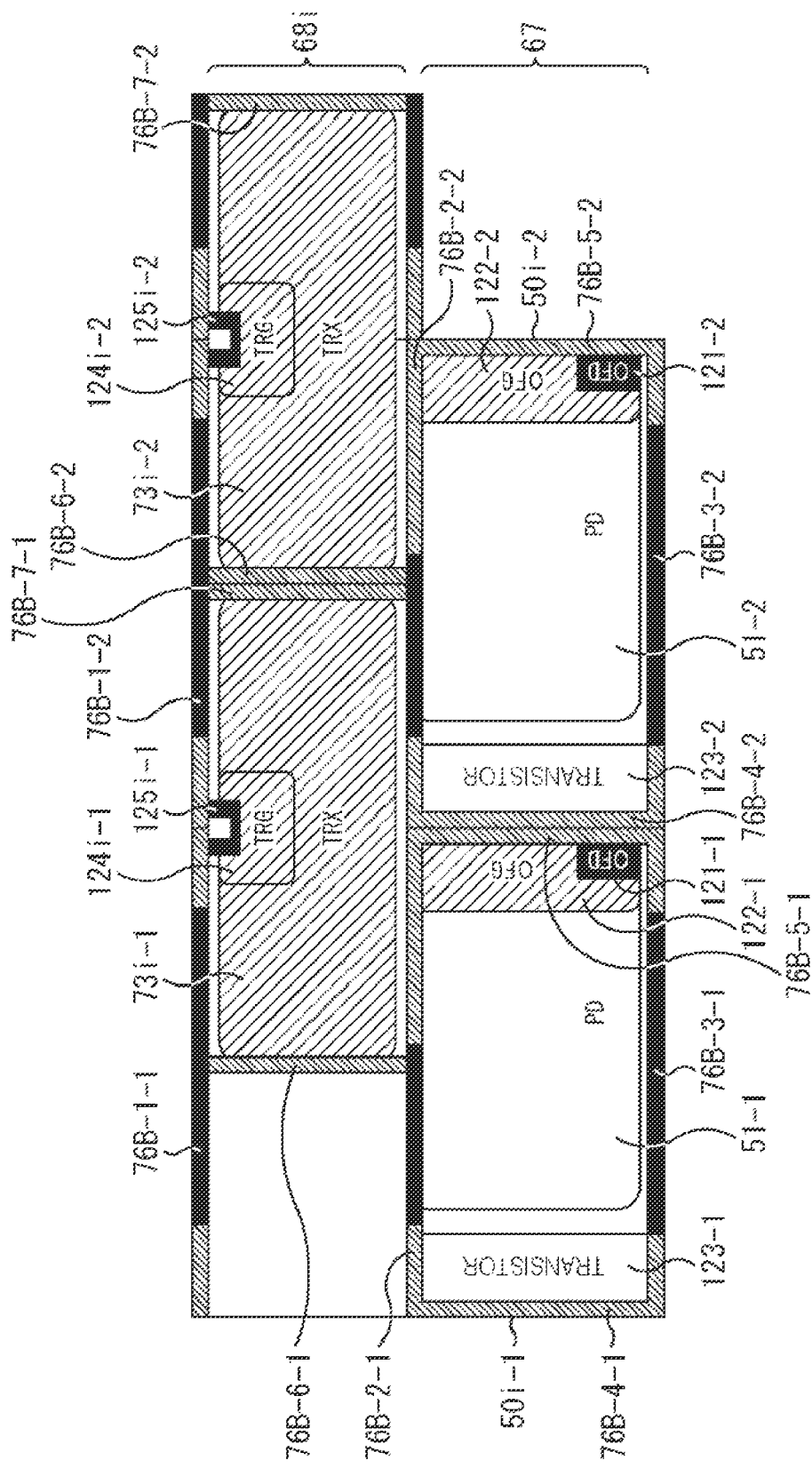
FIG. 16 is a plan view showing another configuration of the pixel.

FIG. 16 is a plan view showing another configuration of the pixel 50. On comparison, a pixel 50i shown in FIG. 16 differs from the pixel 50g shown in FIG. 14 in that a light shielding part 76B-6-1 (light shielding part 76B-6-2) and a light shielding part 76B-7-1 (light shielding part 76B-7-2) are formed between the charge holding regions 68i, and other parts are the same.

The configuration in which the light shielding part 76B-6-1 (light shielding part 76B-6-2) and the light shielding part 76B-7-1 (light shielding part 76B-7-2) are added between the charge holding regions 68i is similar to the pixel 50f shown in FIG. 13, and the charge holding region 68f is disposed at a position shifted by a half pitch with respect to the PD region 67f of the pixel 50f, resulting in the pixel 50i of the configuration shown in FIG. 16.

As in the pixel 50f shown in FIG. 13, in the pixel 50i shown in FIG. 16 as well, providing the light shielding part 76 also between the charge holding regions 68i makes it possible to prevent light leaking from the one charge holding region 68i to the other charge holding region 68i, and to suppress PLS more.

Figure 17:
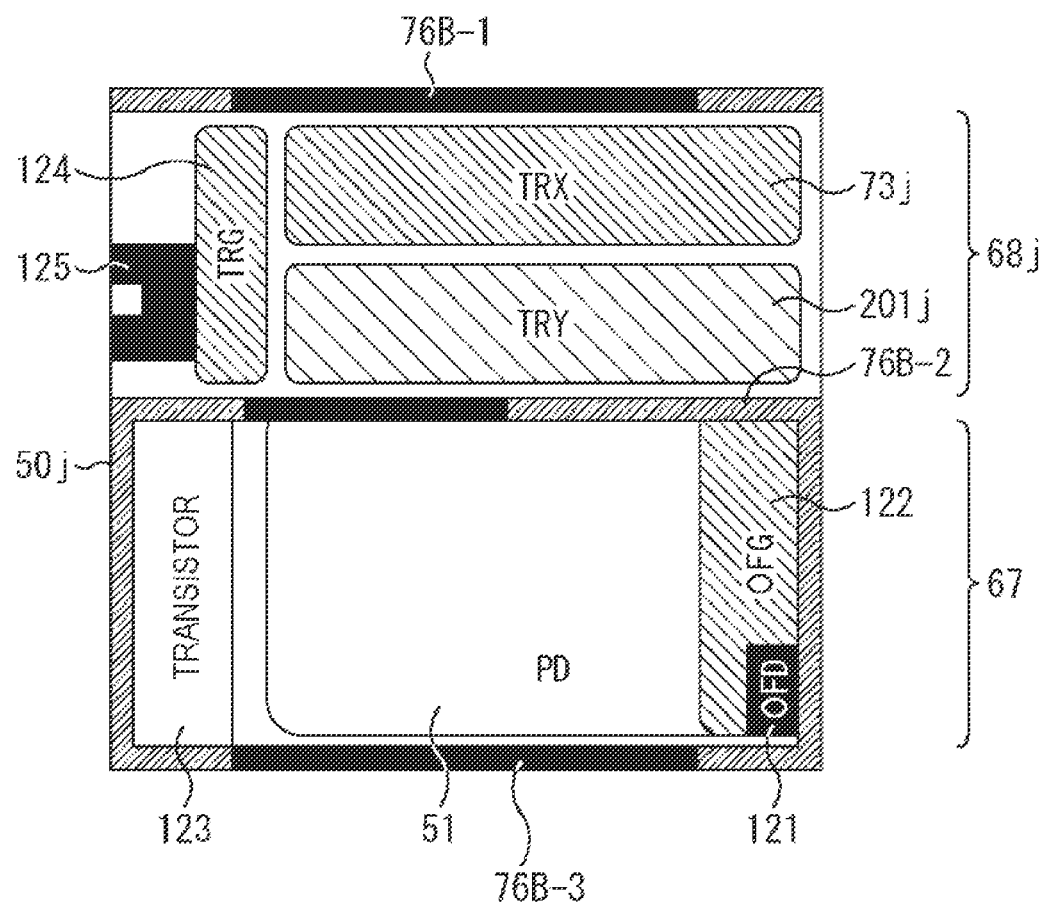
FIG. 17 is a plan view showing another configuration of the pixel.

FIG. 17 is a plan view showing another configuration of the pixel 50. A pixel 50j shown in FIG. 17 differs from the pixel 50b shown in FIG. 5 in that a TRY gate 201j has been added, and other configurations are similar.

The TRY gate 201j of the unit pixel 50j shown in FIG. 17 functions as a gate that prevents a charge from flowing back from a charge holding region 68j to the PD region 67, and is provided between the PD region 67 and the TRX gate 73j as shown in FIG. 17.

The TRY gate 201j is provided, the TRY gate 201j is turned on when transferring a charge from the PD 51 to a charge holding part 54j, and thereafter turned off such that the charge does not flow back to the PD 51, thereby preventing the charge from flowing back to the PD 51.

Furthermore, the TRY gate 201j has a memory function of accumulating a charge. The memory function of the TRY gate 201j may be provided in the charge holding region 68j, or may be provided separately from the charge holding region 68j.

In the pixel 50j having such a configuration, the TRY gate 201j functions as a gate when transferring a charge from the PD 51 to the charge holding part 54j, and also functions as a gate for preventing a charge from flowing back from the charge holding part 54j to the PD 51.

Furthermore, the TRX gate 201j functions as a gate when transferring a charge from the PD 51j to the charge holding part 54j, and also functions as a gate for causing the charge holding part 54j to hold a charge.

Figure 18:
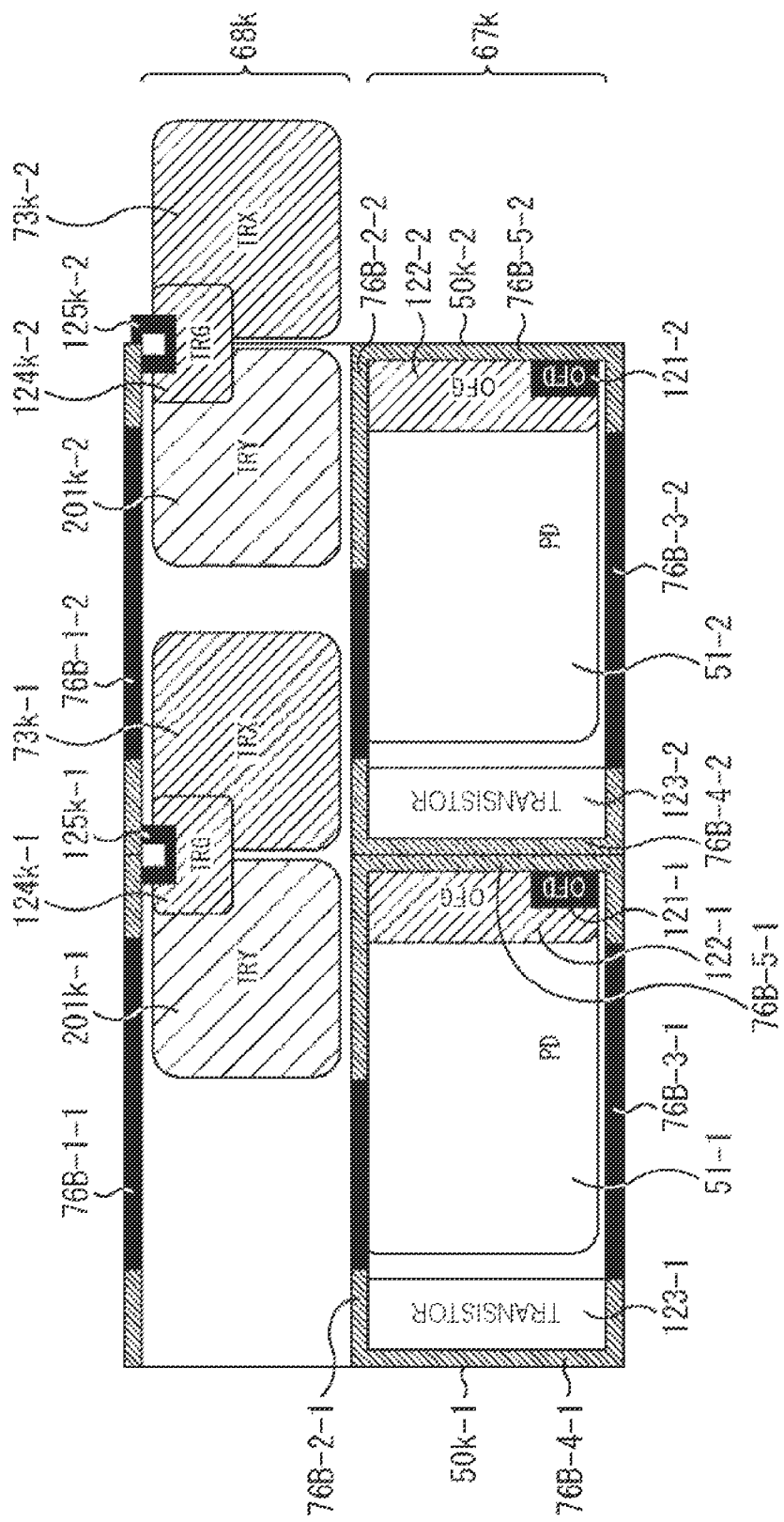
FIG. 18 is a plan view showing another configuration of the pixel.

FIG. 18 is a plan view showing another configuration of the pixel 50. A pixel 50k shown in FIG. 18 includes a TRY gate 201k, as in the pixel 50j shown in FIG. 17, and has a configuration in which the charge holding region 68k is shifted by a half pitch with respect to a PD region 67k as in the pixel 50g shown in FIG. 14.

In the pixel 50k shown in FIG. 18, a TRY gate 201k-1 is disposed in an upper right portion of a PD 51-1, and a TRX gate 73k-1 is disposed on a right side of the TRY gate 201k-1. In a case of this disposition, the TRX gate 73k-1 of a pixel 50k-1 is positioned in an upper left portion of a pixel 50k-2 positioned on a right side of the pixel 50k-1.

Thus, it is possible to have a configuration in which the TRX gate 73k-1 is positioned on the adjacent pixels 50k. In a case of such disposition, a charge from a PD 51k-1 is transferred to the TRX gate 73k-1 disposed on a left side of the TRY gate 201k-1 through the TRY gate 201k-1 disposed in an upper right portion.

Figure 19:
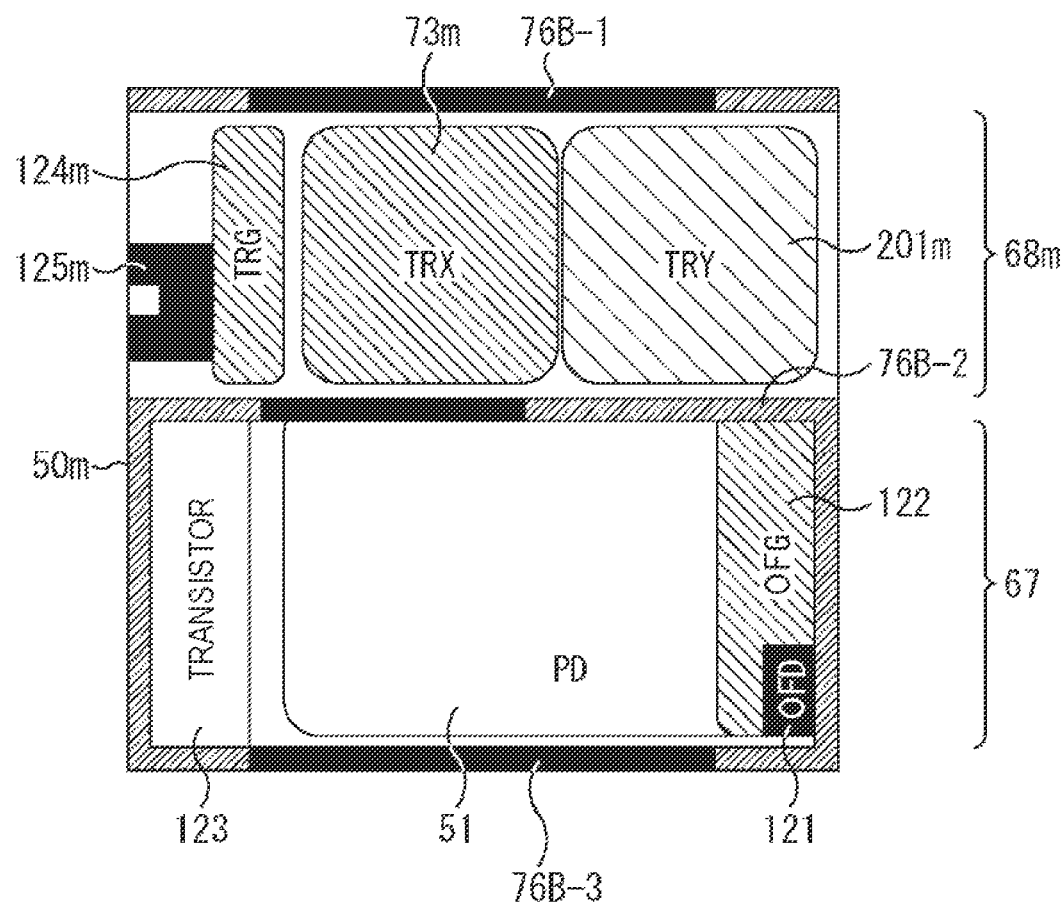
FIG. 19 is a plan view showing another configuration of the pixel.

FIG. 19 is a plan view showing another configuration of the pixel 50. A pixel 50m shown in FIG. 19 includes a TRY gate 201m as in the pixel 50j shown in FIG. 17, but disposition thereof is different.

In the pixel 50m shown in FIG. 19, the TRY gate 201m, a TRX gate 73m, and a TRG gate 124m are disposed in a lateral direction sequentially from the right. Furthermore, in an example shown in FIG. 19, the TRY gate 201m, the TRX gate 73m, and the TRG gate 124m are disposed at positions away from each other. Thus, respective gates may be disposed at positions away in the lateral direction.

Figure 20:
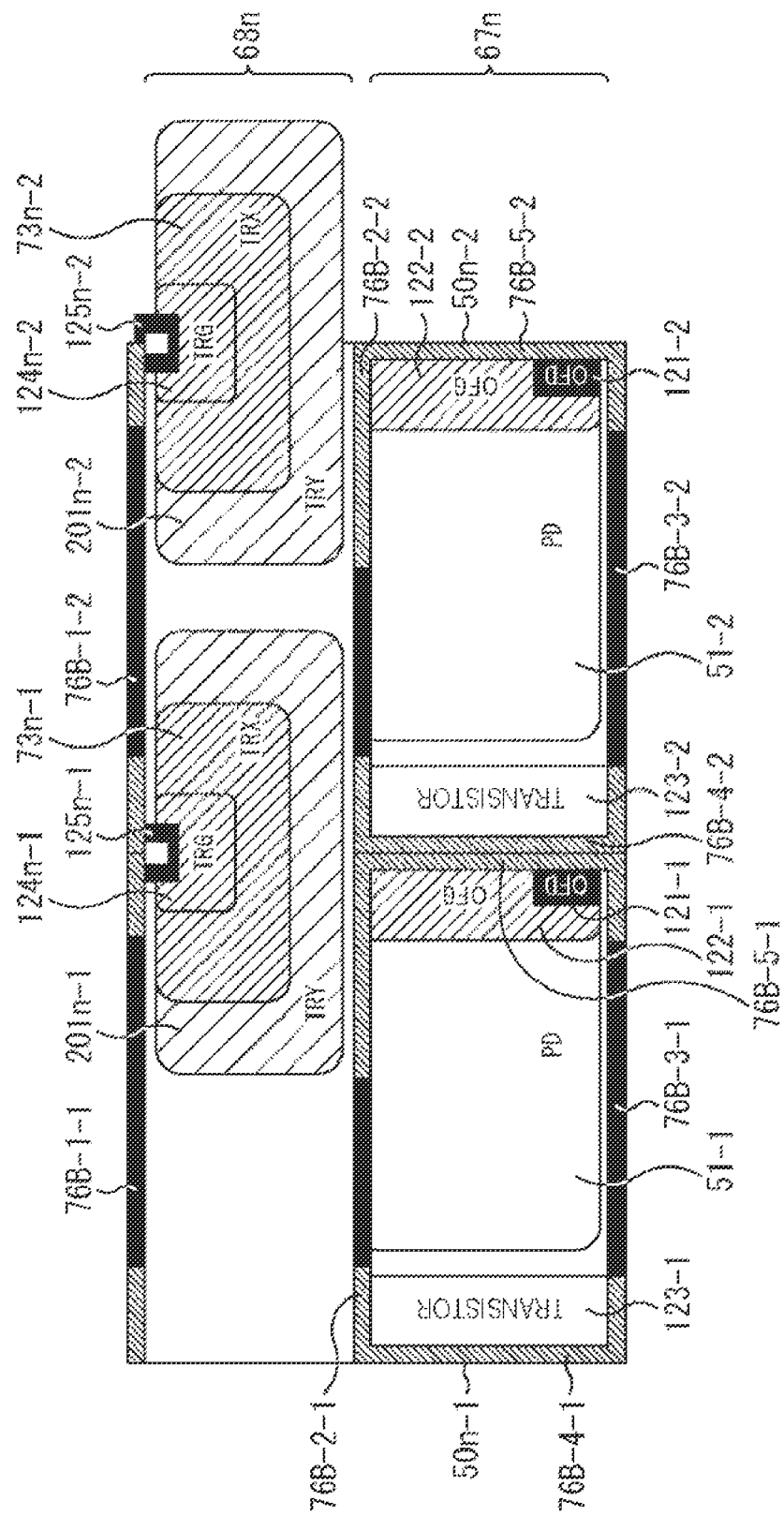
FIG. 20 is a plan view showing another configuration of the pixel.

FIG. 20 is a plan view showing another configuration of the pixel 50. A pixel 50*n* shown in FIG. 20 includes a TRY gate 201*n* as in the pixel 50*m* shown in FIG. 19, and has a configuration in which a charge holding region 68*n* is shifted by a half pitch with respect to a PD region 67*n* as in the pixel 50*g* shown in FIG. 14.

In the pixel 50*n* shown in FIG. 20, a TRY gate 201*n*-1 is disposed in an upper right portion of the PD 51-1, and a TRX gate 73*n*-1 is disposed in the middle of the TRY gate 201*n*-1. Furthermore, a TRG gate 124*n*-1 is disposed at an upper center of the TRX gate 73*n*-1, and an FD 125*n*-1 is disposed in a central portion of the TRG gate 124*n*-1.

Thus, the pixel 50 can also include the TRY gate 201.

Meanwhile, as described above, the non-penetrating light shielding part, for example, with reference to FIG. 7 again, the light shielding part 76B-2 from the position P4 to the position P6 is formed as a non-penetrating light shielding part, but since P-type ion implantation is required to ensure holes in this non-penetrating light shielding part, there is a possibility that transfer efficiency from the PD 51 to the charge holding part 54 is reduced. Therefore, the following describes a layout in which reading from the PD 51 is devised.

FIG. 21 to FIG. 26 are plan views of the pixel 50 having a layout in which reading from the PD 51 is devised. The pixel 50 shown in each of FIG. 21 to FIG. 26 is formed in a manner in which a gate positioned in a non-penetrating light shielding part projects to the PD 51 side.

Figure 21:
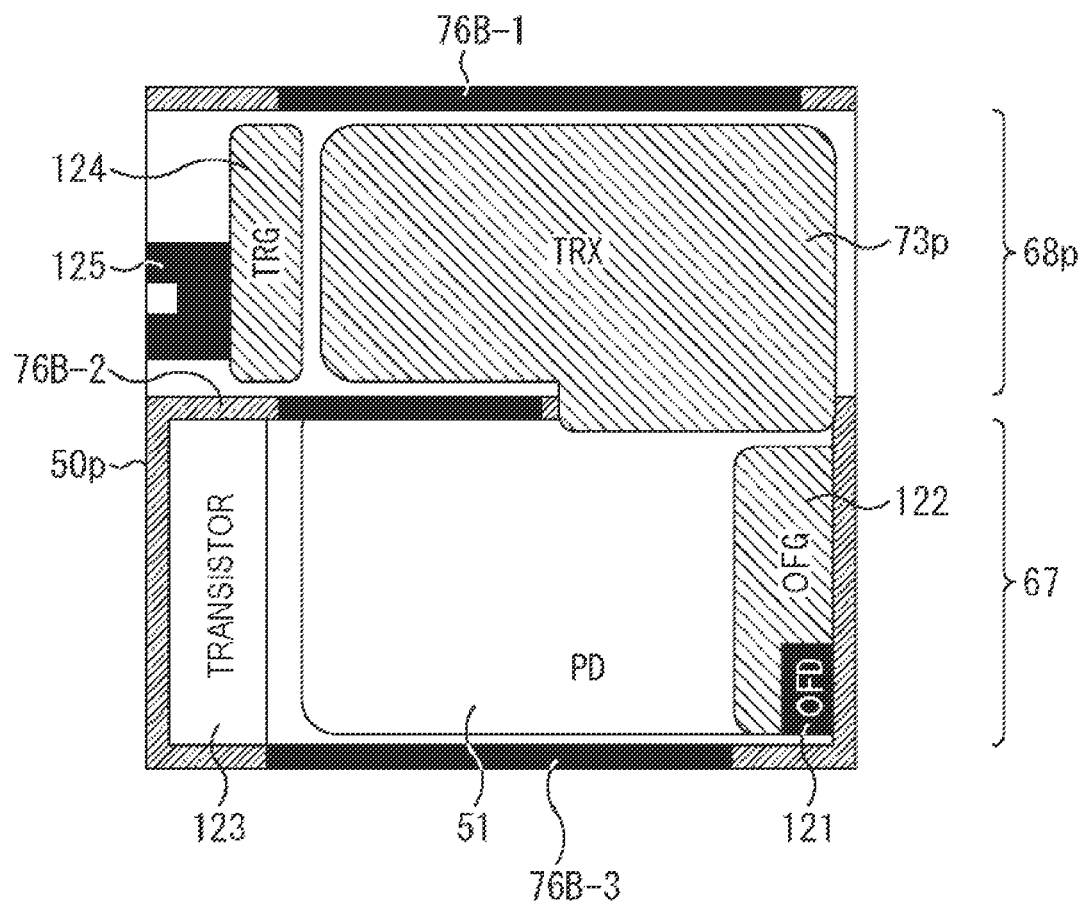
FIG. 21 is a plan view showing another configuration of the pixel.

FIG. 21 is a plan view showing another configuration of the pixel 50. A pixel 50*p* shown in FIG. 21 has the same configuration as the pixel 50*b* shown in FIG. 5, but differs in that a TRX gate 73*p* projects into the PD 51. In other words, in the pixel 50*p* shown in FIG. 21, in a region of the light shielding part 76B-2 formed in a non-penetrating manner, the TRX gate 73*p* is formed in a shape projecting to the PD 51 side.

Thus, a cross section of the pixel 50*p* when the TRX gate 73*p* is formed in a shape projecting to the PD 51 side is as shown in FIG. 4. With reference to FIG. 4 again, the TRX gate 73*b* is formed on a lower side of the PD 51 as well.

Thus, in addition to covering the charge holding region 68, the TRX gate 73 may be formed in a shape to extend to the PD region 67 side. Furthermore, a part to extend may be a part where the light shielding part 76 is non-penetrating, in other words, the aperture opened for transfer of the charge holding part 54 from the PD 51.

Figure 22:
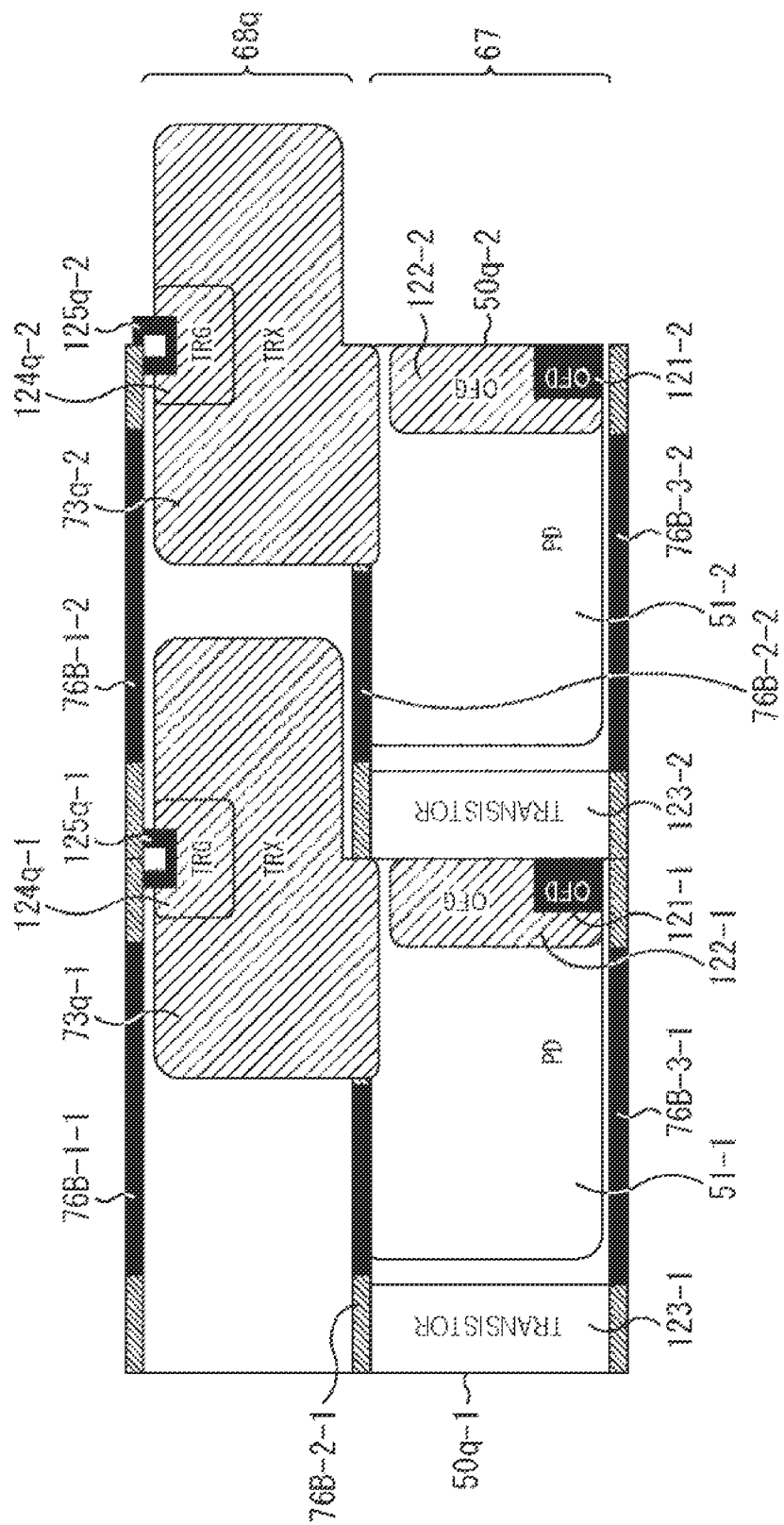
FIG. 22 is a plan view showing another configuration of the pixel.

FIG. 22 is a plan view showing another configuration of the pixel 50. A pixel 50*q* shown in FIG. 22 has the same configuration as the pixel 50*h* shown in FIG. 15, but differs in that a TRX gate 73*q* projects into the PD 51. The TRX gate 73*q* is formed in a shape projecting into the PD 51 in the same manner as the pixel 50*p* shown in FIG. 21, and in a region of the light shielding part 76B-2 formed in a non-penetrating manner, the TRX gate 73*q* is formed in a shape projecting to the PD 51 side.

Figure 23:
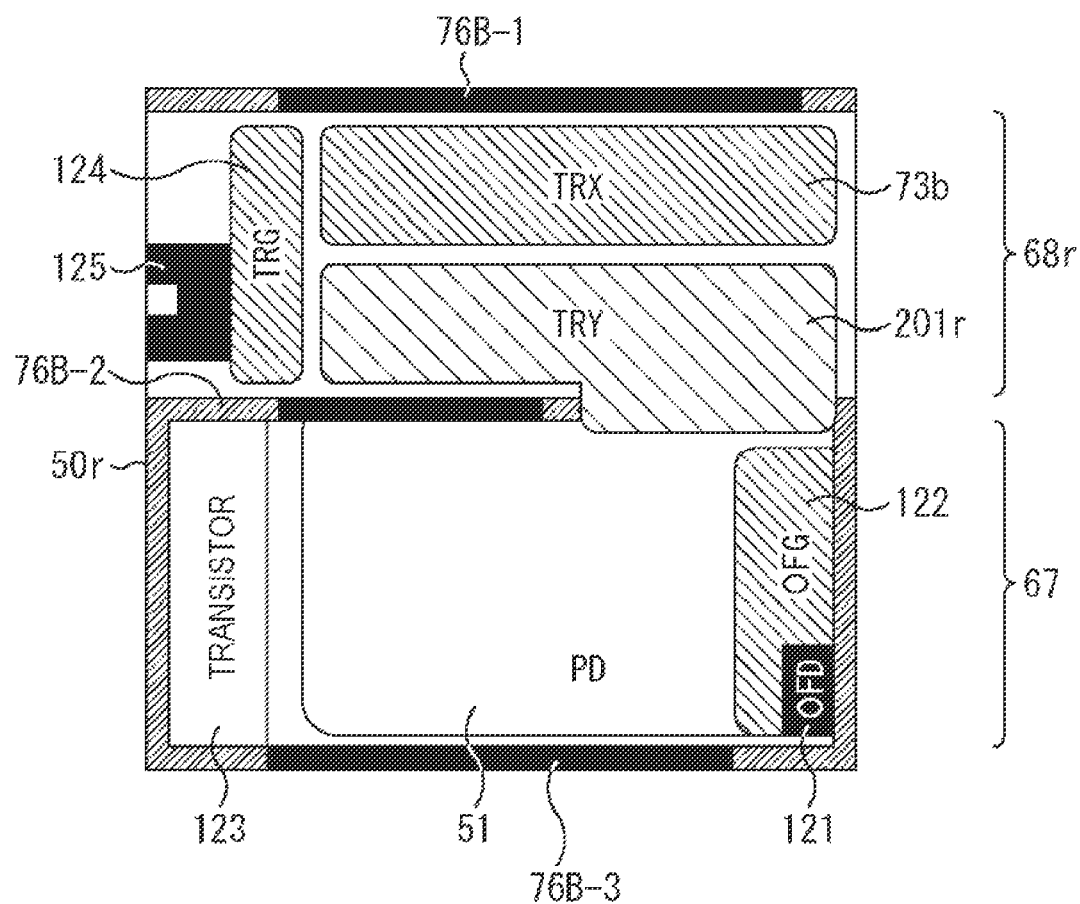
FIG. 23 is a plan view showing another configuration of the pixel.

FIG. 23 is a plan view showing another configuration of the pixel 50. A pixel 50*r* shown in FIG. 23 has the same configuration as the pixel 50*j* shown in FIG. 17 and includes a TRY gate 201*r*, but differs in that the TRY gate 201*r* projects into the PD 51. The TRY gate 201*r* is formed in a shape projecting into the PD 51 in the same manner as the pixel 50*p* shown in FIG. 21, and in a region of the light shielding part 76B-2 formed in a non-penetrating manner, instead of the TRX gate 73*p* (FIG. 21), the TRY gate 201*r* is formed in a shape projecting to the PD 51 side.

Note that also in a case of the configuration of the pixel 50*r* shown in FIG. 23, a cross-sectional view shows a configuration like the pixel 50*b* shown in FIG. 4, and in this configuration, a portion of the TRX gate 73*b* is the TRY gate 201*r*, and the TRY gate 201*r* is formed to the lower side of the PD 51. Thus, in addition to covering the charge holding region 68, the TRY gate 201 may be formed in a shape to extend to the PD region 67 side. Furthermore, a part to extend may be a part where the light shielding part 76 is non-penetrating, in other words, the aperture opened for transfer of the charge holding part 54 from the PD 51.

Figure 24:
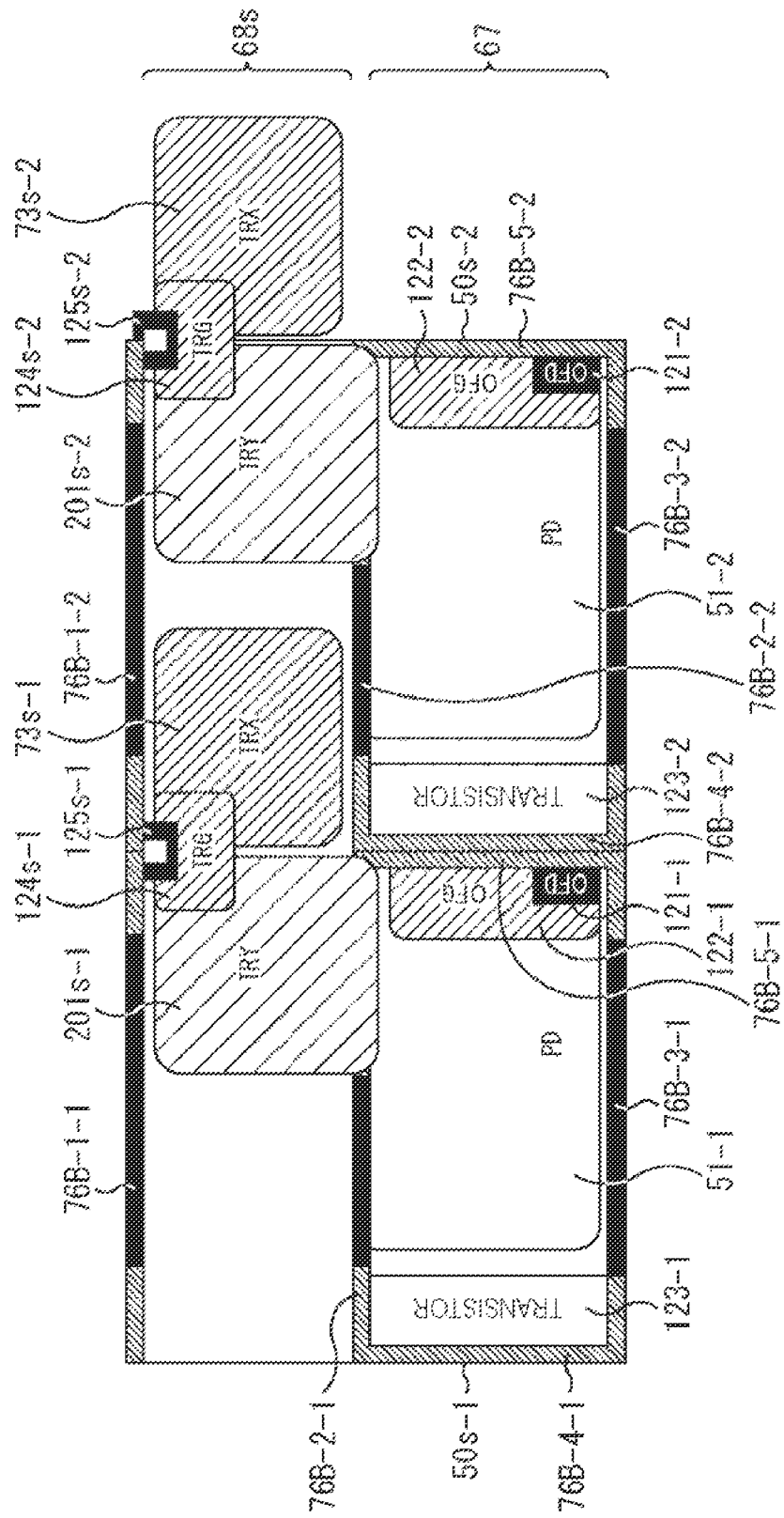
FIG. 24 is a plan view showing another configuration of the pixel.

FIG. 24 is a plan view showing another configuration of the pixel 50. A pixel 50*s* shown in FIG. 24 has the same configuration as the pixel 50*k* shown in FIG. 18 and includes a TRY gate 201*s*, but differs in that the TRY gate 201*s* projects into the PD 51. The TRY gate 201*s* is formed in a shape projecting into the PD 51 in the same manner as the pixel 50*r* shown in FIG. 23, and in a region of the light shielding part 76B-2 formed in a non-penetrating manner, the TRY gate 201*s* is formed in a shape projecting to the PD 51 side.

Figure 25:
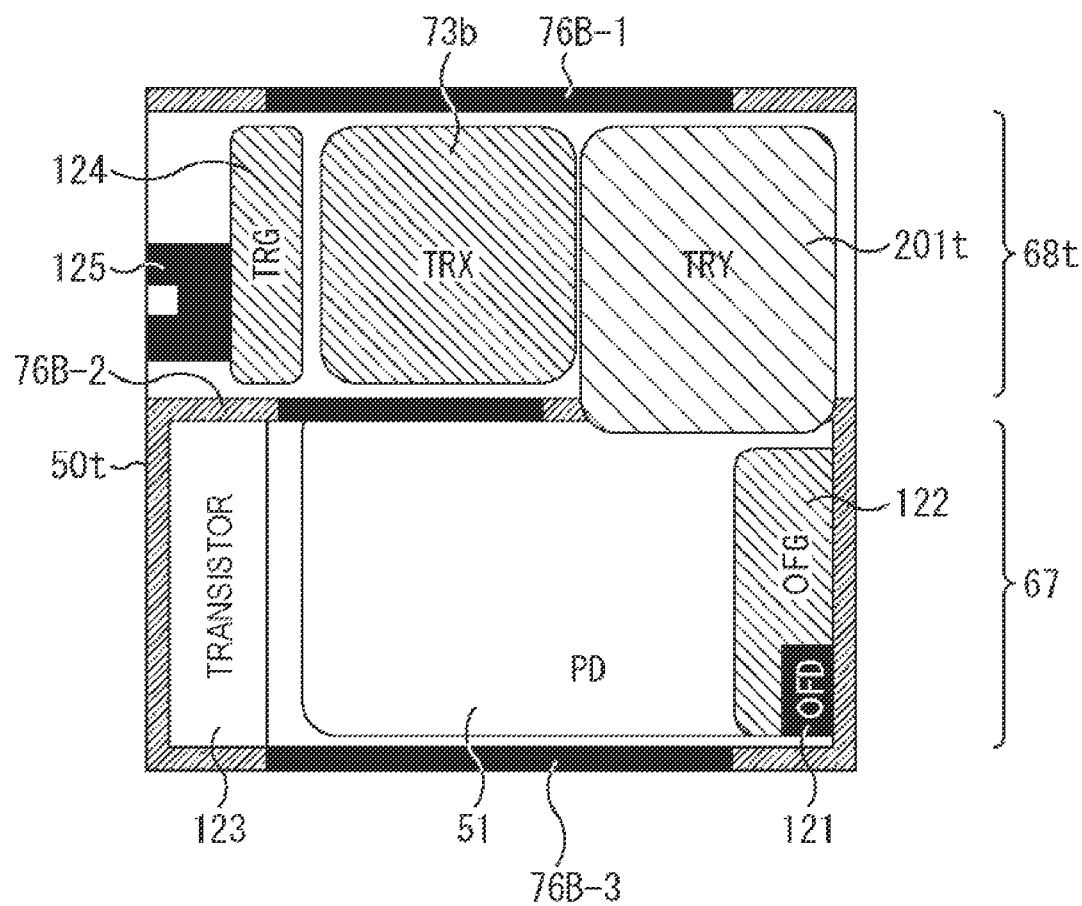
FIG. 25 is a plan view showing another configuration of the pixel.

FIG. 25 is a plan view showing another configuration of the pixel 50. A pixel 50*t* shown in FIG. 25 has the same configuration as the pixel 50*m* shown in FIG. 19 and includes a TRY gate 201*t*, but differs in that the TRY gate 201*t* projects into the PD 51. The TRY gate 201*t* is formed in a shape projecting into the PD 51 in the same manner as the pixel 50*r* shown in FIG. 23, and in a region of the light shielding part 76B-2 formed in a non-penetrating manner, the TRY gate 201*t* is formed in a shape projecting to the PD 51 side.

Figure 26:
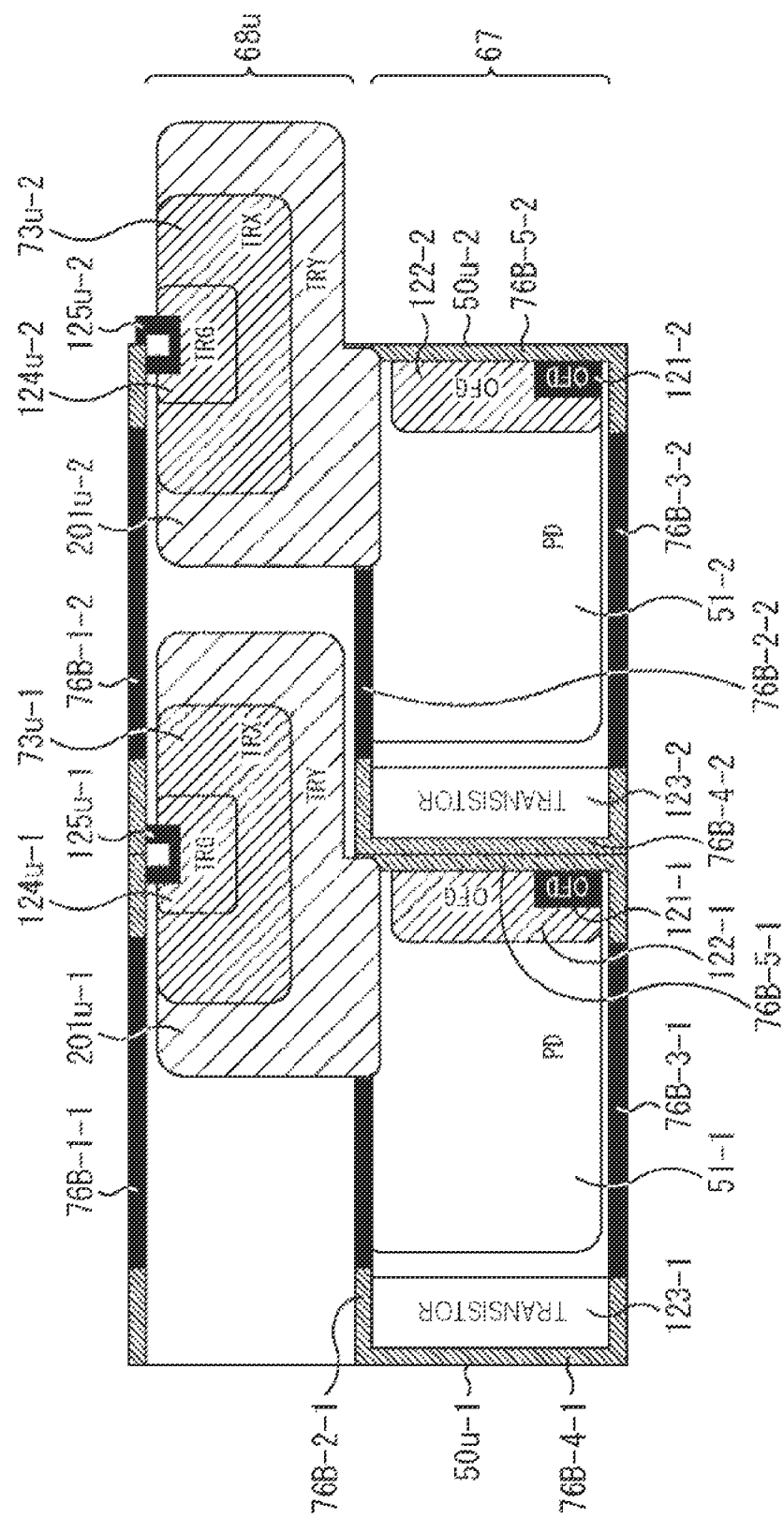
FIG. 26 is a plan view showing another configuration of the pixel.

FIG. 26 is a plan view showing another configuration of the pixel 50. A pixel 50*u* shown in FIG. 26 has the same configuration as the pixel 50*n* shown in FIG. 20 and includes a TRY gate 201*u*, but differs in that the TRY gate 201*u* projects into the PD 51. The TRY gate 201*u* is formed in a shape projecting into the PD 51 in the same manner as the pixel 50*s* shown in FIG. 24, and in a region of the light shielding part 76B-2 formed in a non-penetrating manner, the TRY gate 201*u* is formed in a shape projecting to the PD 51 side.

Thus, forming the gate to project into the PD region 67 makes it possible to prevent the transfer efficiency from the PD 51 to the charge holding part 54 from being lowered.

About Disposition of Transistor

Figure 27:
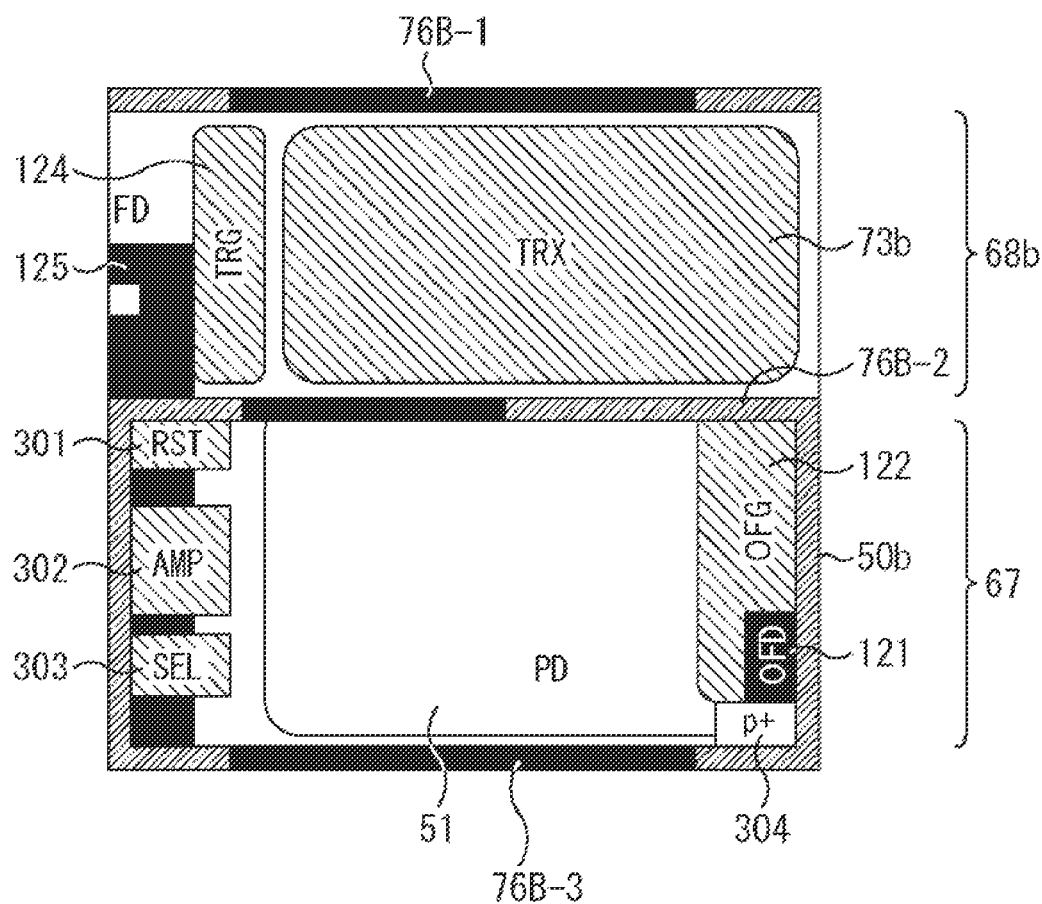
FIG. 27 is a plan view showing another configuration of the pixel.

Thus, in the pixel 50 to which the present technology is applied, in the light shielding part 76B-2 formed between the PD region 67 and the charge holding region 68, a part in which the transistor is disposed and a part for transferring a charge from a PD part 51 to the charge holding part 54 are formed as non-penetrating light shielding parts, and other parts are formed as penetrating light shielding parts. For example, as the transistor 123, which is formed as a non-penetrating light shielding part, transistors as shown in FIG. 27 are disposed as one example.

In a region of the transistor 123, a reset (RST) transistor 301, an amplification (AMP) transistor 302, and a selection (SEL) transistor 303 are disposed.

The reset transistor 301 is connected between a power source Vrst, not shown, and the FD 125, and resets the FD 125 by applying a drive signal RST to a gate electrode. The amplification transistor 302, in which a drain electrode is connected to a power source Vdd, not shown, and a gate electrode is connected to the FD 125 and reads a voltage of the FD 125.

The selection transistor 303, in which, for example, a drain electrode is connected to a source electrode of the amplification transistor 302 and a source electrode is connected to a vertical signal line, and a drive signal SEL is applied to a gate electrode to select the pixel 50 from which the pixel signal should be read. Note that it is possible to employ a configuration in which the selection transistor 303 is connected between the power source Vdd and the drain electrode of the amplification transistor 302.

Figure 28:
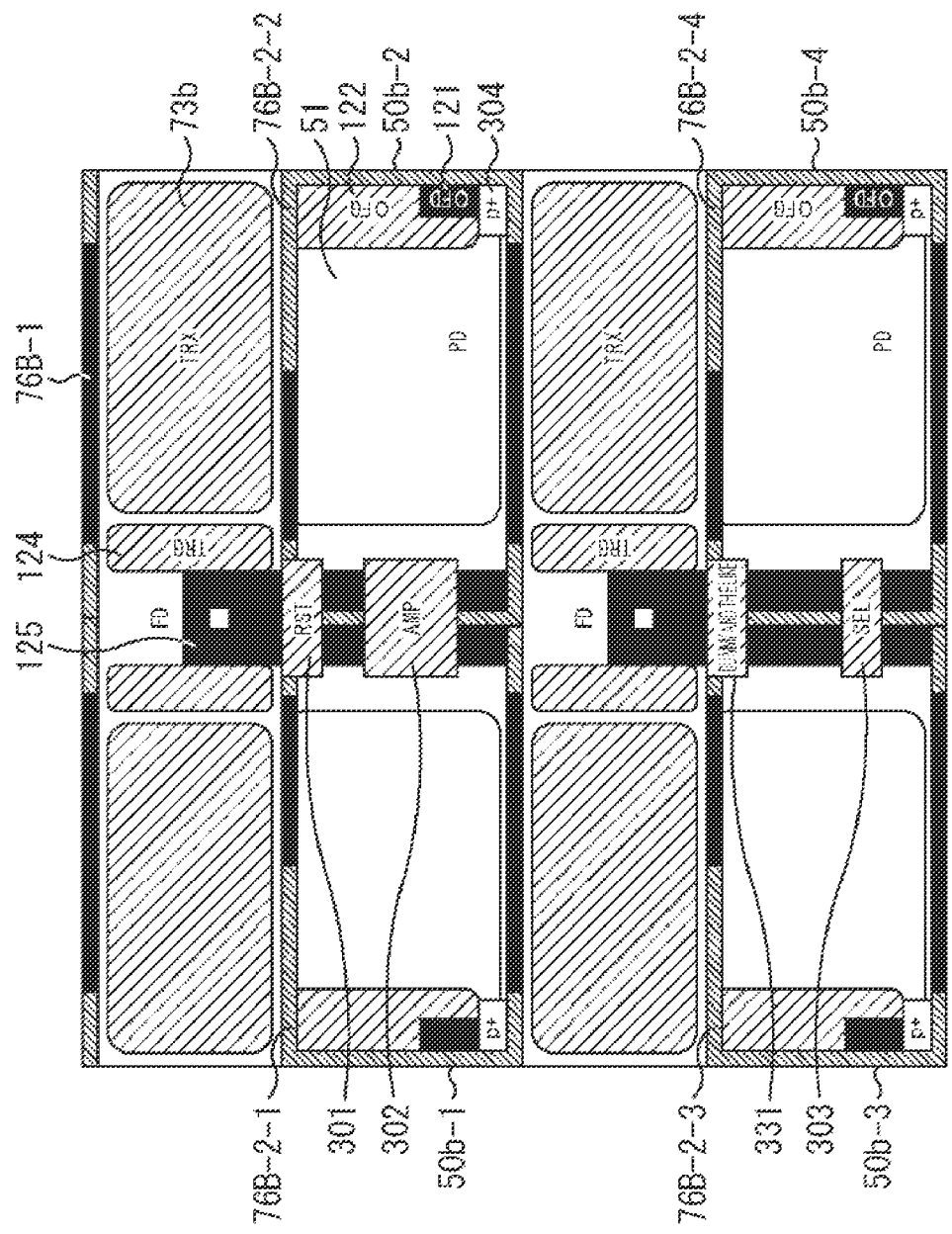
FIG. 28 is a plan view showing a sharing configuration of the pixels.

Furthermore, it is also possible to employ a configuration in which a plurality of pixels 50 shares the transistor 123. FIG. 28 shows a configuration in a case where the plurality of pixels 50 shares the transistor 123.

FIG. 28 shows a configuration in which four pixels of 2×2 share the transistor 123, and shows a case where the above-described reset transistor 301, the amplification transistor 302, and the selection transistor 303 are disposed as the transistor 123. Furthermore, an example shown in FIG. 28 shows a case where one pixel has the configuration of the pixel 50b shown in FIG. 5.

The reset transistor 301 is disposed across a part of the non-penetrating light shielding part of a light shielding part 76B-2-1 of a pixel 50b-1, and a part of the non-penetrating light shielding part of a light shielding part 76B-2-2 of a pixel 50b-2 between the pixel 50b-1 and the pixel 50b-2.

The amplification transistor 302 is disposed between the pixel 50b-1 and the pixel 50b-2. The selection transistor 303 is disposed between a pixel 50b-3 and a pixel 50b-4.

A dummy 331 may be disposed across a part of the non-penetrating light shielding part of a light shielding part 76B-2-3 of the pixel 50b-3, and a part of the non-penetrating light shielding part of a light shielding part 76B-2-4 of the pixel 50b-4 between the pixel 50b-3 and the pixel 50b-4. The dummy 331 is disposed when it is desired to ensure symmetry or the like. Furthermore, instead of the dummy 331, a transistor for switching conversion efficiency may be disposed.

Thus, an example shown in FIG. 28 has a configuration in which four pixels 50b share the reset transistor 301, the amplification transistor 302, and the selection transistor 303.

Thus, the configuration in which a plurality of pixels shares the transistor 123 can enlarge a region allocated to one transistor. Enlarging the region allocated to one transistor allows a configuration in which a distance between a source and a drain of the transistor can be extended, and a configuration in which a leak can be prevented.

Furthermore, as shown in FIG. 28, the reset transistor 301, the amplification transistor 302, and the selection transistor 303 can be each divided and disposed. Dividing (separating) and disposing these transistors make it possible, for example, to increase an L length of the amplification transistor 302, and to reduce random noise.

Furthermore, the configuration in which the plurality of pixels shares the transistor 123 allows miniaturization.

About Disposition Position of On-Chip Lens

Next, a disposition position of the on-chip lens 66 will be described.

Each of FIG. 29 to FIG. 36 is a diagram for describing the disposition position of the on-chip lens 66 and is a plan view of the pixel 50. In FIG. 29 to FIG. 36 (except FIG. 34), descriptions are provided taking the pixel 50b shown in FIG. 5 as an example, but the following descriptions can be applied to other pixels 50 as well.

Furthermore, in FIG. 29 to FIG. 36, for convenience of description, as in the case described above, the plan view as seen from a wiring layer 61 side is used, and the on-chip lens 66 is illustrated in the plan view, but the on-chip lens 66 is provided on an incident side.

Furthermore, with reference to the pixel 50b shown in FIG. 29, for example, as described with reference to FIG. 4, the lid part 76A of the light shielding part 76 is formed on the charge holding region 68b to shield incident light, and this light shielding part 76 (lid part 76A) is also provided on a side where the on-chip lens 66 is provided, but for convenience of description, a description is provided by illustration through superimposition on the plan view when viewed from the wiring layer 61 side.

Figure 29:
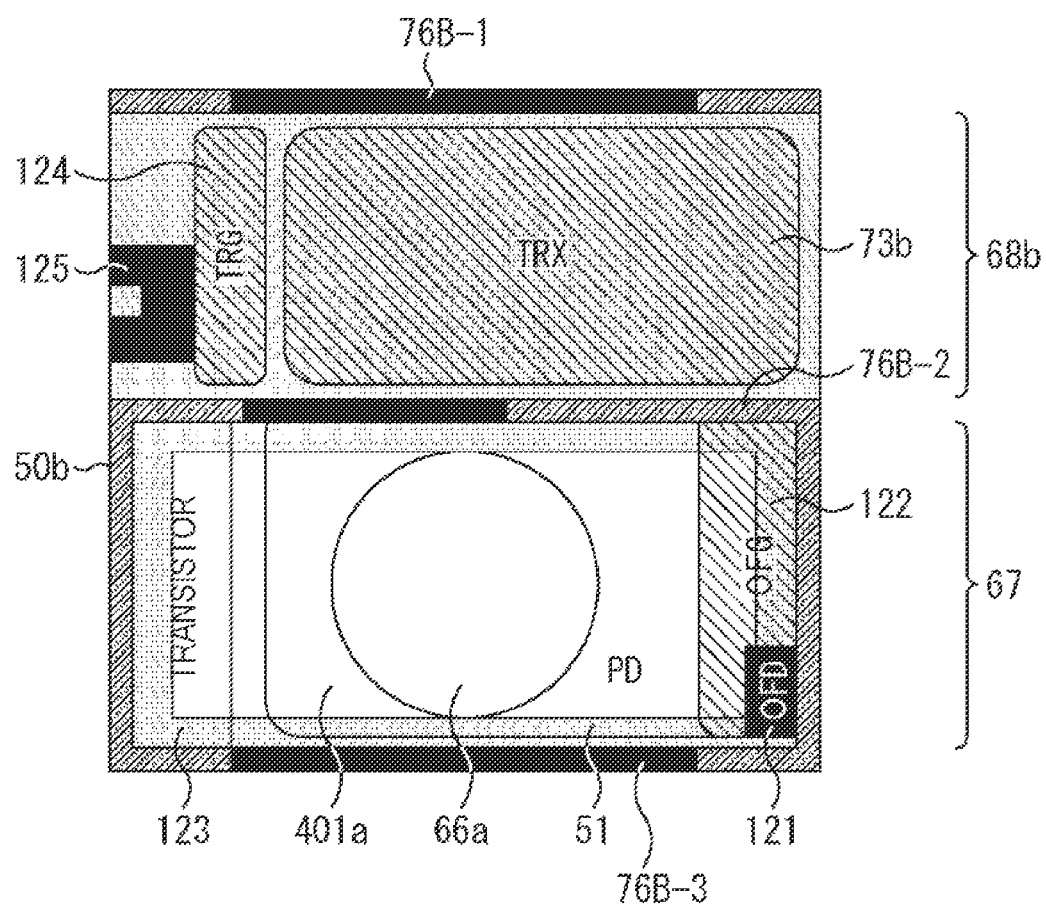
FIG. 29 is a diagram for describing disposition of an on-chip lens.

In the pixel 50b shown in FIG. 29, the on-chip lens 66 is disposed with a center of a concentrated light diameter positioned in a central portion of the PD region 67 (PD 51).

Note that in FIG. 29 to FIG. 36, although the on-chip lens 66 is represented as a circle, a size of the circle does not represent a size of the on-chip lens 66 but a size of the concentrated light diameter of the on-chip lens 66. Accordingly, for example, although the on-chip lens 66 shown as a circle in FIG. 29 is illustrated to fit in the PD region 67, the concentrated light diameter fits in the PD region 67, and the on-chip lens 66 itself is larger than the PD region 67.

For example, the charge holding region 68 that is shielded is disposed next to the PD region 67, and the on-chip lens 66 may be formed in the charge holding region 68 as well. In other words, the on-chip lens 66 itself can be formed large.

In the pixel 50b shown in FIG. 29, the PD region 67 is not shielded by the light shielding part 76 but is opened. This opened region is an opened region 401a. The opened region 401a corresponds to, for example, the aperture 76C of the pixel 50b shown in FIG. 4. The opened region 401a is formed with the largest region to ensure sensitivity. Then, the on-chip lens 66 is disposed such that a center of (the concentrated light diameter of) the on-chip lens 66a agrees with a center of the opened region 401a.

Figure 30:
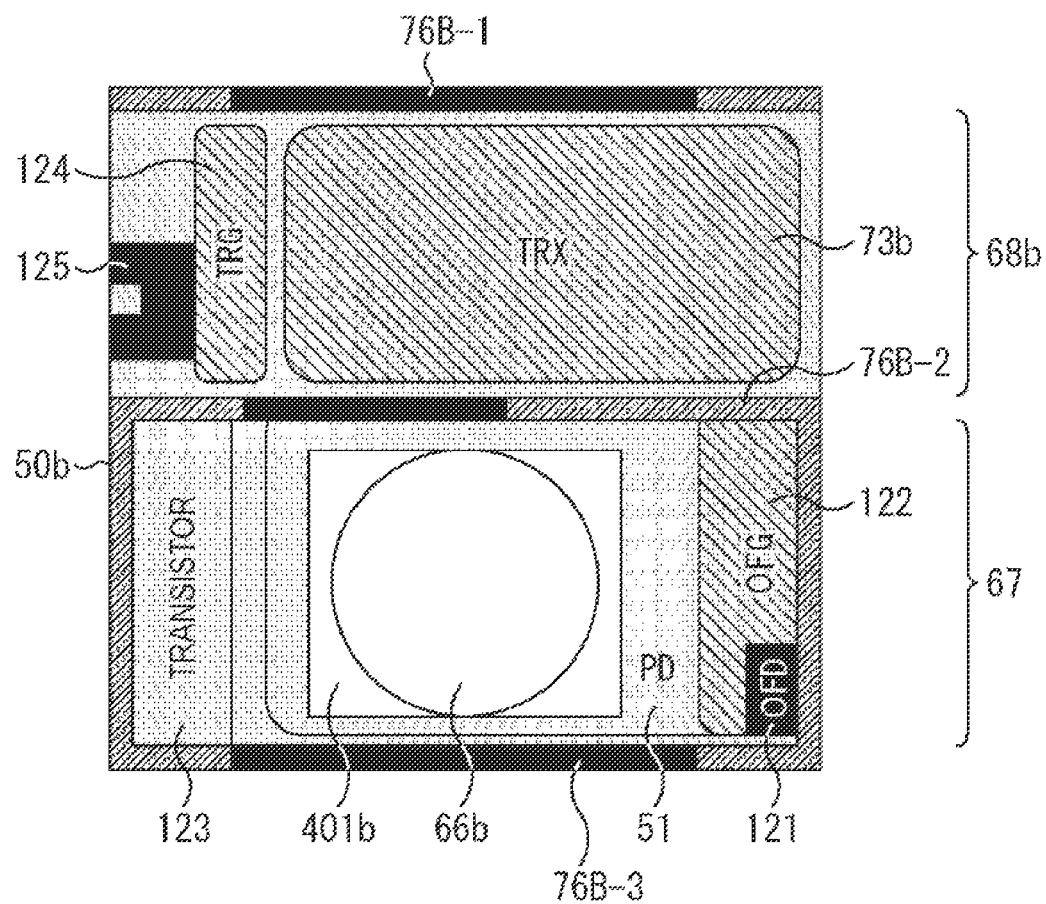
FIG. 30 is a diagram for describing the disposition of the on-chip lens.

In the pixel 50b shown in FIG. 30, the opened region 401a is small. In the pixel 50b shown in FIG. 30, the on-chip lens 66b is disposed such that the center of (the concentrated light diameter of) the on-chip lens 66b agrees with a center of the PD region 67, and only a region in which the concentrated light diameter of the on-chip lens 66b fits is an opened region 401b.

Thus, by narrowing the opened region 401b to a region where light can be concentrated by the on-chip lens 66b, it can be assumed that the F-number sensitivity is slightly reduced, but since a useless PLS component can be cut, an influence by the PLS component can be suppressed more.

Figure 31:
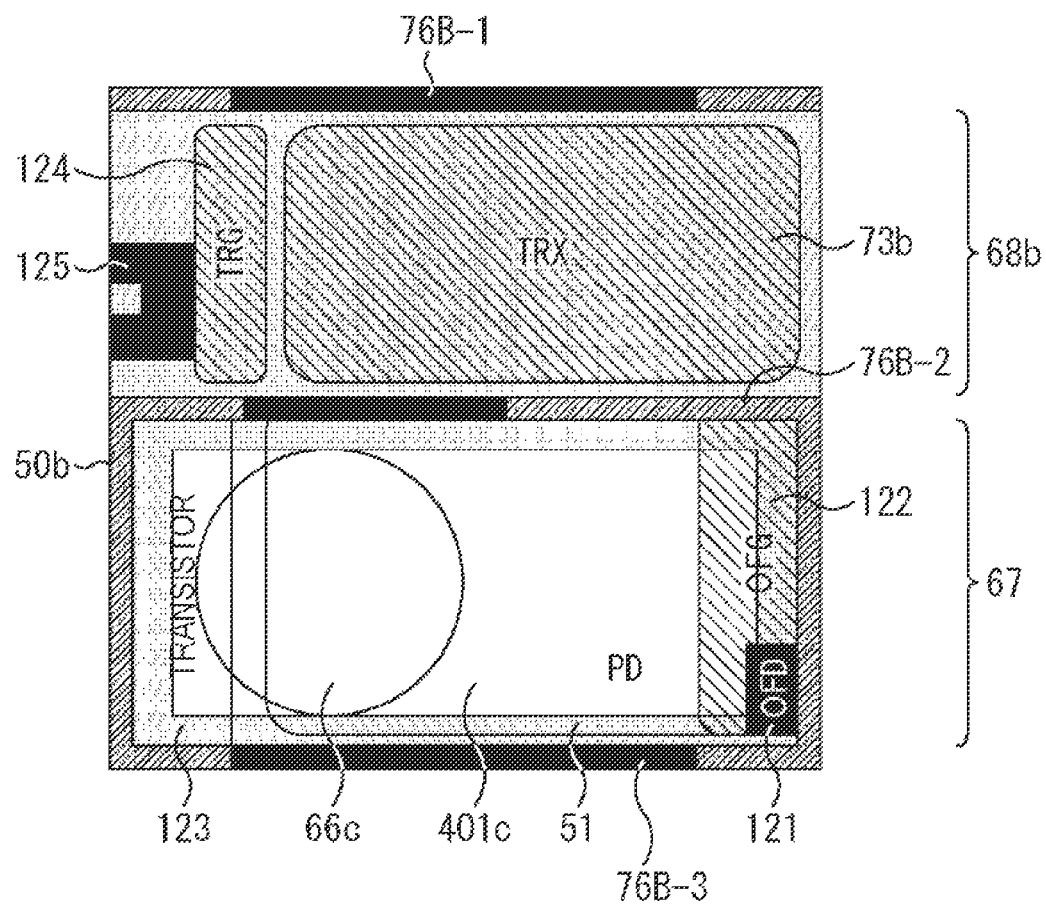
FIG. 31 is a diagram for describing the disposition of the on-chip lens.

FIG. 31 is a diagram for describing another disposition position of the on-chip lens 66. In the pixel 50b shown in FIG. 31, as in the pixel 50b shown in FIG. 29, an opened region 401c is formed with the largest region to ensure sensitivity. Then, the on-chip lens 66c is disposed such that the center of (the concentrated light diameter of) the on-chip lens 66c is positioned on a left side of the opened region 401c in the diagram.

The on-chip lens 66c is disposed at a position as far as possible from a transfer part that transfers a charge from the PD 51 to the charge holding part 54, in other words, the light shielding part 76B-2 formed in a non-penetrating manner to perform the transfer, the position where the concentrated light diameter of the on-chip lens 66c fits in the opened region 401c. Thus, PLS can be improved by disposing the on-chip lens 66c at a position away from the non-penetrating light shielding part (transfer part).

Figure 32:
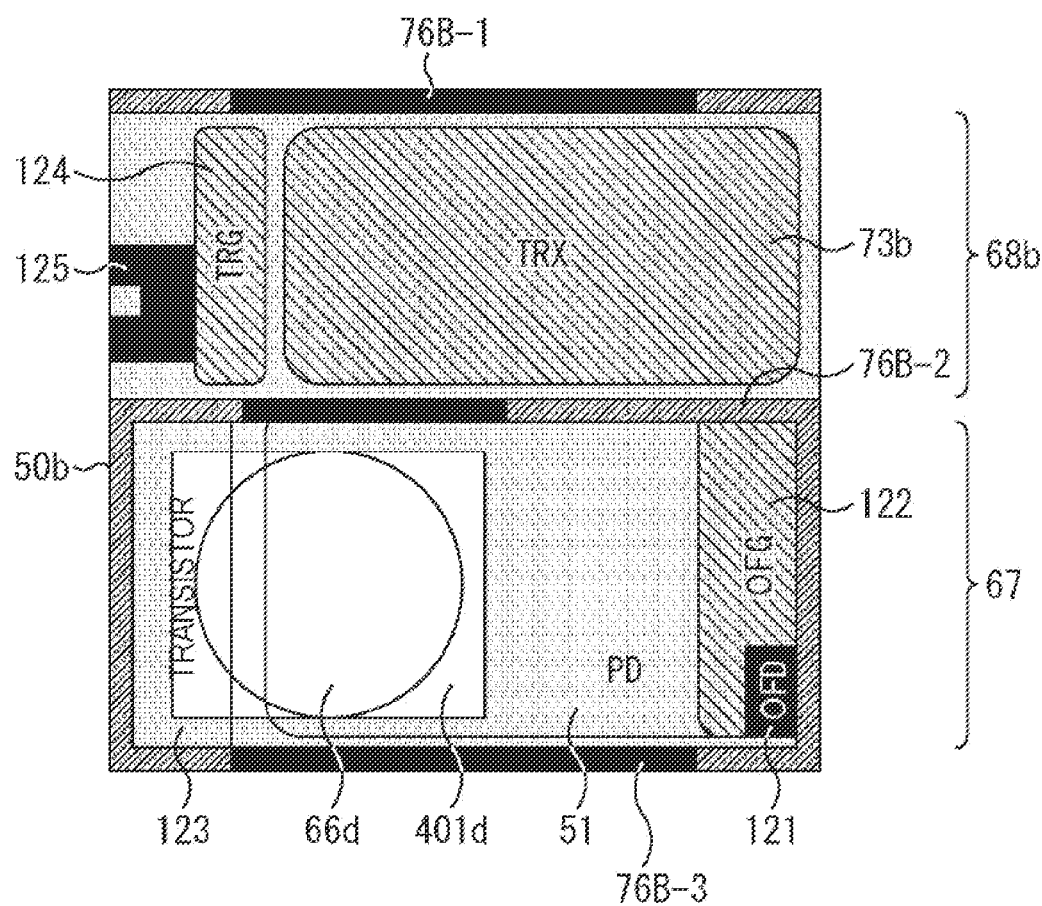
FIG. 32 is a diagram for describing the disposition of the on-chip lens.

In the pixel 50b shown in FIG. 32, the opened region 401c is small. In the pixel 50b shown in FIG. 32, the on-chip lens 66d is disposed such that the center of (the concentrated light diameter of) the on-chip lens 66d is away from the transfer part that transfers a charge from the PD 51 to the charge holding part 54, and only a region in which the concentrated light diameter of the on-chip lens 66*d* fits is an opened region 401*d*.

Thus, by narrowing the opened region 401*d* to a region where light can be concentrated by the on-chip lens 66*d*, it can be assumed that the F-number sensitivity is slightly reduced, but since a useless PLS component can be cut, the influence by the PLS component can be suppressed more.

For example, as in the pixel 50*b* shown in FIG. 29 and FIG. 30, in a case where the on-chip lens 66 is disposed in a central portion of the PD region 67, the pixels 50*b* can be arranged in an array while maintaining optical symmetry. However, as shown in FIG. 31 and FIG. 32, in a case where the on-chip lens 66 is disposed in a part shifted from the central portion of the PD region 67, optical symmetry is maintained in some arrangement and optical symmetry is not maintained in other arrangement.

Therefore, as shown in FIG. 32, the following describes, with reference to FIG. 33 to FIG. 36, a case where the on-chip lens 66 is disposed in a portion shifted from the central portion of the PD region 67, and the pixels 50*b* are arranged in an array with the opened region 401 narrowed to the concentrated light diameter of the on-chip lens 66.

Figure 33:
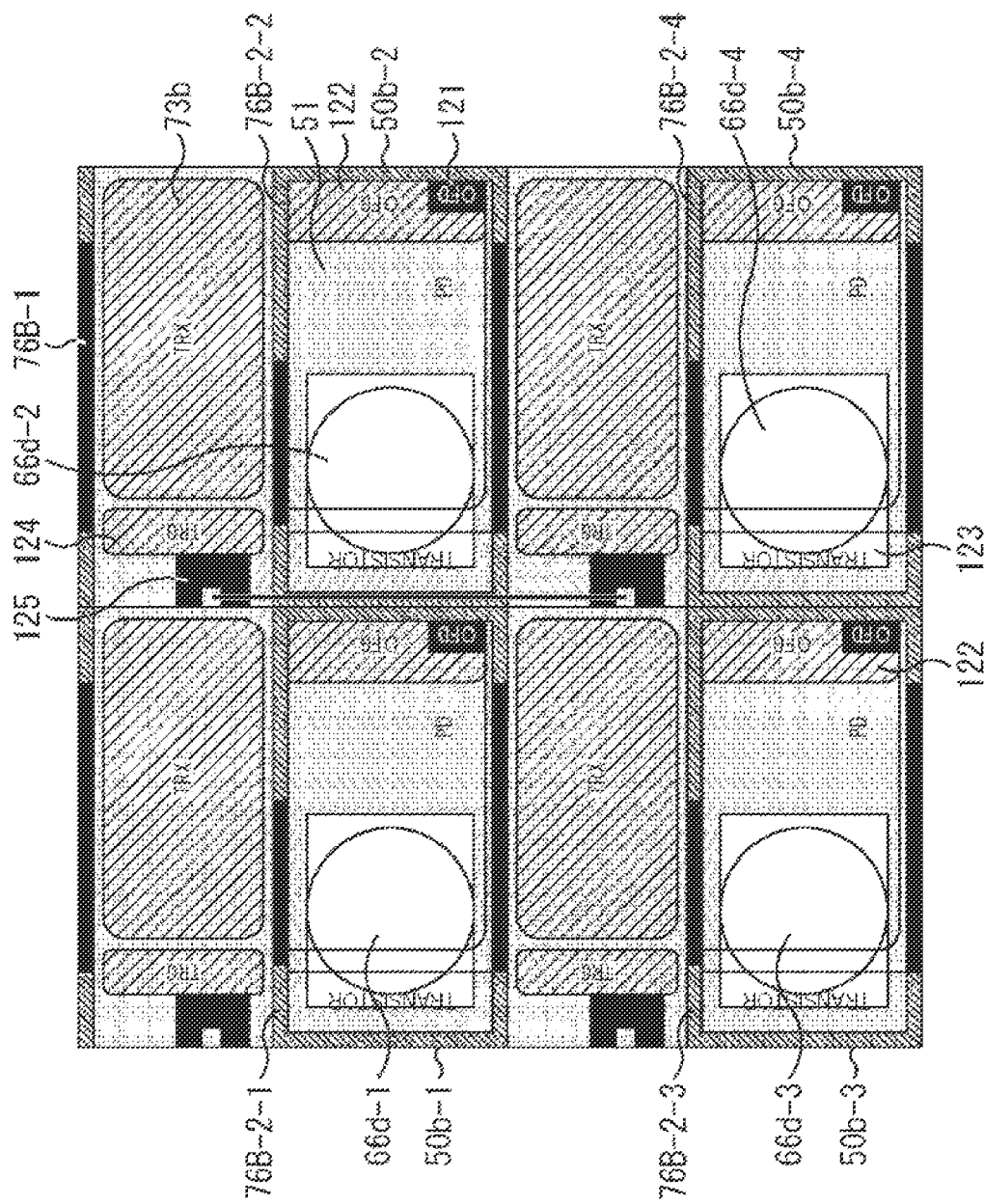
FIG. 33 is a diagram for describing the disposition of the on-chip lens.
Figure 34:
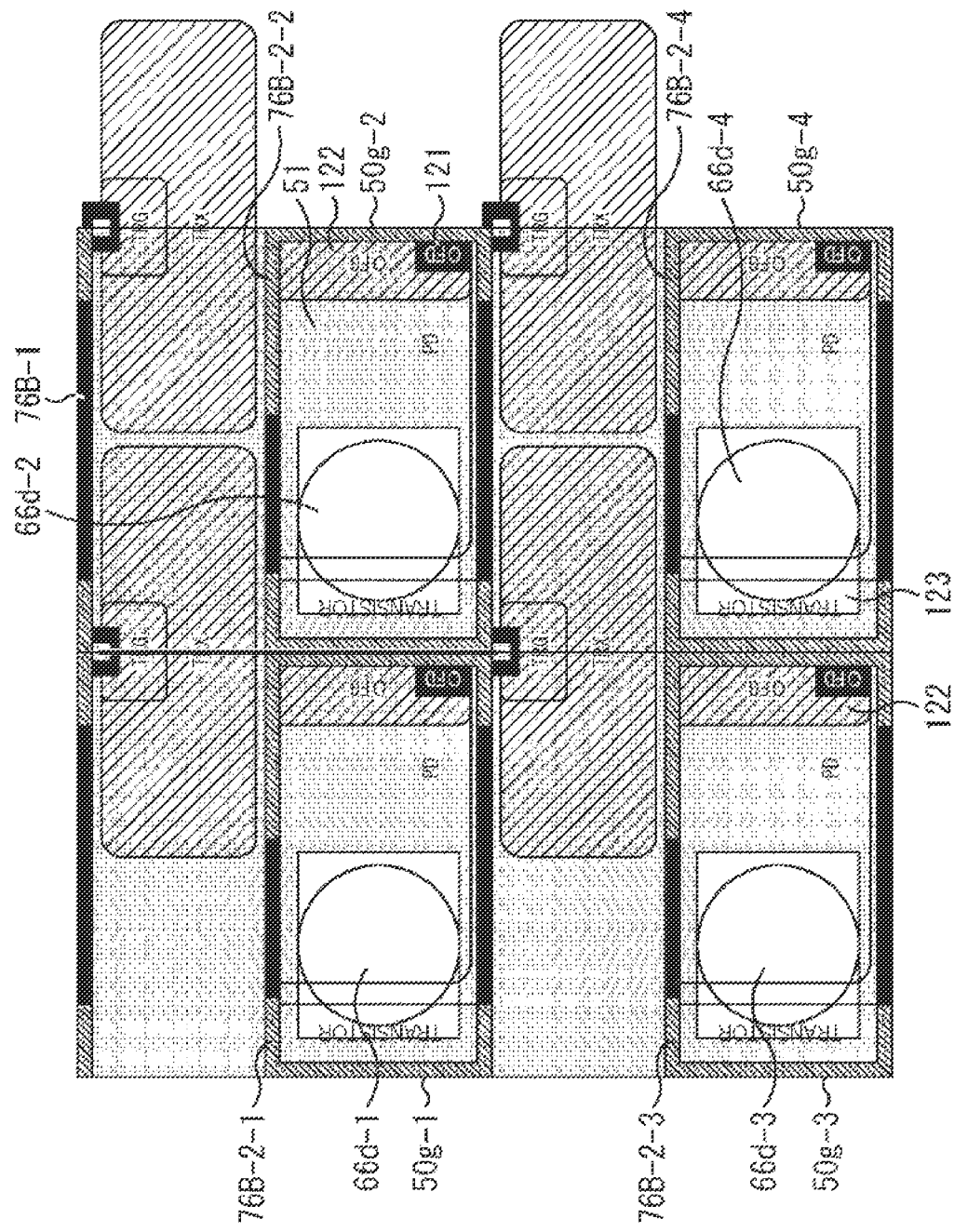
FIG. 34 is a diagram for describing the disposition of the on-chip lens.
Figure 35:
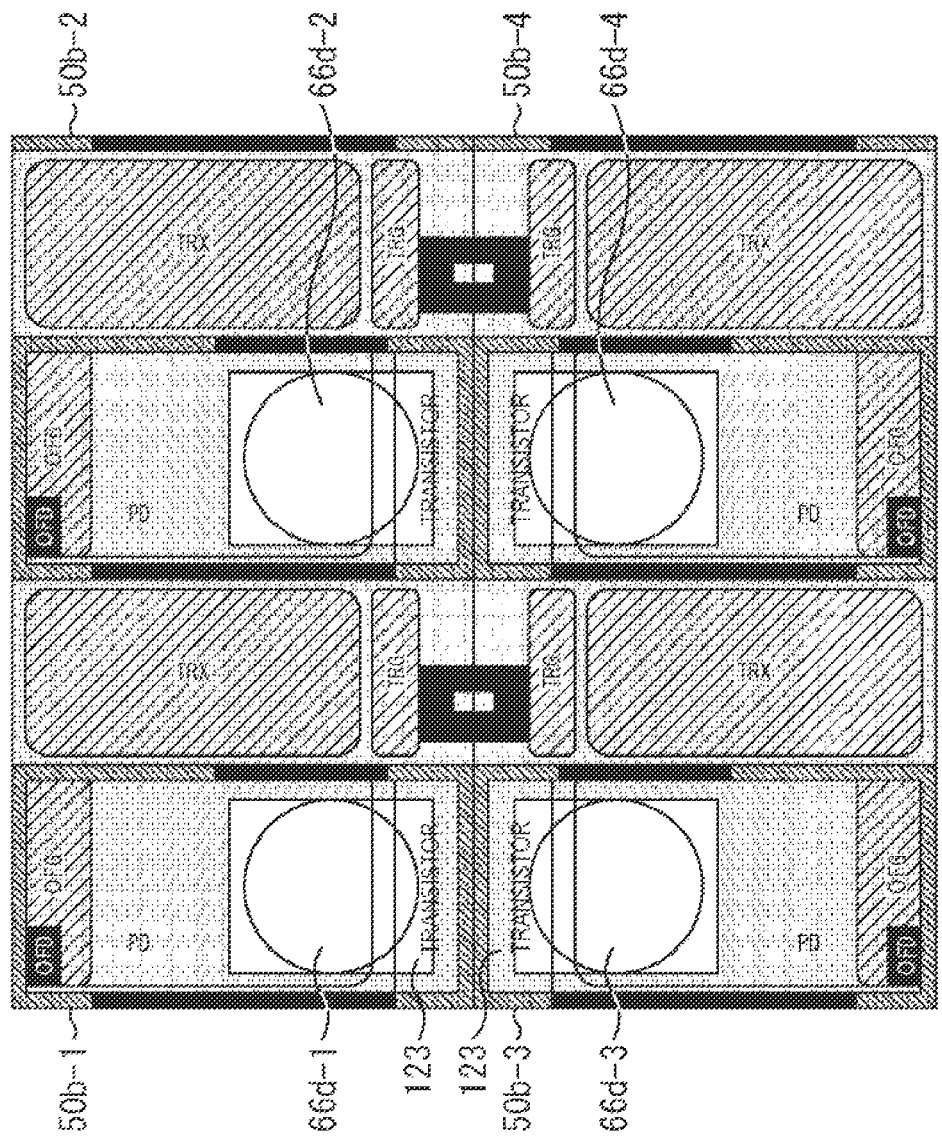
FIG. 35 is a diagram for describing the disposition of the on-chip lens.
Figure 36:
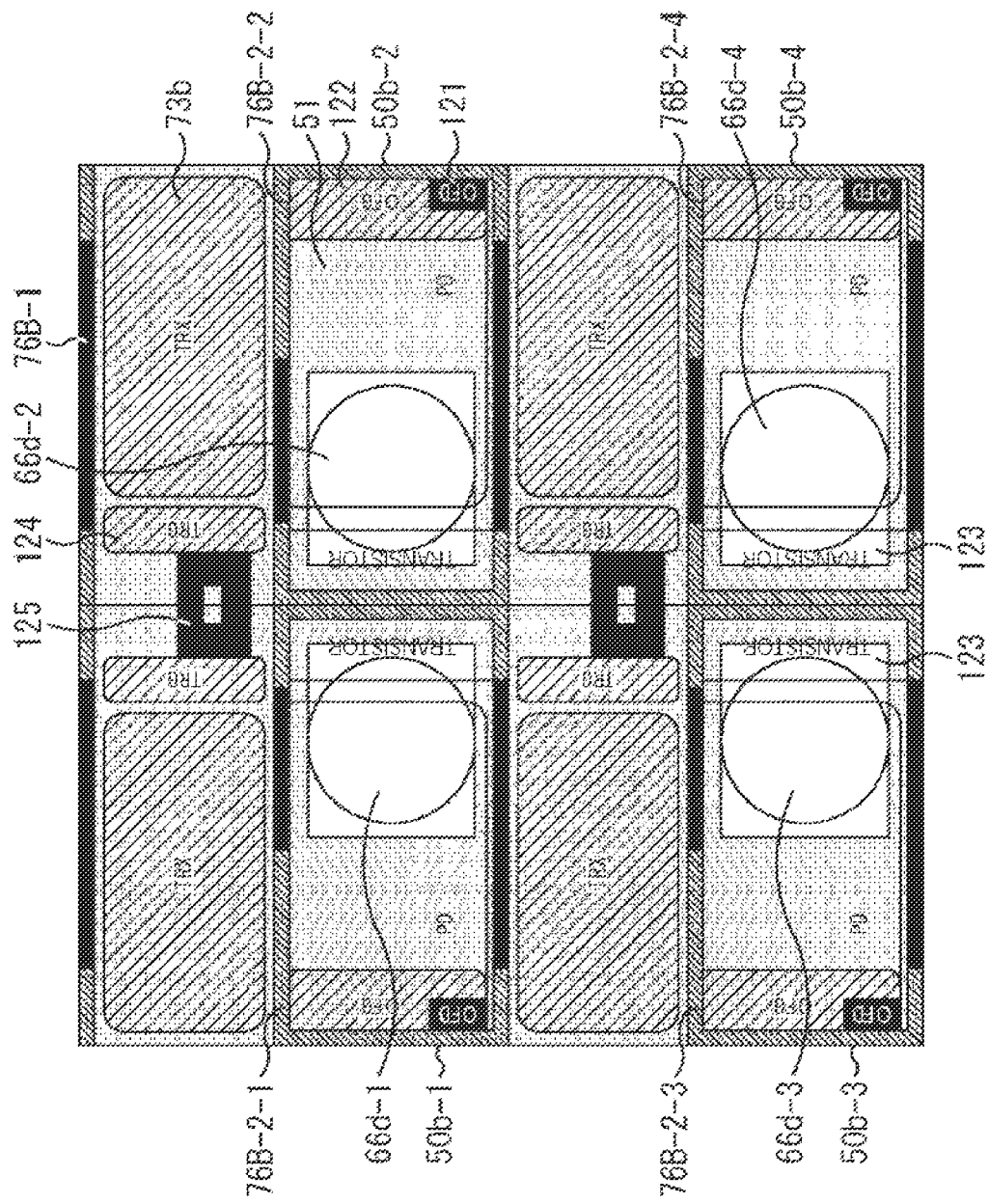
FIG. 36 is a diagram for describing the disposition of the on-chip lens.

In FIG. 33 to FIG. 36, four pixels of 2×2 are extracted and shown from a pixel group arranged in an array. Furthermore, examples shown in FIG. 33 and FIG. 34 are diagrams when pixel arrangement is subjected to periodic expansion (Periodic expansion). Furthermore, examples shown in FIG. 35 and FIG. 36 are diagrams when the pixel arrangement is folded and developed (mirror development).

The example shown in FIG. 33 shows a case where the pixels 50*b* are arranged in a lateral direction, and in the pixels 50*b* adjacent in the lateral direction, for example, in the pixel 50*b*-1 and the pixel 50*b*-2, a region where the OFG gate 122 is disposed and a region where the transistor 123 is disposed are disposed adjacent to each other.

In a case where the pixels 50*b* are arranged in an array in this manner, respective pixels 50*b* are the same in that the opened region 401*d* is provided on a lower left side in the pixel 50*b*, and the on-chip lens 66*d* is formed in the opened region 401*d*. Accordingly, the example shown in FIG. 33 is an exemplary arrangement in which optical symmetry is maintained.

The example shown in FIG. 34 is different in that the pixel 50*b* in the example shown in FIG. 33 has a configuration in which the PD region 67 and the charge holding region 68 are shifted by a half pitch. Even if the PD region 67 and the charge holding region 68 are shifted by a half pitch, the disposition of the PD region 67 is similar to the disposition of the PD region 67 shown in FIG. 33.

Accordingly, respective pixels 50*b* arranged in an array are the same in that the opened region 401*d* is provided on a lower left side in the pixel 50*b*, and that the on-chip lens 66*d* is formed in the opened region 401*d*. Accordingly, the example shown in FIG. 33 is an exemplary arrangement in which optical symmetry is maintained.

FIG. 35 shows an example in which the pixels 50*b* are arranged in a vertical direction. Furthermore, the example shown in FIG. 35 shows a case where in the pixels 50*b* adjacent in the vertical direction, for example, in the pixel 50*b*-1 and the pixel 50*b*-3, regions where the transistors 123 are disposed are disposed adjacent to each other.

In a case where the pixels 50*b* are arranged in an array in this manner, the opened region 401*d* is provided, for example, on a lower left side in the pixel 50*b*-1, and an on-chip lens 66*d*-1 is formed in an opened region 401*d*-1. In the pixel 50*b*-3 adjacent to the pixel 50*b*-1 in the vertical direction, an opened region 401*d*-3 is provided on an upper left side, and an on-chip lens 66*d*-3 is formed in the opened region 401*d*-3.

In the example shown in FIG. 35, when the vertically adjacent pixels 50*b* are viewed, the positions at which the on-chip lenses 66 are disposed in the pixels 50*b* differ. Accordingly, the example shown in FIG. 35 is an exemplary arrangement in which optical symmetry is not maintained.

FIG. 36 shows an example in which the pixels 50*b* are arranged in the lateral direction. Furthermore, the example shown in FIG. 36 shows a case where in the pixels 50*b* adjacent in the lateral direction, for example, in the pixel 50*b*-1 and the pixel 50*b*-2, regions where the transistors 123 are disposed are disposed adjacent to each other.

In a case where the pixels 50*b* are arranged in an array in this manner, the opened region 401*d* is provided, for example, on a lower right side in the pixel 50*b*-1, and the on-chip lens 66*d*-1 is formed in the opened region 401*d*-1. In the pixel 50*b*-2 adjacent to the pixel 50*b*-1 in the lateral direction, an opened region 401*d*-2 is provided on a lower left side, and an on-chip lens 66*d*-2 is formed in the opened region 401*d*-2.

In the example shown in FIG. 36, when the pixels 50*b* adjacent in the lateral direction are viewed, the positions at which the on-chip lenses 66 are disposed in the pixels 50*b* differ. Accordingly, the example shown in FIG. 36 is an exemplary arrangement in which optical symmetry is not maintained.

Exemplary disposition of the on-chip lens 66 shown in FIG. 35 and FIG. 36, in which optical symmetry is not maintained, has an advantage that a plurality of pixels 50*b* can share the transistor. The pixels 50*b*-1 to 50*b*-4 shown in FIG. 36 are arranged in a similar manner to the pixels 50*b*-1 to 50*b*-4 shown in FIG. 28. FIG. 28 is a diagram showing the configuration in which four pixels share the reset transistor 301, the amplification transistor 302, and the selection transistor 303.

Accordingly, the disposition of the on-chip lens 66 shown in FIG. 36 can be applied to the configuration shown in FIG. 28 in which the plurality of pixels 50*b* shares the transistor. In a case of the configuration in which the on-chip lens 66 is disposed as shown in FIG. 36 and the plurality of pixels 50*b* shares the transistor, as in a case described with reference to FIG. 28, a region allocated to one transistor can be increased, a leak can be prevented, the L length of the amplification transistor 302 can be increased, random noise can be reduced, and miniaturization can be achieved.

Furthermore, by increasing the region allocated to the PD 51 and the charge holding part 54, the number of saturated electrons (dynamic range) can be increased. However, as described above, since optical symmetry cannot be maintained and there is a possibility that sensitivity and spatial resolution decrease, those may be decreased in some product, and it is necessary to employ signal processing or the like that do not decrease them as appropriate in some cases.

About Manufacturing

Manufacturing of the pixel 50 described above will be described with reference to FIG. 37 to FIG. 41. Here, the description will be continued by taking a case of manufacturing the pixel 50*b* as an example.

Figure 37:
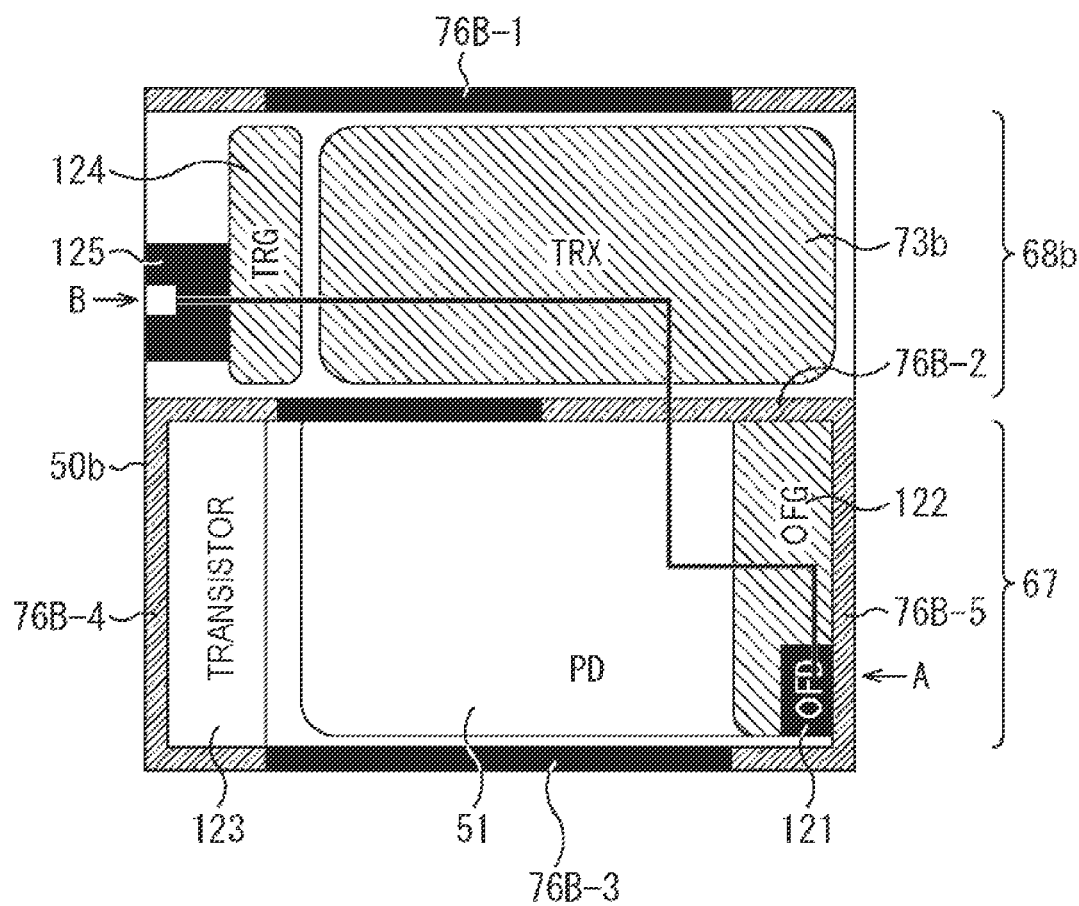
FIG. 37 is a diagram for describing manufacturing the pixel.
Figure 38:
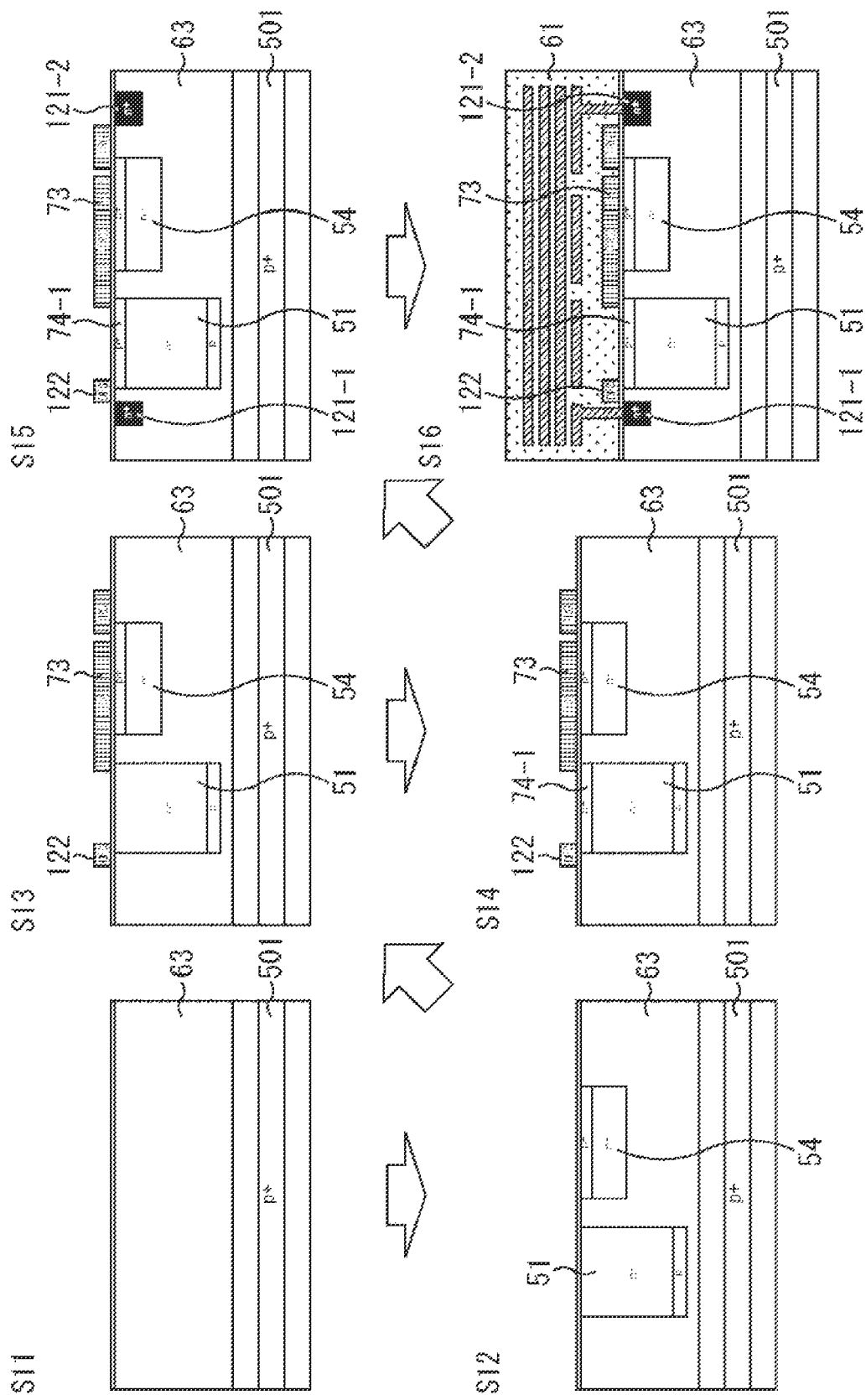
FIG. 38 is a diagram for describing manufacturing the pixel.
Figure 39:
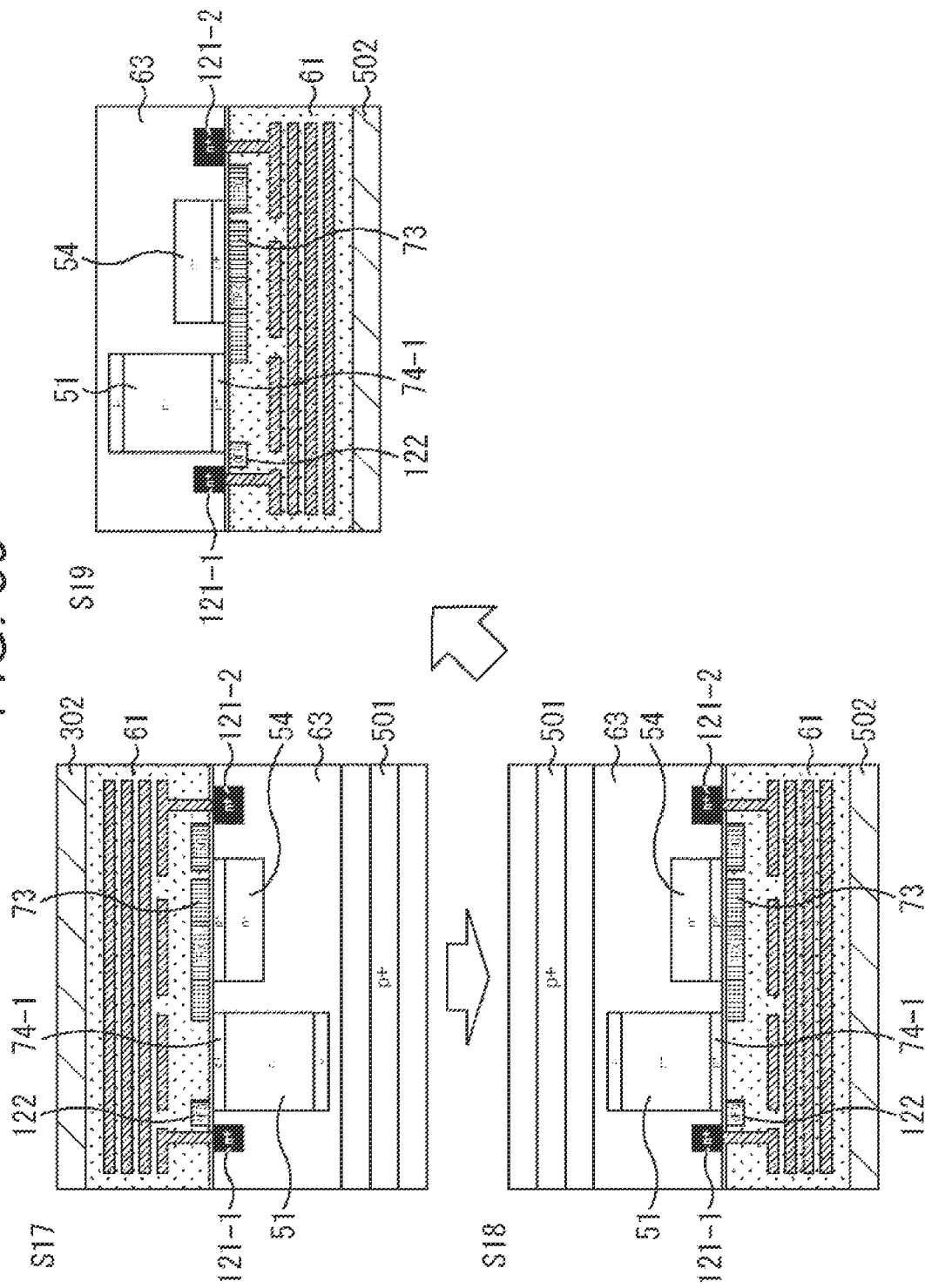
FIG. 39 is a diagram for describing manufacturing the pixel.

First, in the pixel 50*b* shown in FIG. 37, the process of manufacturing the pixel 50*b* in the cross section of arrow A-B will be described.

In step S11, an SOI substrate is set. Here, a case where the SOI substrate is used and a charge accumulation layer is n-type will be described as an example, but the present technology can also be applied to a case where a bulk substrate is used and the charge accumulation layer is p-type, or the like.

Furthermore, in step S11, a well of a transistor is also formed by ion implantation. Furthermore, an etching stopper layer 501 is also formed.

In step S12, the PD 51 and the charge holding part 54b, which are n-type regions, are formed by ion implantation. In a case where a p-type region is produced in the charge holding region 68b, the p-type region is produced in step S12.

In step S13, the OFG gate 122 and the TRX gate 73 are formed. Gate portions of these transistors are formed, for example, by polysilicon deposition by CVD and patterning of lithography.

In step S14, a hole-accumulation diode (HAD) is formed by ion implantation. The HAD is formed by generating the p-type pinning layer 74-1 in the PD 51. Dark current can be significantly suppressed by forming the HAD.

In step S15, the OFD 121, which is an n-type region, is formed by ion implantation.

Moreover, in step S16, the wiring layer 61 is stacked.

In step S17 (FIG. 39), an adhesive layer is formed on a surface side of the wiring layer 61, after a support substrate 502 is laminated, as shown in step S18, the whole is flipped over, and a back surface of the semiconductor substrate 63 is polished by physical polishing.

In step S19, a layer on a back side of the etching stopper layer 501 of the semiconductor substrate 63 is etched by wet etching. At this time, the etching stopper layer 501 is exposed by stopping the etching with the etching stopper layer 501 containing high-concentration p-type impurities.

Moreover, after the etching stopper layer 501 is removed, the back surface of the semiconductor substrate 63 is polished by a chemical mechanical polishing (CMP) method, whereby the back side of the semiconductor substrate 63 is thinned.

Figure 40:
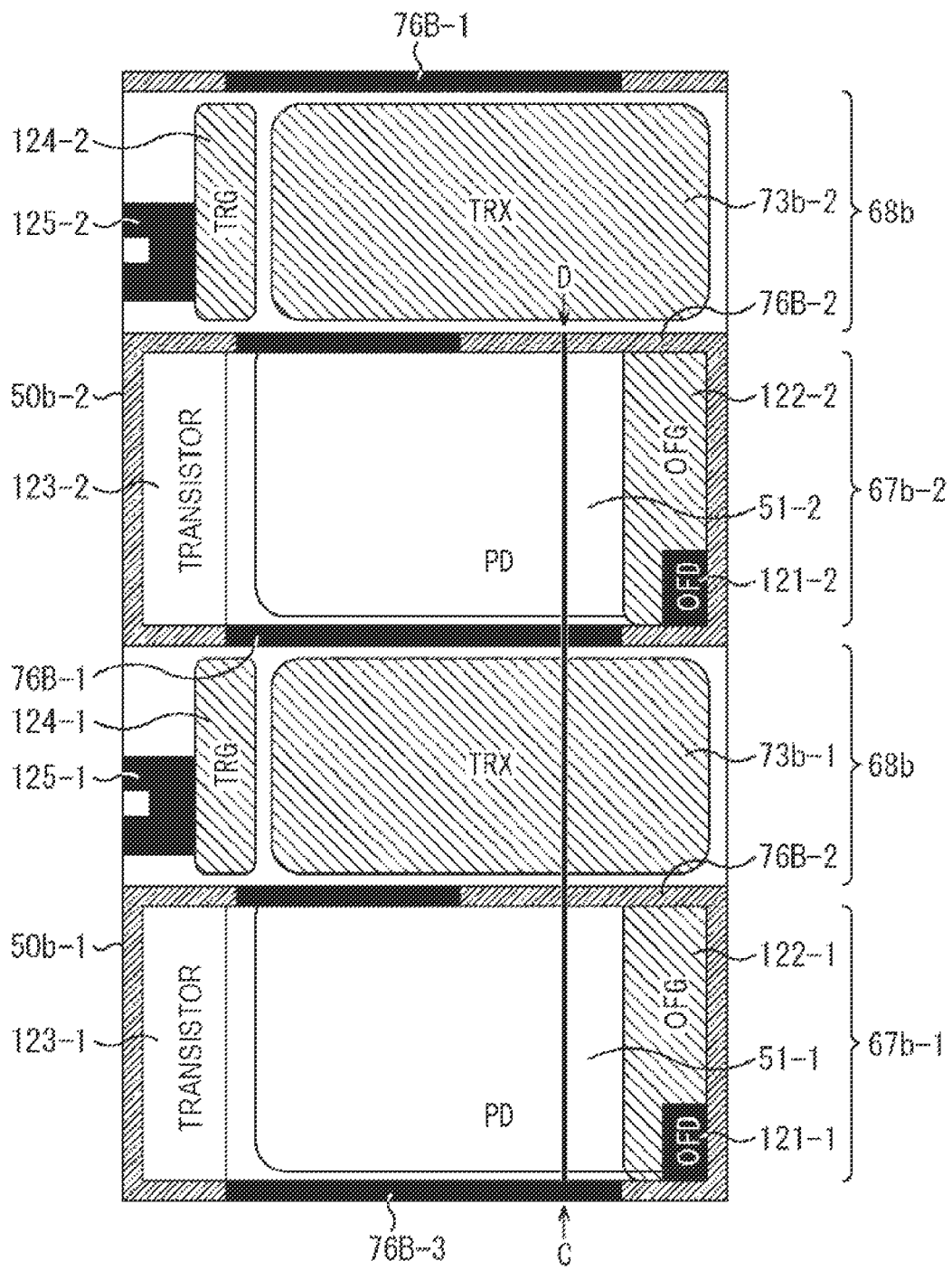
FIG. 40 is a diagram for describing manufacturing the pixel.

Thus, after the PD region 67 and the charge holding region 68 are formed, the light shielding part 76 is formed. In the description of the formation of the light shielding part 76, as shown in FIG. 40, the description is provided by taking as an example a cross section when the adjacent pixel 50b-1 and the pixel 50b-2 are cut by arrow C-D.

As shown in step S20 (FIG. 41), in the above-described steps, the PD 51-1 and a charge holding part 54-1 of the pixel 50b-1 and a PD 51-2 of the pixel 50b-2 are formed.

Figure 41:
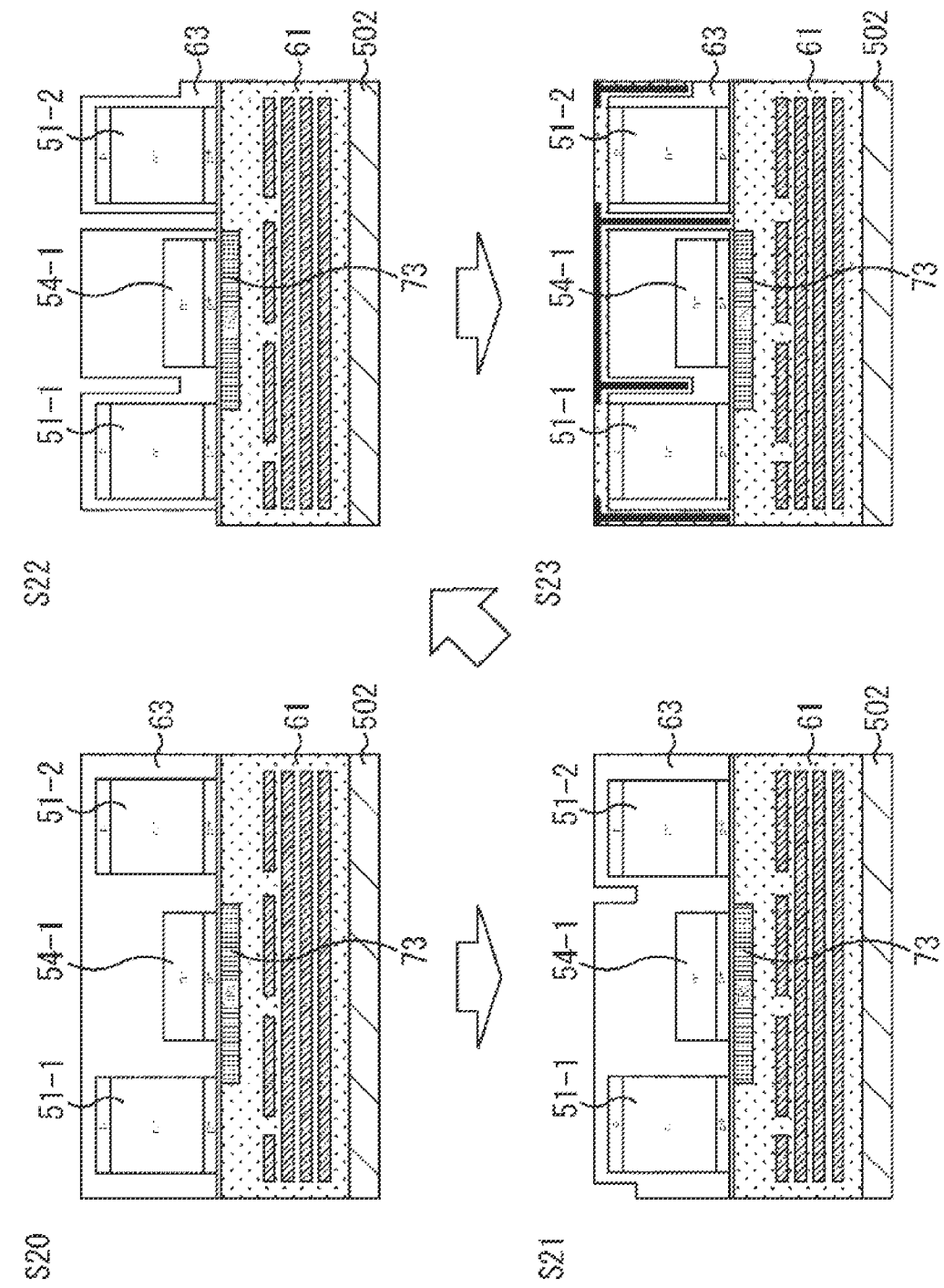
FIG. 41 is a diagram for describing manufacturing the pixel.

In step S21, a portion corresponding to the light shielding part 76 to penetrate is dug a little. The light shielding part 76 to penetrate is the light shielding part 76B-3 positioned below the pixel 50b-1 and the light shielding part 76B-1 positioned above the pixel 50b-1 shown in FIG. 40. As shown in FIG. 41, each of the left side of the PD 51-1 and the right side of the charge holding part 54-1, which becomes the penetrating light shielding part 76B, is dug a little.

In step S22, the non-penetrating light shielding part 76 and the penetrating light shielding part 76 are dug. The penetrating light shielding part 76, which has already been dug a little, is further dug and becomes penetrating.

In step S23, the light shielding part 76 is formed by filling the dug part with a metal such as tungsten.

Note that in the digging, after a resist is first formed on the back surface of the semiconductor substrate 63, the resist layer is exposed and developed such that the aperture is formed in a region where the embedded part 76B of the light shielding part 76 is to be formed. Then, dry etching is performed using the resist layer as a mask to form a trench part. By repeating this process, the non-penetrating trench part and the penetrating trench part are formed.

Moreover, the high dielectric constant material film 77 is deposited on the side surface and bottom surface of the trench part and the back surface of the semiconductor substrate 63. Subsequently, the light shielding part 76 is deposited from the back side of the high dielectric constant material film 77 on the back surface and in the trench part 84.

With this process, the lid part 76A is formed on the back side of the high dielectric constant material film 77, and the light shielding part 76 in which the embedded part 76B is formed inside the trench part 84 is formed.

The light shielding part 76 is formed, for example, by performing chemical vapor deposition (CVD) using tungsten as a material. Then, the light shielding part 76 is processed by dry etching to open the aperture 76C. Thereafter, for example, an atomic layer deposition (ALD) method is used to stack and planarize the high dielectric constant material film 77 with respect to the light shielding part 76.

Thereafter, a normal method is used to form the color filter layer 65 and the on-chip lens 66. Thus, the pixel 50b is manufactured.

The present technology makes it possible to reduce the influence of unnecessary light components. Furthermore, it is possible to manufacture pixels that can reduce the influence of unnecessary light components.

Electronic Device

The present technology is not limited to application to an imaging apparatus, but is applicable to all electronic devices that use the imaging apparatus in an image fetching unit (photoelectric conversion part) including an imaging apparatus such as a digital still camera and a video camera, a mobile terminal device having an imaging function such as a mobile phone, and a copying machine that uses the imaging apparatus in an image reader, and the like. Note that a modular form to be mounted on an electronic device, in other words, a camera module is used as the imaging apparatus in some cases.

Figure 42:
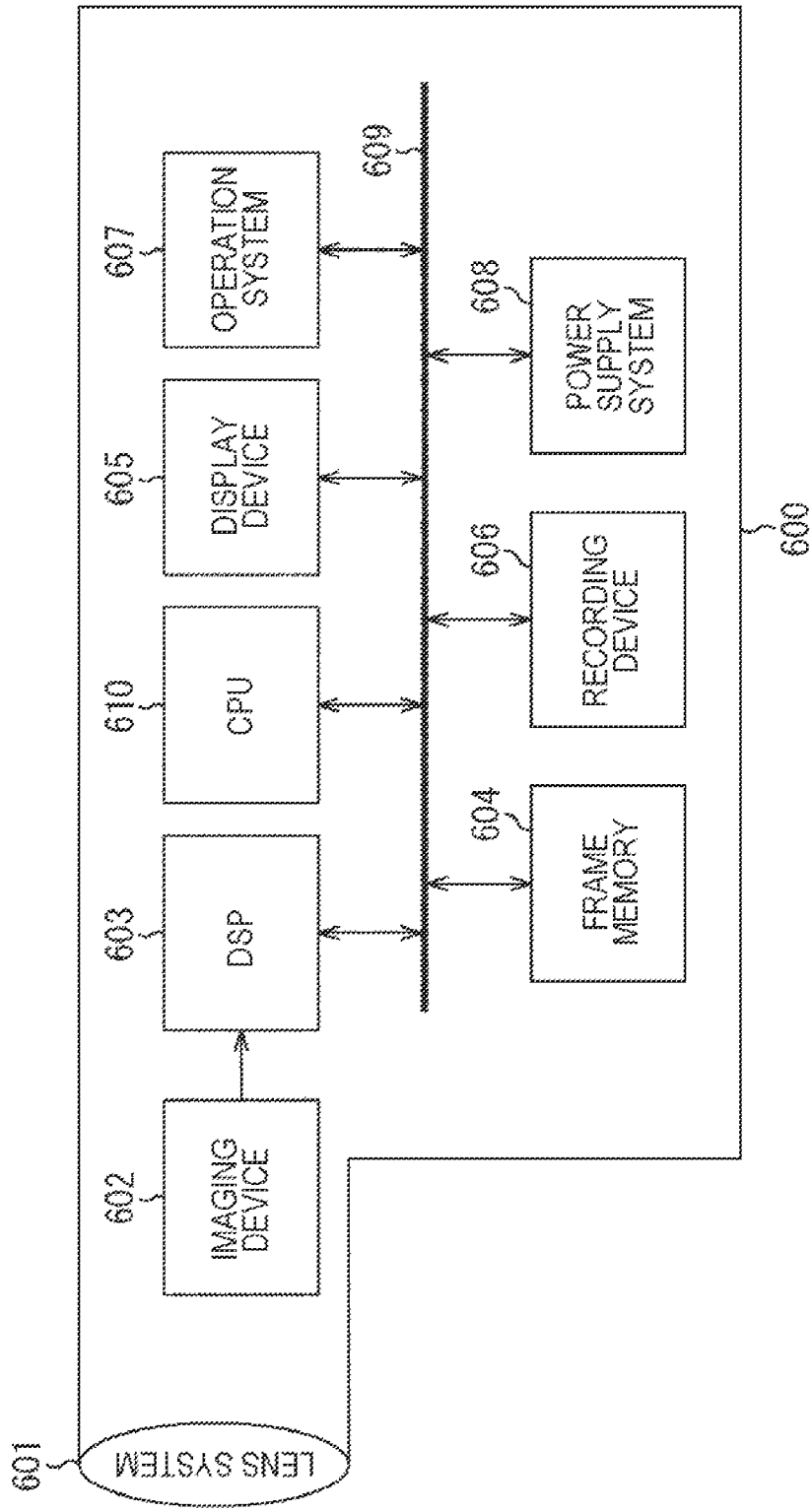
FIG. 42 is a diagram for describing a configuration of an electronic device.

FIG. 42 is a block diagram showing an exemplary configuration of an imaging apparatus which is one example of the electronic device of the present disclosure. As shown in FIG. 42, an imaging apparatus 600 of the present disclosure includes an optical system including a lens group 601 and the like, an imaging device 602, a DSP circuit 603 which is a camera signal processing part, a frame memory 604, a display device 605, a recording device 606, an operation system 607, a power supply system 608, and the like.

Then, a configuration is used in which the DSP circuit 603, the frame memory 604, the display device 605, the recording device 606, the operation system 607, and the power supply system 608 are interconnected via a bus line 609. A CPU 610 controls each unit in the imaging apparatus 600.

The lens group 601 takes in incident light (image light) from a subject and forms an image on an imaged surface of the imaging device 602. The imaging device 602 converts a light amount of the incident light with which an image is formed on the imaged surface by the lens group 601 into an electric signal in pixel unit and outputs the electric signal as a pixel signal. As this imaging device 602, the imaging device (image sensor) according to the above-described embodiment can be used.

The display device 605 includes a panel type display device such as a liquid crystal display device or an organic electro luminescence (EL) display device, and displays a moving image or a still image that is imaged by the imaging device 602. The recording device 606 records the moving image or the still image imaged by the imaging device 602 on a recording medium such as a video tape or a digital versatile disk (DVD).

The operation system 607 issues operation commands for various functions possessed by the imaging apparatus under an operation of a user. The power supply system 608 appropriately supplies various power sources that serve as operation power sources for the DSP circuit 603, the frame memory 604, the display device 605, the recording device 606, and the operation system 607 to these supply targets.

Such an imaging apparatus 600 is applied to a camera module for mobile devices such as a video camera, a digital still camera, and a mobile phone. Then, in this imaging apparatus 600, the imaging device according to the embodiment described above can be used as the imaging device 602.

In the present specification, the system represents an entire device including a plurality of devices.

Note that effects described in the present specification are merely illustrative and not restrictive, and other effects may be produced.

Note that the embodiment of the present technology is not limited to the embodiment described above, and various modifications may be made without departing from the spirit of the present technology.

Note that the present technology can also have the following configurations.

(1) An imaging device including:
a photoelectric conversion part configured to convert received light into a charge;
a holding part configured to hold a charge transferred from the photoelectric conversion part; and
a light shielding part configured to shield light between the photoelectric conversion part and the holding part,
in which the photoelectric conversion part, the holding part, and the light shielding part are formed in a semiconductor substrate having a predetermined thickness, and
the light shielding part of a transfer region that transfers the charge from the photoelectric conversion part to the holding part is formed as a non-penetrating light shielding part that does not penetrate the semiconductor substrate, and the light shielding part other than the transfer region is formed as a penetrating light shielding part that penetrates the semiconductor substrate.

(2) The imaging device according to the (1), in which when a length of one side of the photoelectric conversion part is 1, the non-penetrating light shielding part has a length of 1/5 or more.

(3) The imaging device according to the (1) or (2), in which
the non-penetrating light shielding part is formed at a depth that is half or more of the thickness of the semiconductor substrate.

(4) The imaging device according to the (1) or (2), in which
the non-penetrating light shielding part is formed at a depth that is half or less of the thickness of the semiconductor substrate.

(5) The imaging device according to any one of the (1) to (4), further including an OFG gate, in which
the non-penetrating light shielding part is formed on a side where the OFG gate is disposed.

(6) The imaging device according to any one of the (1) to (5), in which
the holding part is disposed at a position shifted by a half pitch with respect to the photoelectric conversion part.

(7) The imaging device according to any one of the (1) to (6), further including
a backflow prevention gate configured to prevent backflow of the charge from the holding part to the photoelectric conversion part.

(8) The imaging device according to the (7), in which
the backflow prevention gate is a part of the non-penetrating light shielding part and is formed in a shape projecting to a side of the photoelectric conversion part.

(9) The imaging device according to any one of the (1) to (6), in which
a transfer control gate that controls the transfer of the charge from the photoelectric conversion part to the holding part is formed in a shape projecting to a side of the photoelectric conversion part in a part of the non-penetrating light shielding part.

(10) The imaging device according to any one of the (1) to (9), in which
an on-chip lens is disposed such that a center of the on-chip lens is positioned in a central portion on the photoelectric conversion part.

(11) The imaging device according to any one of the (1) to (9), in which
an on-chip lens is disposed at a position away from the non-penetrating light shielding part on the photoelectric conversion part.

(12) The imaging device according to the (10) or (11), in which
the light shielding part is formed in a region other than a region in which a concentrated light diameter of the on-chip lens on the photoelectric conversion part fits.

(13) The imaging device according to any one of the (10) to (12), in which
when arranged in an array, the on-chip lenses are arranged to be able to maintain optical symmetry.

(14) The imaging device according to any one of the (1) to (13), in which
the light shielding part formed between pixels penetrates the semiconductor substrate.

(15) An electronic device including:
an imaging device including:
a photoelectric conversion part configured to convert received light into a charge;
a holding part configured to hold a charge transferred from the photoelectric conversion part; and
a light shielding part configured to shield light between the photoelectric conversion part and the holding part,
the photoelectric conversion part, the holding part, and the light shielding part being formed in a semiconductor substrate having a predetermined thickness,
the light shielding part of a transfer region that transfers the charge from the photoelectric conversion part to the holding part being formed as a non-penetrating light shielding part that does not penetrate the semiconductor substrate, and the light shielding part other than the transfer region being formed as a penetrating light shielding part that penetrates the semiconductor substrate; and
a processing unit configured to process a signal from the imaging device.

REFERENCE SIGNS LIST 30 imaging device
50 pixel

51 PD
54 charge holding part
61 wiring layer
62 oxide film
63 semiconductor substrate
64 light shielding layer
65 color filter layer
66 on-chip lens
71 wire
72 interlayer insulating film
73 TRX gate
74 surface pinning layer
75 interpixel separation region
76 light shielding part
77 high dielectric constant material film
121 OFD
122 OFG gate
123 transistor
124 TRG gate
125 FD
301 reset transistor
302 amplification transistor
303 selection transistor

The invention claimed is:

1. A light detecting device, comprising:
a photoelectric conversion region configured to convert received light into a charge;
a charge holding region configured to hold a charge from the photoelectric conversion region;
an overflow gate connected to the photoelectric conversion region;
a first light shielding part configured to shield light,
wherein the charge holding region includes a transfer transistor configured to transfer the charge from the photoelectric conversion region to the charge holding region; and
a floating diffusion region including a transfer transistor configured to transfer a charge from the charge holding region to the floating diffusion region,
wherein the transfer transistor for the charge holding region is provided next to the transfer transistor for the floating diffusion region in a first direction in a plan view,
wherein the transfer transistor for the charge holding region is provided next to the overflow gate in a second direction, opposite the first direction, in the plan view,
wherein the photoelectric conversion region, the charge holding region and the floating diffusion region are each formed in a semiconductor substrate having a predetermined thickness, and
wherein the first light shielding part is provided between the photoelectric conversion region and the charge holding region in the second direction in the plan view.

2. The light detecting device according to claim 1, further comprising a second light shielding part configured to shield light, wherein the second light shielding part is provided above each of the photoelectric conversion region and the charge holding region in the second direction in the plan view.

3. The light detecting device according to claim 1, further comprising a third light shielding part configured to shield light, wherein the third light shielding part is provided below each of the photoelectric conversion region and the charge holding region in the second direction in the plan view.

4. The light detecting device according to claim 1, wherein the charge holding region has a thickness less than a thickness of the semiconductor substrate.

5. The light detecting device according to claim 1, wherein the first light shielding part has a thickness less than a thickness of the semiconductor substrate.

6. The light detecting device according to claim 1, wherein the second light shielding part has a thickness equal to a thickness of the semiconductor substrate.

7. The light detecting device according to claim 1, further comprising an overflow drain connected to the photoelectric conversion region via the overflow gate.

8. The light detecting device according to claim 1, wherein the first light shielding part includes a metal film.

9. The light detecting device according to claim 8, wherein the metal film includes tungsten.

10. The light detecting device according to claim 8, wherein the metal film is configured to shield the charge holding region from an incident light.

11. An electronic device, comprising:
a light detecting device, comprising:
a photoelectric conversion region configured to convert received light into a charge;
a charge holding region configured to hold a charge from the photoelectric conversion region;
an overflow gate connected to the photoelectric conversion region;
a first light shielding part configured to shield light,
wherein the charge holding region includes a transfer transistor configured to transfer the charge from the photoelectric conversion region to the charge holding region; and
a floating diffusion region including a transfer transistor configured to transfer a charge from the charge holding region to the floating diffusion region,
wherein the transfer transistor for the charge holding region is provided next to the transfer transistor for floating diffusion region in a first direction in a plan view,
wherein the transfer transistor for the charge holding region is provided next to the overflow gate in a second direction, opposite the first direction, in the plan view,
wherein the photoelectric conversion region, the charge holding region and the floating diffusion region are each formed in a semiconductor substrate having a predetermined thickness, and
wherein the first light shielding part is provided between the photoelectric conversion region and the charge holding region in the second direction in the plan view; and
a processor configured to process a signal from the light detecting device.

12. The electronic device according to claim 11, further comprising a second light shielding part configured to shield light, wherein the second light shielding part is provided above each of the photoelectric conversion region and the charge holding region in the second direction in the plan view.

13. The electronic device according to claim 11, further comprising a third light shielding part configured to shield light, wherein the third light shielding part is provided below each of the photoelectric conversion region and the charge holding region in the second direction in the plan view.

14. The electronic device according to claim 11, wherein the charge holding region has a thickness less than a thickness of the semiconductor substrate.

15. The electronic device according to claim 11, wherein the first light shielding part has a thickness less than a thickness of the semiconductor substrate.

16. The electronic device according to claim 11, wherein the second light shielding part has a thickness equal to a thickness of the semiconductor substrate.

17. The electronic device according to claim 11, further comprising an overflow drain connected to the photoelectric conversion region via the overflow gate.

18. The electronic device according to claim 11, wherein the first light shielding part includes a metal film.

19. The electronic device according to claim 18, wherein the metal film includes tungsten.

20. The electronic device according to claim 18, wherein the metal film is configured to shield the charge holding region from an incident light.

* * * * *